(12) United States Patent
Besaucele et al.

(10) Patent No.: US 6,553,049 B1
(45) Date of Patent: *Apr. 22, 2003

(54) ARF LASER WITH LOW PULSE ENERGY AND HIGH REP RATE

(75) Inventors: Herve A. Besaucele, San Diego, CA (US); Jean-Marc Hueber, La Jolla, CA (US); Alexander I. Ershov, San Diego, CA (US); Thomas Hofmann, San Diego, CA (US); Vladimir B. Fleurov, Escondido, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/451,750

(22) Filed: Nov. 30, 1999

Related U.S. Application Data

(63) Continuation-in-part of application No. 09/041,474, filed on Mar. 11, 1998, now Pat. No. 5,991,324.

(51) Int. Cl.[7] .............. H01S 3/22; H01S 3/10; H01S 3/00
(52) U.S. Cl. .............. 372/57; 372/55; 372/60; 372/25; 372/38.05
(58) Field of Search .................... 372/38.1

(56) References Cited

U.S. PATENT DOCUMENTS

| 5,569,399 A | * 10/1996 | Penney et al. | 219/121.69 |
| 6,330,261 B1 | * 12/2001 | Ishihara et al. | 372/38.1 |

* cited by examiner

*Primary Examiner*—Paul Ip
*Assistant Examiner*—Armando Rodriguez
(74) *Attorney, Agent, or Firm*—John R. Ross

(57) ABSTRACT

A reliable modular production quality ArF excimer laser capable of producing laser pulses at repetition rates in the range of 3,000 to 4,000 Hz or greater with pulse energies in the range of about 2 mJ to 5 mJ or greater with a full width half, maximum bandwidth of about 0.4 pm or less and dose stability of less than 0.4 percent. Using this laser as an illumination source, stepper or scanner equipment can produce integrated circuit resolution of 0.10 $\mu$m (100 nm) or less. Replaceable modules include a laser chamber; a modular pulse power system; and a line narrowing module. For a given laser power output, the higher repetition rate provides two important advantages. The lower per pulse energy means less optical damage and the larger number of pulses for a specified illumination dose means better dose stability.

18 Claims, 39 Drawing Sheets

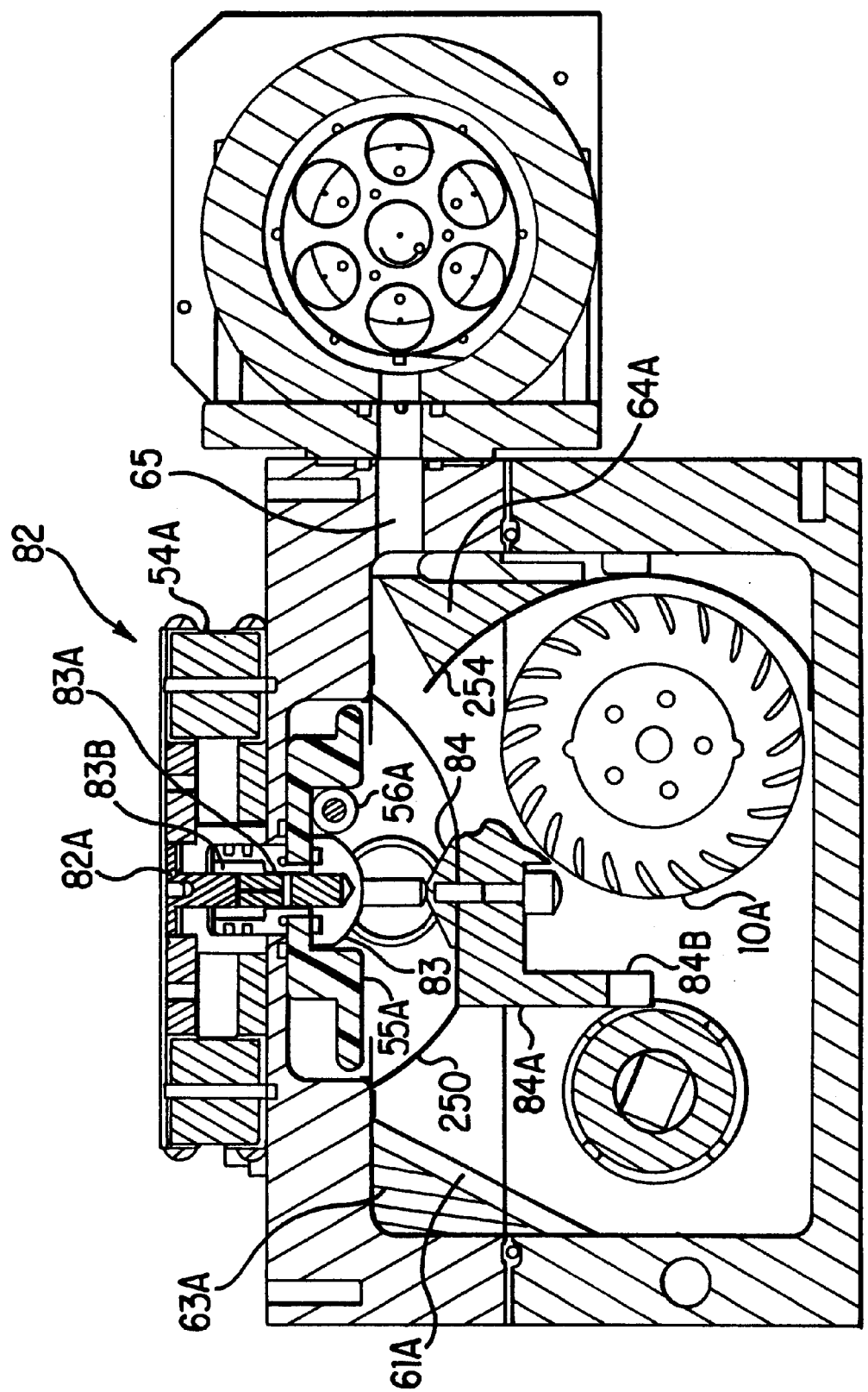

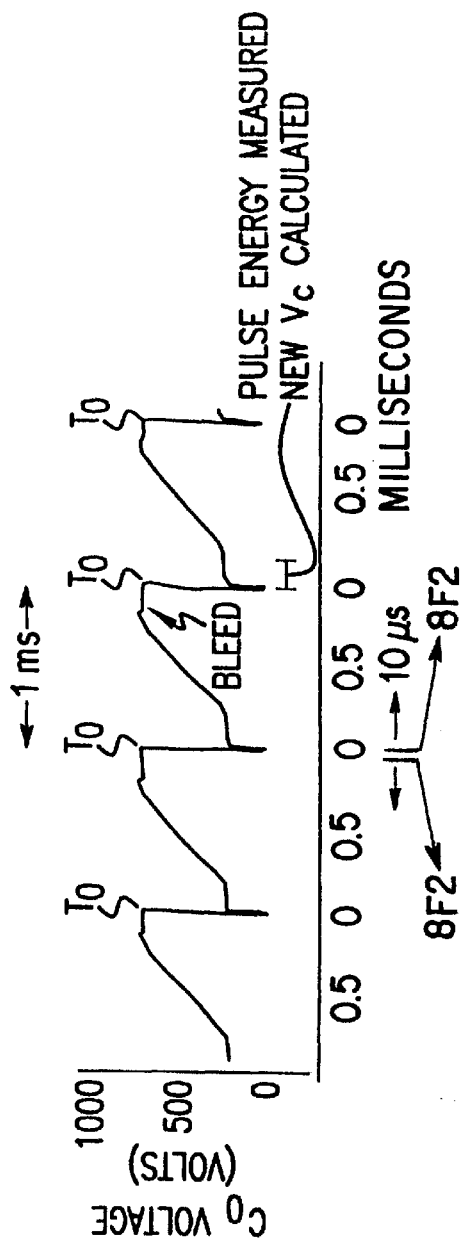
FIG. 8F1
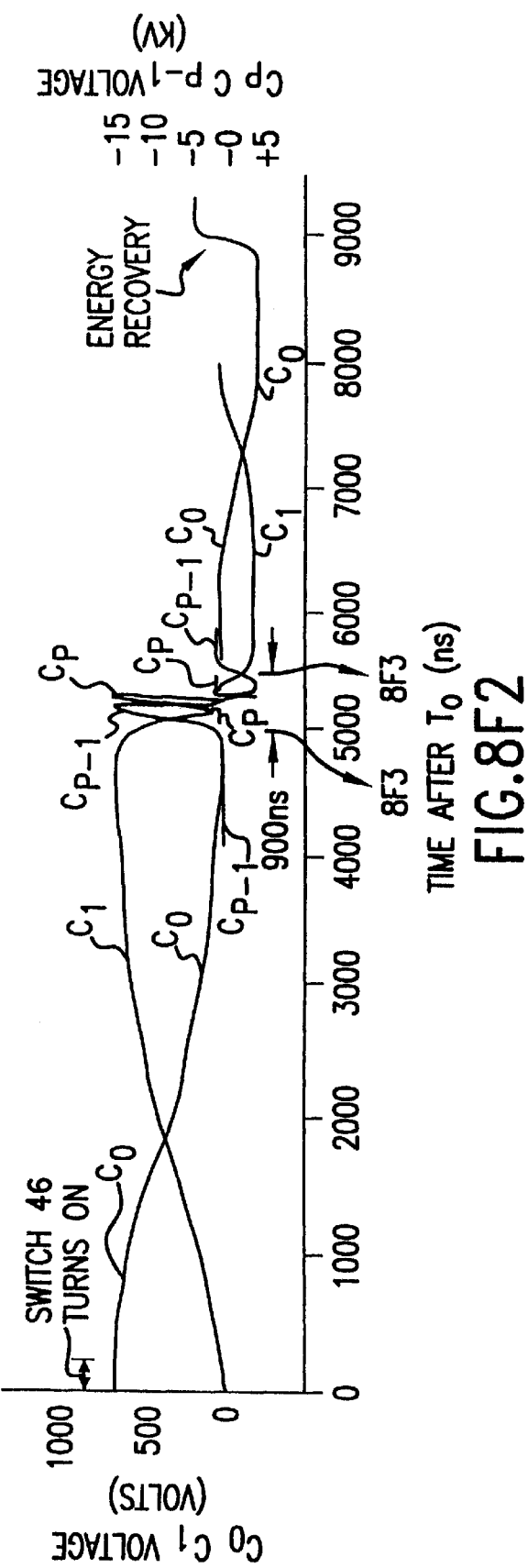
FIG. 8F2

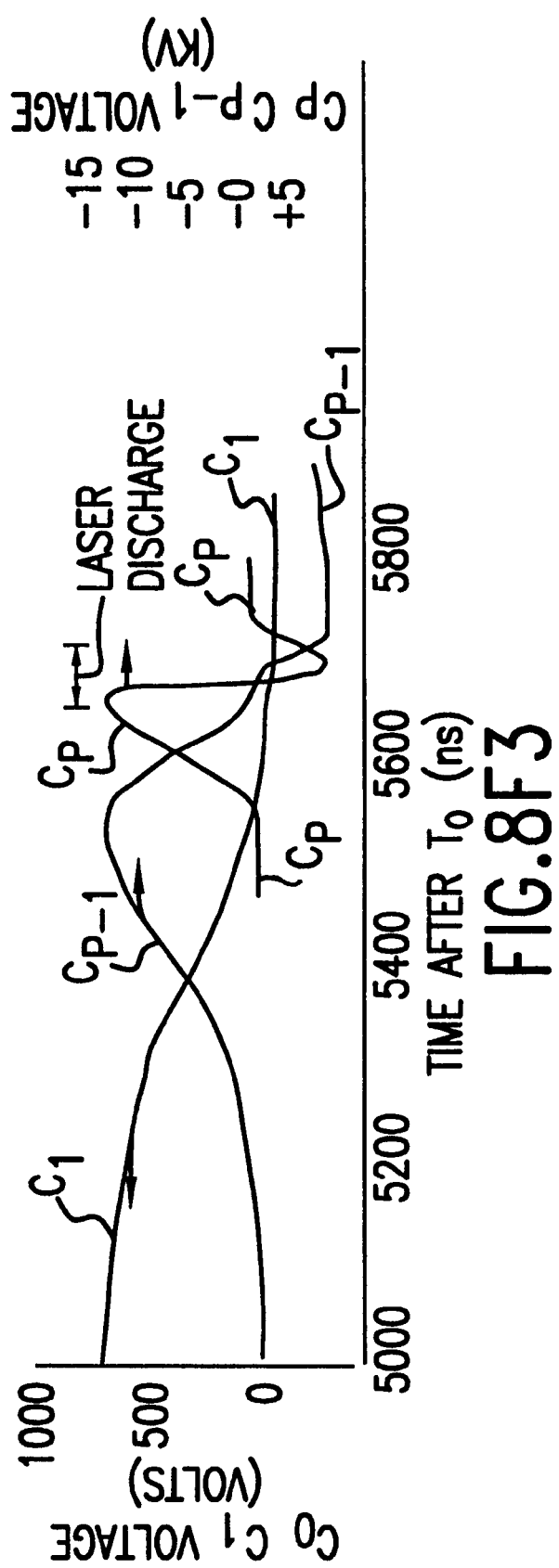
FIG.8F3

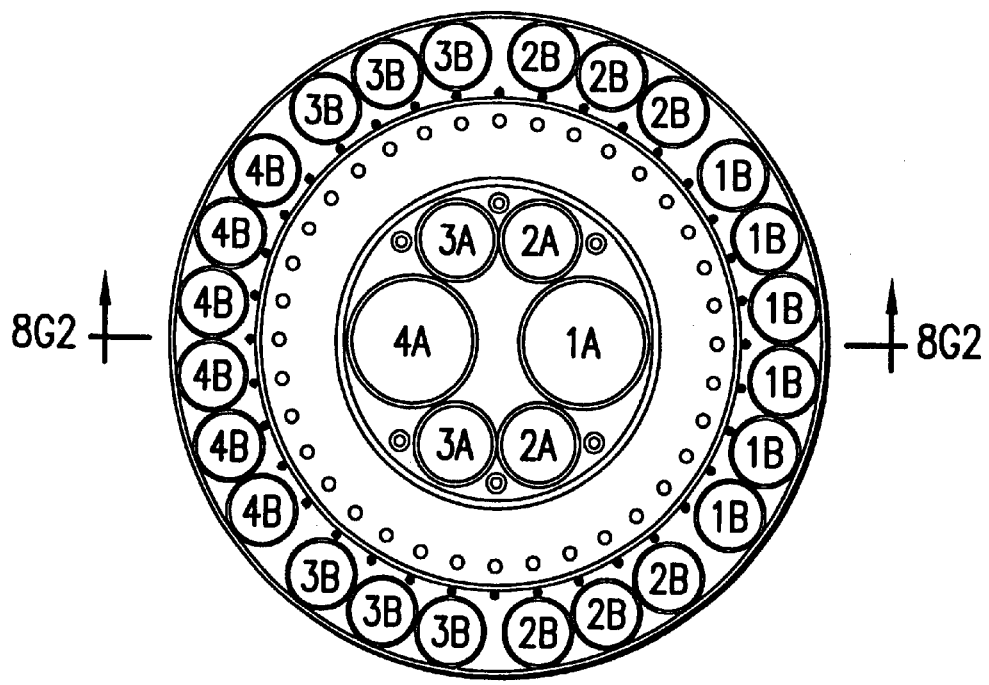
FIG.8G1
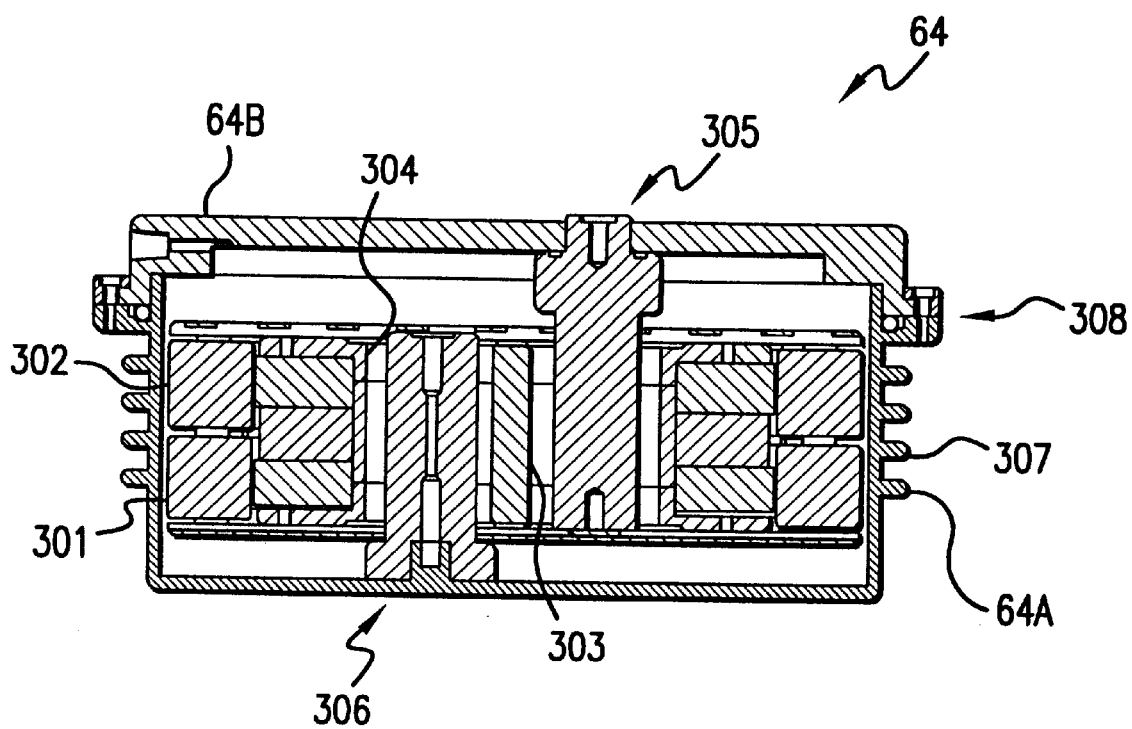
FIG.8G2

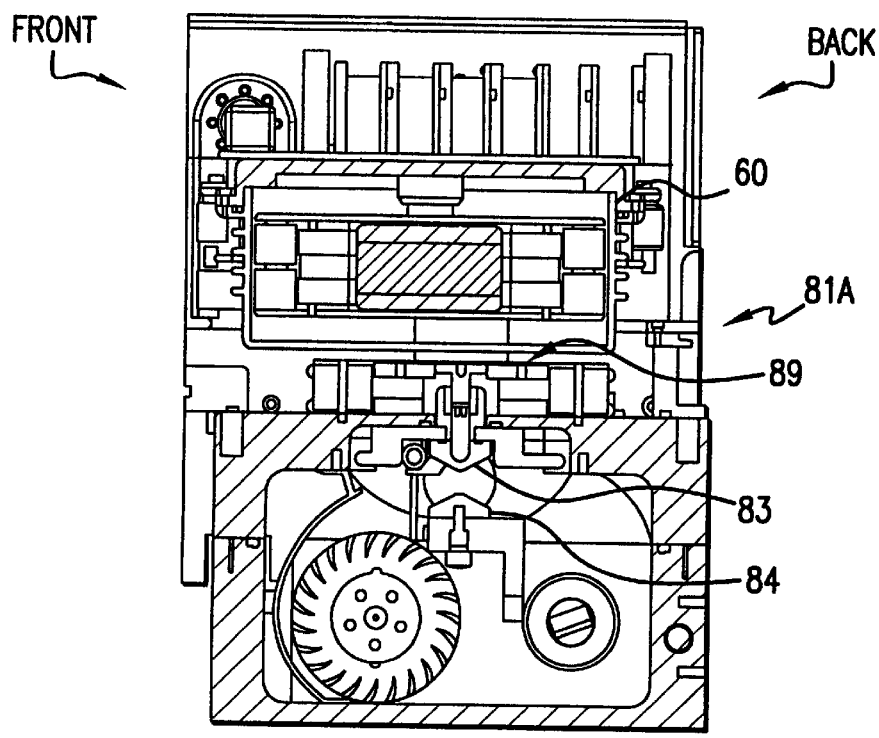
FIG.8H1
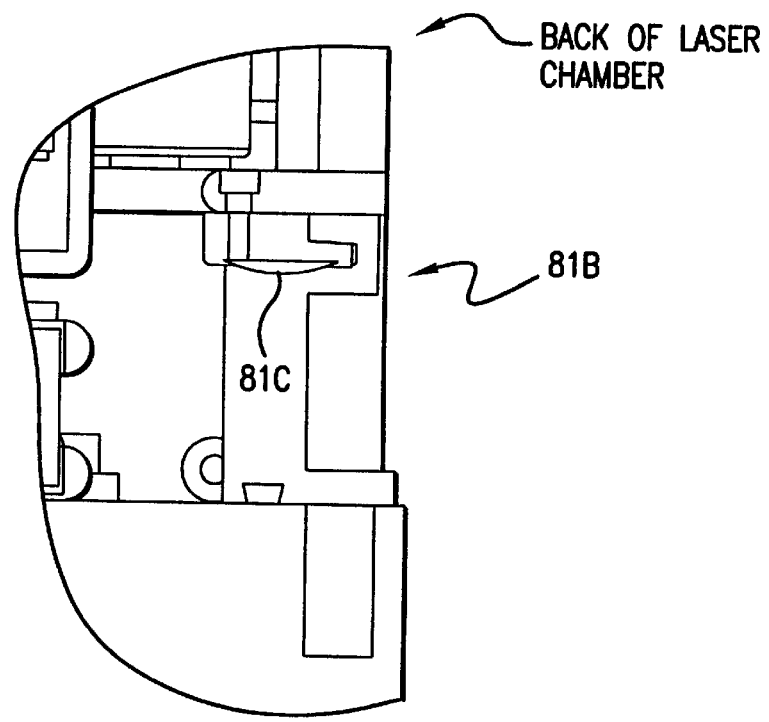
FIG.8H2

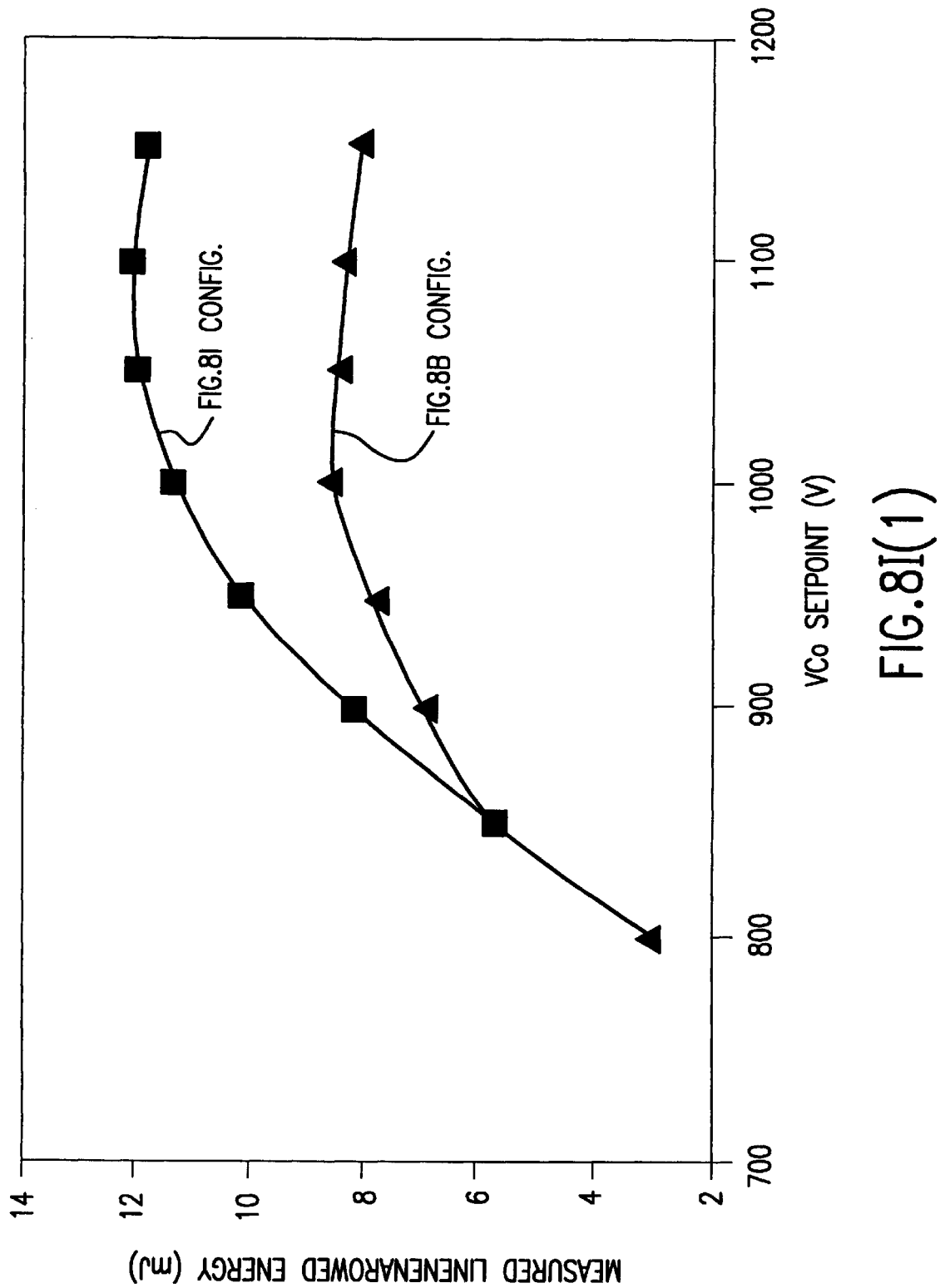
FIG. 8I(1)

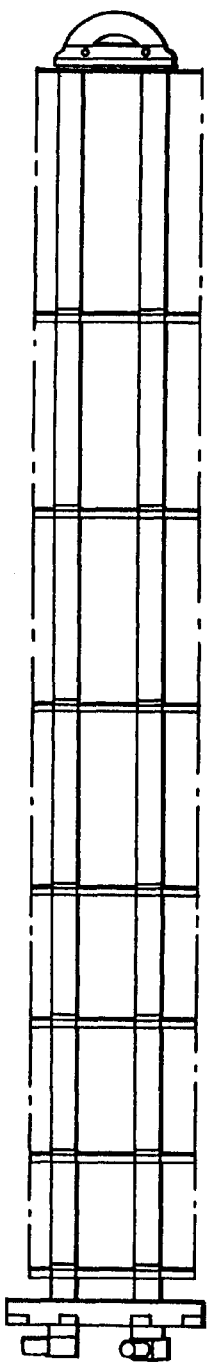
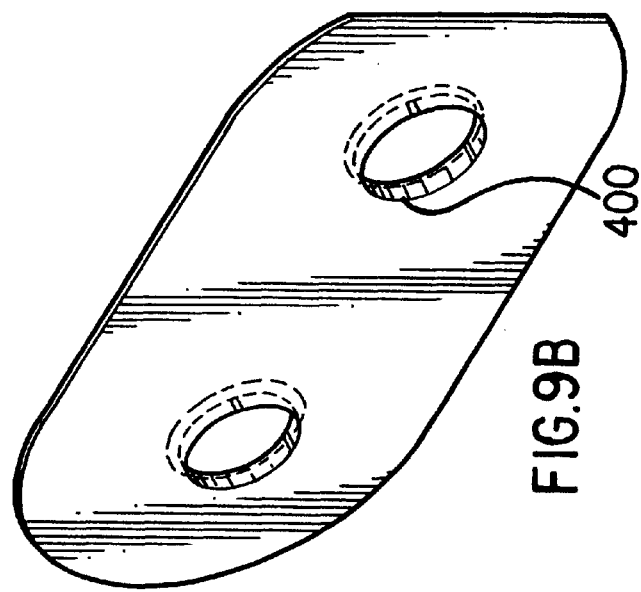
FIG.9A
FIG.9B

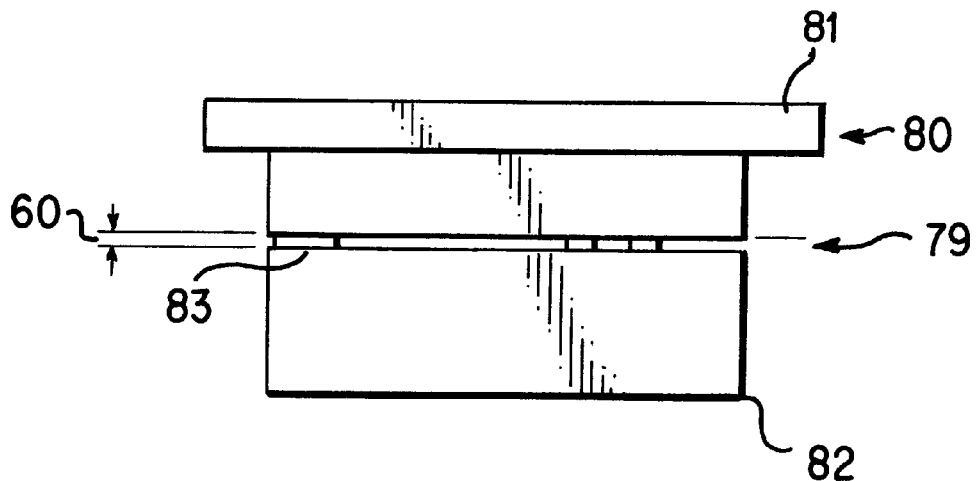
FIG. 10 G1
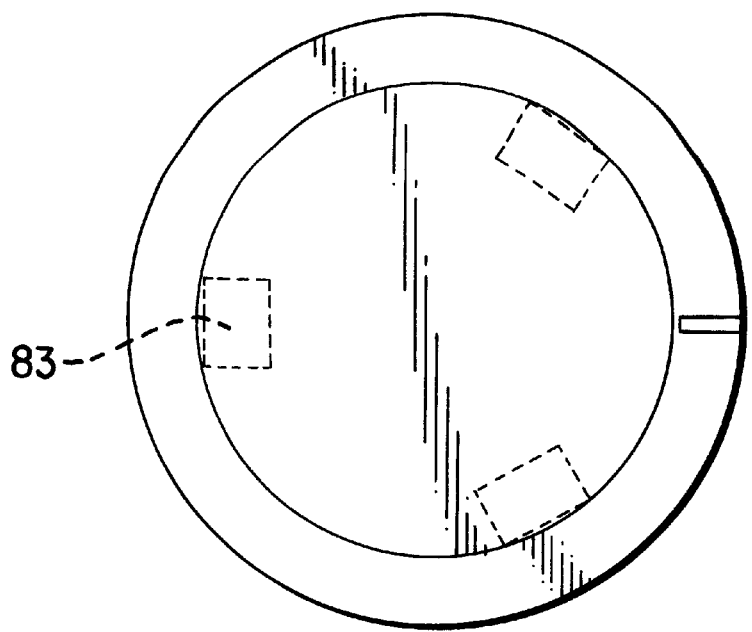
FIG. 10 G2

PDA OUTPUT SHOWING ETALON FRINGES

ARF LASER WITH LOW PULSE ENERGY AND HIGH REP RATE

This Application is a Continuation-In-Part of Ser. No. 09/041,474, Reliable, Modular, Production Quality Narrow Band KrF Excimer Laser, filed Mar. 11, 1998, now U.S. Pat. No. 5,991,324, all of which are incorporated herein by reference.

This invention relates to lasers and in particular to narrow-band ArF excimer lasers.

BACKGROUND OF THE INVENTION

Krypton-Fluoride (KrF) excimer lasers are currently becoming the workhorse light source for the integrated circuit lithography industry. The KrF laser produces a laser beam having a narrow-band wavelength of about 248 nm and can be used to produce integrated circuits with dimensions as small as about 180 nm. The Argon Fluoride (ArF) excimer laser is very similar to the KrF laser. The primary difference is the laser gas mixture and a shorter wavelength of the output beam. Basically, Argon replaces Krypton and the resulting wavelength of the output beam is 193 nm. This permits the integrated circuit dimensions to be further reduced to about 120 nm. A typical prior-art KrF excimer laser used in the production of integrated circuits is depicted in FIG. 1 and FIG. 2. A cross section of the laser chamber of this prior art laser is shown in FIG. 3. A pulse power system 2 powered by high voltage power supply 3 provides electrical pulses to electrodes 6 located in a discharge chamber 8. Typical state-of-the art lithography lasers are operated at a pulse rate of about 1000 to 2000 Hz with pulse energies of about 10 mJ per pulse. The laser gas (for a KrF laser, about 0.1% fluorine, 1.3% krypton and the rest neon which functions as a buffer gas) at about 3 atmospheres is circulated through the space between the electrodes at velocities of about 1,000 inches per second or greater. This is done with tangential blower 10 located in the laser discharge chamber. The laser gases are cooled with a heat exchanger 11 also located in the chamber and a cold plate (not shown) mounted on the outside of the chamber. The natural bandwidth of the excimer lasers is narrowed by line narrowing module 18. Commercial excimer laser systems are typically comprised of several modules that may be replaced quickly without disturbing the rest of the system. Principal modules include:

Laser Chamber Module,

Pulse Power System with: high voltage power supply module, commutator module and high voltage compression head module, Output Coupler Module, Line Narrowing Module, Wavemeter Module, Computer Control Module, Gas Control Module, Cooling Water Module Electrodes 6 consist of cathode 6A and anode 6B. Anode 6B is supported in this prior art embodiment by anode support bar 44 which is shown in cross section in FIG. 3. Flow is clockwise in this view. One corner and one edge of anode support bar 44 serves as a guide vane to force air from blower 10 to flow between electrodes 6A and 6B. Other guide vanes in this prior art laser are shown at 46, 48 and 50. Perforated current return plate 52 helps ground anode 6B to the metal structure of chamber 8. The plate is perforated with large holes (not shown in FIG. 3) located in the laser gas flow path so that the current return plate does not substantially affect the gas flow.

A peaking capacitor comprised of an array of individual capacitors 19 is charged prior to each pulse by pulse power system 2. During the voltage buildup on the peaking capacitor, two preionizers 56 weakly ionize the lasing gas between electrodes 6A and 6B and as the charge on capacitors reach about 16,000 volts, a discharge across the electrode is generated producing the excimer laser pulse. Following each pulse, the gas flow between the electrodes of about 1 inch per millisecond, created by blower 10, is sufficient to provide fresh laser gas between the electrodes in time for the next pulse occurring one millisecond later.

In a typical lithography excimer laser, a feedback control system measures the output laser energy of each pulse, determines the degree of deviation from a desired pulse energy, and then sends a signal to a controller to adjust the power supply voltage so that energy of subsequent pulses are close to the desired energy. In prior art systems, this feedback signal is an analog signal and it is subject to noise produced by the laser environment. This noise can result in erroneous power supply voltages being provided and can in turn result in increased variation in the output laser pulse energy.

These excimer lasers are typically required to operate continuously 24 hours per day, 7 days per week for several months, with only short outages for scheduled maintenance. One problem experienced with these prior-art lasers has been excessive wear and occasional failure of blower bearings.

A prior art wavemeter utilizes a grating for coarse measurement of wavelength and an etalon for fine wavelength measurement and contains an iron vapor absorption cell to provide an absolute calibration for the wavemeter. This prior art device focuses the coarse signal from the grating onto a linear photo diode array in the center of a set of fringes produced by the etalon. The center fringes produced by the etalon are blocked to permit the photo diode array to detect the coarse grating signal. The prior-art wavemeter cannot meet desired speed and accuracy requirements for wavelength measurements.

A need exists in the integrated circuit industry for a modular, reliable, production line quality ArF excimer laser in order to permit integrated circuit resolution not available with KrF lasers.

SUMMARY OF THE INVENTION

The present invention provides a reliable modular production quality ArF excimer laser capable of producing laser pulses at repetition rates in the range of 3,000 to 4,000 Hz or greater with pulse energies in the range of about 2 mJ to 5 mJ or greater with a full width half, maximum bandwidth of about 0.4 pm or less and dose stability of less than 0.4 percent. Using this laser as an illumination source, stepper or scanner equipment can produce integrated circuit resolution of 0.10 $\mu$m (100 nm) or less. Replaceable modules include a laser chamber; a modular pulse power system; and a line narrowing module. For a given laser power output, the higher repetition rate provides two important advantages. The lower per pulse energy means less optical damage and the larger number of pulses for a specified illumination dose means better dose stability.

Important improvements have been provided in the pulse power unit to produce faster charging. These improvements include an increased capacity high voltage power supply, an improved commutation module that generates a high voltage pulse from the capacitors charged by the high voltage power supply and amplifies the pulse voltage 23 times with a very fast voltage transformer having a secondary winding consisting of a single four-segment stainless steel rod. A novel design for the compression head saturable inductor (referred to herein as a "pots and pans" design) greatly reduces the quantity of transformer oil required and virtually eliminates the possibility of oil leakage which in the past has posed a hazard.

Improvements in the laser chamber permitting the higher pulse rates and improved bandwidth performance include the use of a single preionizer tube.

Improvements in the resonance cavity of preferred embodiments of the present invention include a line narrowing module with CaF prism beam expanders and a grating specially coated for UV damage resistance. Preferred embodiments comprised output couplers having substantially increased reflectivity over prior art designs.

A newly designed wavemeter including a computer processor programmed with an algorithm for controlling wavelength measurements and computing wavelengths at rates sufficient for feedback control of the wavelength of the output laser beam at rates of 3,000 Hz or faster. In a preferred embodiment a vapor cell with platinum vapor providing a reference absorption line for system calibration.

Other embodiments of the present invention include ceramic bearings. Optionally magnetic bearings may be utilized. Reaction forces on the bearings may be reduced by providing an aerodynamic contour on the anode support bar. Other improvements include use of acoustic baffles for laser chambers producing disruptive acoustic shock waves.

BRIEF DESCRIPTION OF THE DRAWINGS

FIGS. 6 and 6A are cross section drawings of laser chambers of preferred embodiments of the present invention.

FIGS. 8F1, 8F2 and 8F3 are time line charts showing pulse compression using the above preferred embodiment operating at 1000 Hz.

FIGS. 8G1 and 8G2 are drawing showing two views of a saturable inductor.

FIGS. 8H1 and 8H2 shows the mounting of a compression head in a preferred embodiment.

FIG. 8I(1) shows an advantage of the FIG. 8I circuit over the FIG. 8B circuit.

FIGS. 9A and 9B are drawings describing a preferred heat exchanger design.

FIGS. 10G1 and 10G2 are views of an etalon.

DETAILED DESCRIPTION OF PREFERRED EMBODIMENTS

First Preferred Embodiment

A preferred embodiment of the present invention can be described by reference to the drawings.

Modular Laser Design

Figure 4:
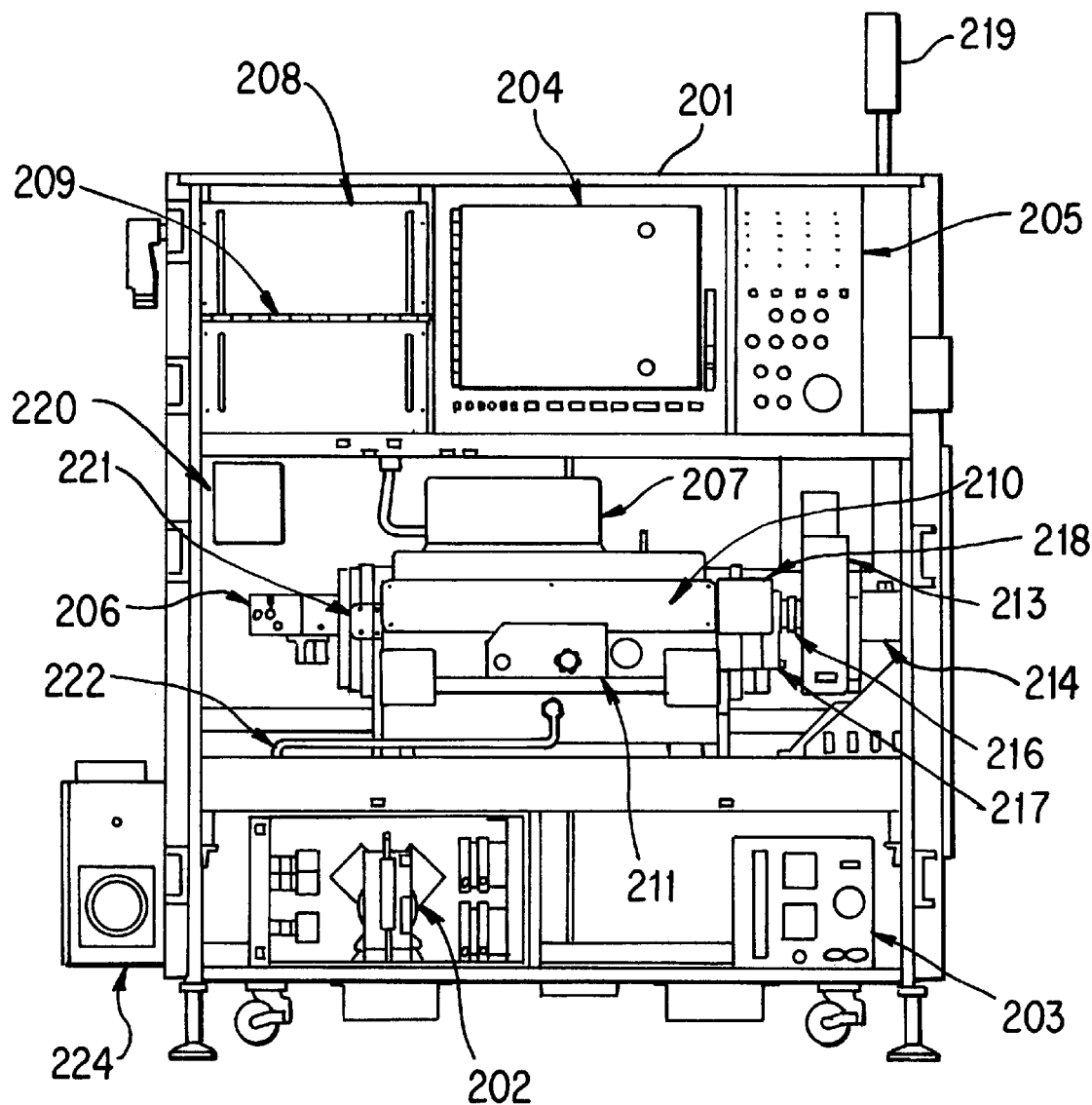
FIG. 4 is a drawings of a preferred embodiment of the present invention.

A front view of a preferred embodiment of the present invention is shown in FIG. 4 respectively. This drawing emphasizes the modular nature of their particular invention which allows very quick replacement of modules for repair, replacement and maintenance. The principal features of this embodiment are listed below corresponding to the reference numbers shown on FIG. 4.

201 Laser enclosure
202 Gas module
203 Cooling water supply module
204 AC/DC distribution module
205 Control module
206 Line narrowing module
207 Compression head 208 High voltage pulse power supply module
209 Commutator module for pulse power supply
210 Metal fluoride trap
211 Laser chamber
213 Wavemeter module
214 Automatic shutter
216 Output coupler
217 Blower motor
218 Metal fluoride trap power supply
219 Status lamp
220 24 volt power supply
221 Chamber window
222 Gas control flexible connection
224 Vent box

Higher Repetition Rate Lower Pulse Energy

As compared to prior art ArF lasers, a first preferred embodiment of the present invention a substantial reduction in the per pulse energy and compensater with a correspondingly higher pulse repetition rate. For example, to produce an output of 10 watts at a repetition rate of 1000 Hz each pulse would have energy of 10 mJ. To produce 10 watts at 2000 Hz the pulse energy would be 5 mJ. In this preferred embodiment the per pulse energy is reduced to about 3.3 mJ and the repetition rate is increased to 3000 Hz. The present invention also is a substantial reduction in the laser beam bandwidth.

Important improvements (as compared to prior art modular laser system) have been made to permit reliable, consistant laser operation at these greatly increased repetition rates while controlling laser parameters to extremely tight specification. These improvements are discussed below.

Preferred Embodiment

Figure 1:
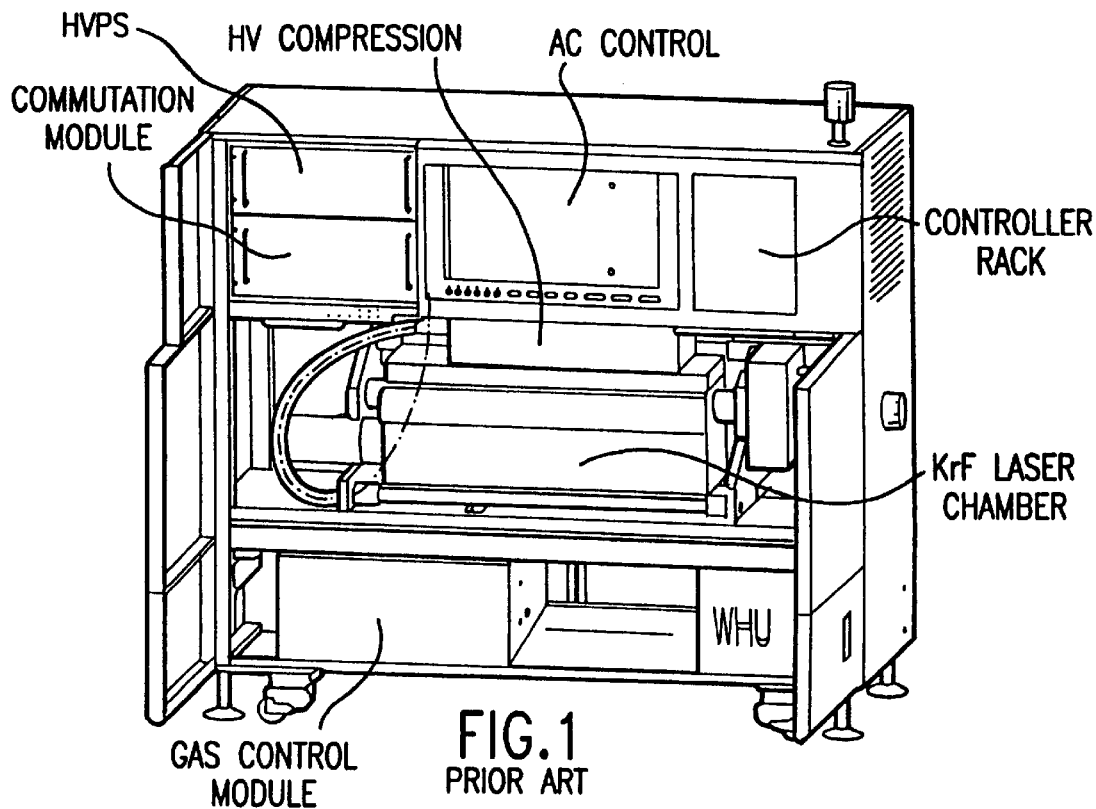
FIG. 1 is a drawing of a prior art commercial excimer lithography laser.
Figure 2:
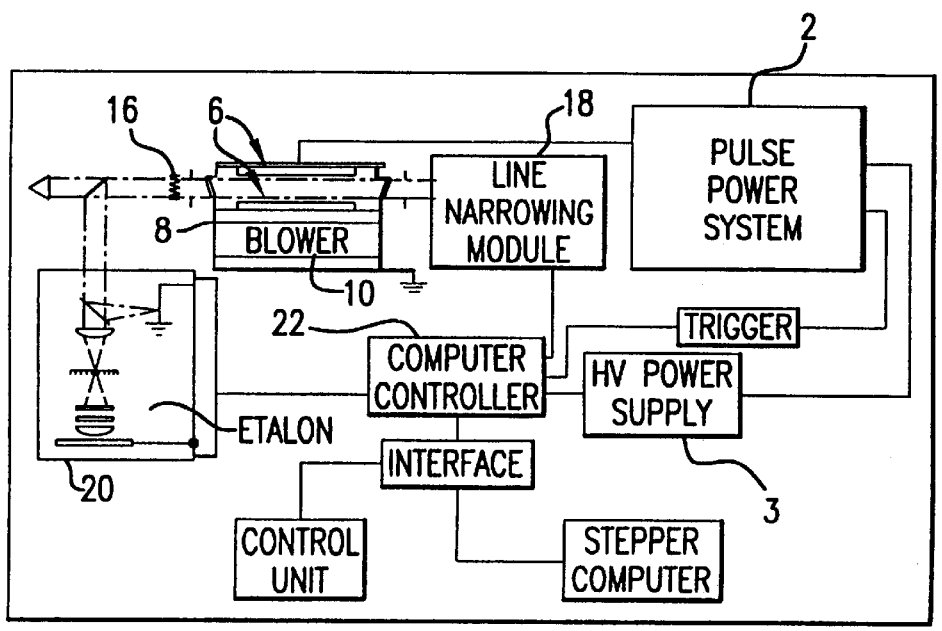
FIG. 2 is a block diagram showing some of the principal elements of a prior art commercial excimer lasers used for integrated circuit lithography.
Figure 3:
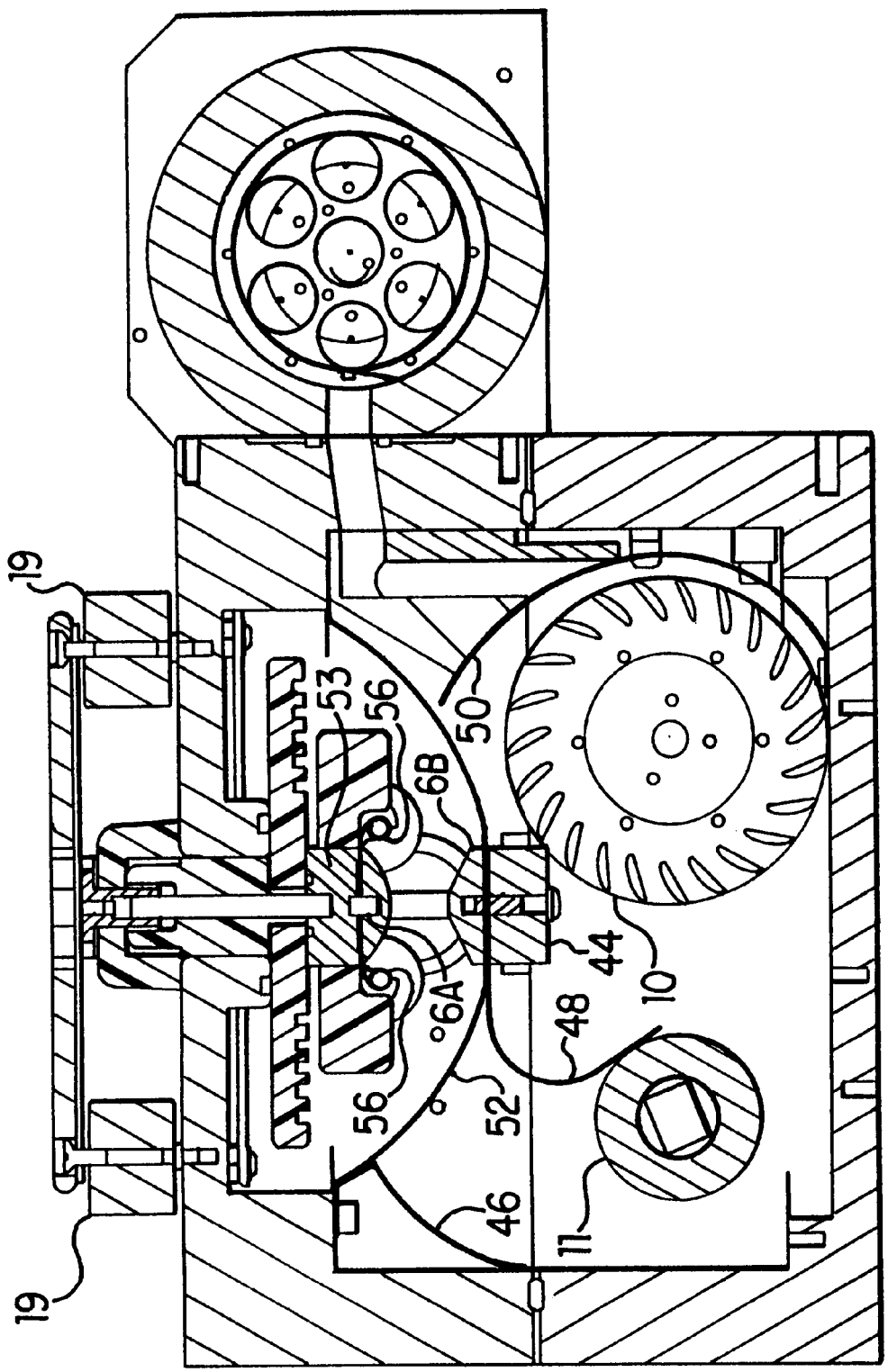
FIG. 3 is a drawing of the laser chamber of the FIG. 2 laser.

A preferred embodiment of the present invention is an improved version of the laser described in FIGS. 1, 2 and 3. This preferred embodiment includes the following improvements:

1) A single tube larger preionizer replaces the prior-art combination of a two-tube preionizer to provide improved efficiency, better preionization and improved laser gas flow between the electrodes;
2) A one-piece silicon free machined fan blade;
3) Acoustic baffles are provided to minimize adverse effects of acoustic shock waves resulting from the electric discharges;
4) The solid-state pulse power system has been modified to produce faster rise time, providing more consistent pulses, and improved laser efficiency at higher voltages;
5) More precise control of the charging voltage of the pulse power system;
6) The reflectivity of the output coupler has been increased to about 30%, substantially decreasing the bandwidth of the output pulse;
7) Fused silica prisms have been replaced with CaF prisms to provide much better thermal stability;
8) $MgF_2$ coated grating;
9) An improved wavemeter providing much more precise measurement of nominal wavelength and bandwidth is provided;
10) Improved wavemeter by using an elastomer free etalon design and a new diffuser; and
11) A computer controller programmed with a new algorithm providing a much improved control of pulse energy and burst energy.

Chamber Improvements

Single Preionizer Tube

Figure 6:
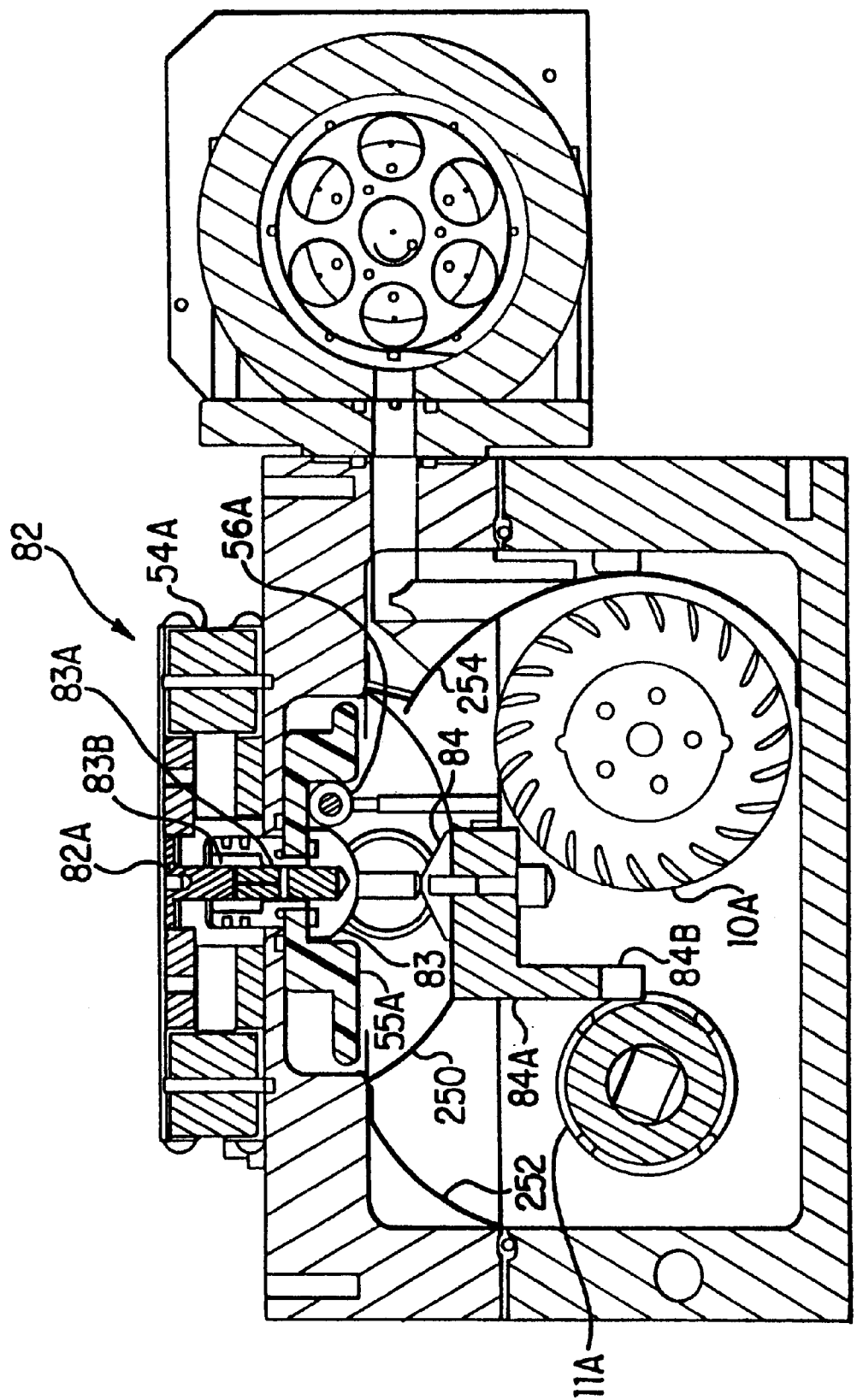

As shown in FIG. 6, a single larger preionizer tube 56A has replaced the two-preionizer tubes 56 shown in FIG. 3. The single tube preionizer is fabricated in accordance with the description in U.S. Pat. No. 5,719,896, issued Feb. 17, 1998, which is incorporated herein by reference. Applicants have discovered that one preionizer tube is not only sufficient, but very surprisingly provides improved performance over the two-preionizer design. In this embodiment the preionizer is located upstream of the electrodes. Applicants do not fully understand the reason for the improved performance. Applicants have determined that the one tube preionizer improves in the pulse-to-pulse stability by providing improved spacial stability of the discharge.

Figure 7:
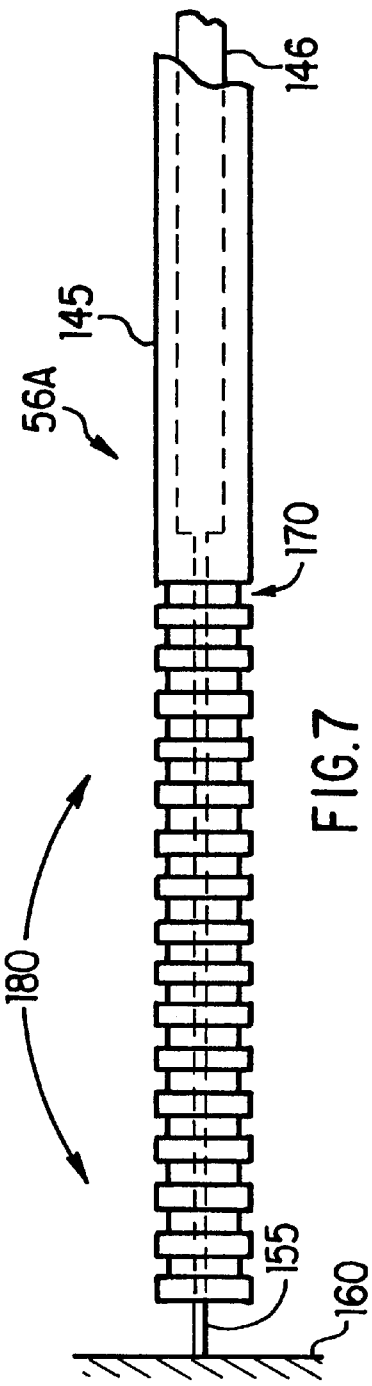
FIG. 7 is a drawing showing features of a preferred preionizer tube.

Referring now to FIG. 7, this preionizer utilizes an integrated tube design, having bushing element 180 with anti-tracking grooves 170 incorporated therein as an integral component of the tube. The diameter of the rod portion 145 and the OD of the bushing portion 180 of the preionizer is ½ inch. The inside conductor rod 146 has a diameter of 7/37 inch and the connecting wire extending through the bushing section to make a ground connection is about 1/16 inch diameter. Prior preionizer tube designs utilized a two-diameter design, with the rod portion at about ¼ inch diameter and the bushings at about 1 inch diameter. This necessitated, for manufacturing purposes, a bonding process to join the bushing component with the tube component. The constant diameter, thicker tube design is contrary to conventional design rules, which would predict a reduction in ionization due to lower capacitances. In most designs, the tube thickness is dependent upon the dielectric strength of the material selected. Those skilled in the art will recognize that the prior art conventional preionizer tube design technique is to select a material with the highest dielectric strength and determining a wall thickness to match this capacity. For example, a sapphire material is known to have a dielectric strength ranging from 1200 volts/mil to 1700 volts/mil. Therefore, a dielectric thickness of 0.035 inches thick, provides a safety factor of 2 if the laser operates at 25 kV. This design yields a lower capacitance; however, the actual effect of this reduced capacitance on laser operation was discovered to be negligible, with a surprising increase in the measured geometric irradiation of the electrode gap. Because of the constant diameter, thicker tube wall, integral bushing design, a single piece of material can be machined to provide anti-tracking grooves 170. Because of the single piece construction, there is no need to use ultra-pure (i.e., 99.9%) polycrystalline translucent aluminum oxide ceramic, although Applicants continue to use the ultra-pure material. There is no requirement to perform the difficult surface polishing of tube geometries in preparation for diffusion bonding to artificially create the integral relationship between bushing 180 and tube 145. In fact, it has been determined that high purity is not as important a property as porosity of the material. It has been found that the greater the porosity, the more the dielectric strength is reduced. As a result, a commercial grade ceramic, preferably with purity of at least 99.8% and low porosity, such as that manufactured by Coors Ceramics Company under the material No. AD-998E and having a dielectric strength of 300 volts/mil may be used. Bushings 180, having anti-tracking grooves 170 disposed therein, as previously described, act to prevent high voltage tracking axially along the surface of the tube from the cathode to the ground plane 160.

As explained above, Applicants have discovered that a single preionizer works dramatically better than two preionizers, and as explained above the first preferred embodiment places the single preionizer system of the electrodes. Applicants have also experimented with the single preionizer located downstream and has discovered that at certain blower speeds this arrangement produces substantially better pulse energy stability than the upstream arrangement on the two tube arrangement.

High Efficiency Chamber

Improvements have been made to the chamber to improve the efficiency of the laser. A single piece cathode insulator 276 comprised of alumina, $Al_2O_3$ insulates the cathode from the upper chamber structure as shown in FIG. 17. In a prior art design, eight separate insulators were needed to avoid insulator cracking due to thermal expansion stress in the insulator. This important improvement permitted the head portion of the chamber to be made shorter which significantly reduced the distance between the cathode the peaking capacitor. The individual capacitors 54A forming the peaking capacitor array 82 were moved horizontally in closer to the cathode as compared to the prior art.

Prior art cathodes for commercial lithography lasers were typically supported by a cathode support bar 53 as shown in FIG. 3. In this preferred embodiment, the cathode support bar was eliminated and the cathode 83 was made slightly thicker and mounted directly on the single piece insulator 55A. The cathode 83 is connected to the high voltage side 82A of peaking capacitor 82 by 15 feed through rods 83A and connecting nuts 83B. In the preferred embodiment, a new anode support bar is substantially more massive than prior art anode support bars and comprises fins located in the gas flow region. Both of these features minimize temperature variations of the anode.

Figure 20:
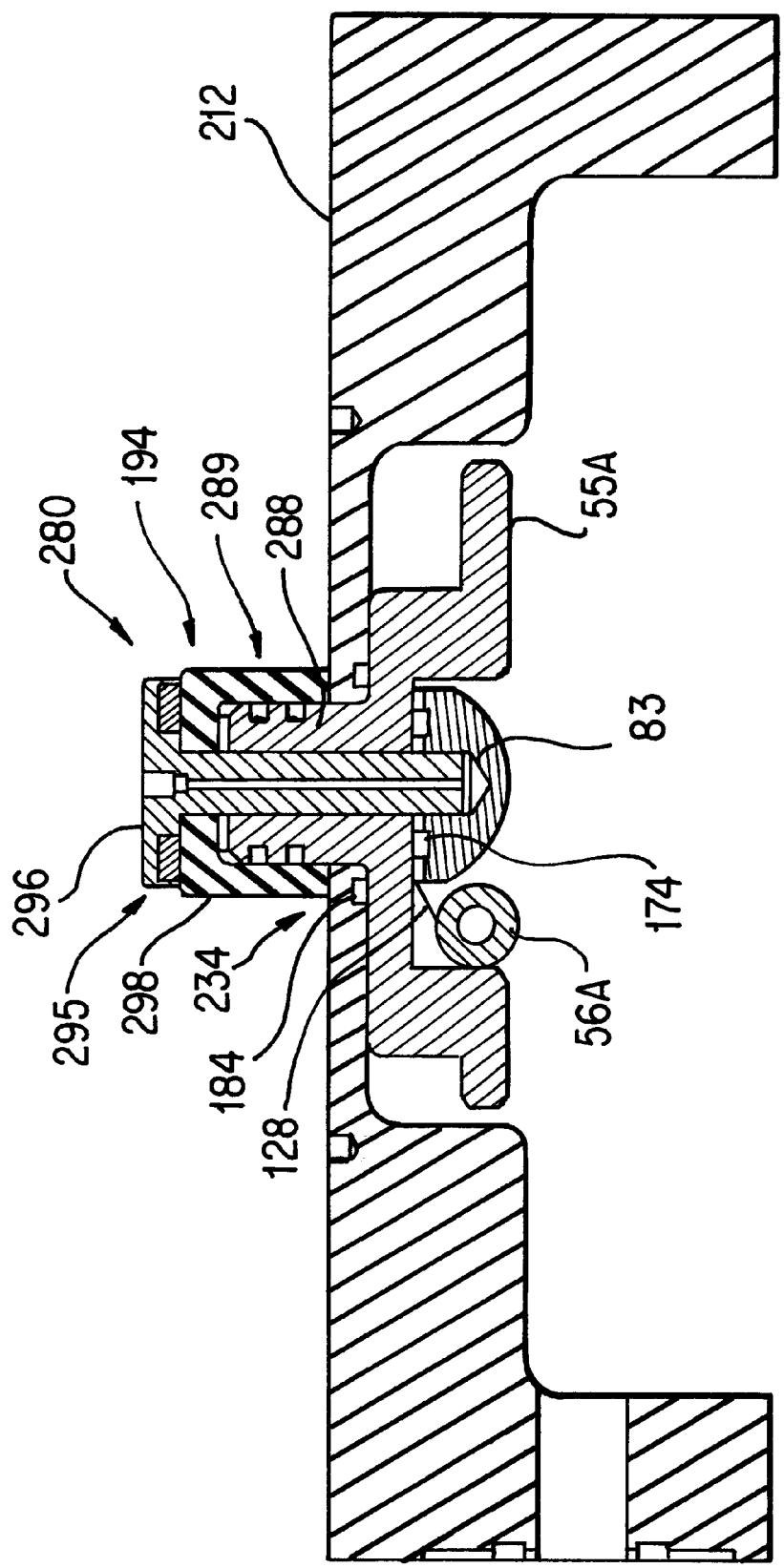
FIG. 20 shows a high voltage feedthrough with a single-piece insulator.

FIG. 20 is a cross-sectional view showing a portion of an upper enclosure member 212 to which is attached the cathode assembly including an improved feedthrough structure 280, in accordance with the present invention. Among other things, feedthrough structure features a single piece integrated main insulator 55A including self-contained fifteen cylindrical integral feedthrough insulators 288 and polished sealing surfaces. Upper enclosure member 212 includes fifteen clearance holes 232 that are shaped, such that structural alignment is maintained without constraining thermal expansion. Sliding face seals 184, 185 are set into properly dimensioned grooves 234 in the inside surface of upper enclosure 212 and grooves 174 in the top of electrodes 218. These seals provide gas-tight integrity without transmitting torque within feedthrough structure 280, since they slip on polished surfaces of main insulator 276.

A cathod 218, made of brass is fastened to an upper enclosure member 212 using feedthrough structure 280, such that cathod 218 is positioned above and aligned longitudinally parallel with an anode assembly 220. Along the centerline of the upper surface of cathode 218 are fifteen substantially identical evenly spaced blind tapped holes. Concentric with each of tapped holes is annular groove 174.

Feedthrough structure 280 provides mechanical support, high pulse voltage electrical contact, and electrical isolation for cathode 83, as well as sealing against gas leakage around the electrical feedthroughs. Feedthrough structure 280 includes a shaped, longitudinally extended single piece integrated main insulator 55A, generally made of alumina, having a single row of multiple substantially evenly spaced vertical holes concentric through substantially cylindrical integral feedthrough insulators 288 extending perpendicular from an upper face of single piece integrated main insulator 55A in alignment with boind tapped holes of cathod 83. Single piece integrated main insulator 55A is fabricated using methods known in the art, e.g., casting and maching "gteen" ceramic material, high-temperature firing, and then finish machining the fired ceramic. Both upper and lower faces of integrated main insulator 55A are polished, typically to a surface finish of 16 microinches (0.41 microns), providing improved sealing against cathode 218 and upper enclosure member 212. Integral feedthrough insulators 288 each have two outer concentric grooves 289 as shown in FIG. 17. Feedthrough structure 280 also includes multiple (one per each blind tapped hole in cathode 83 threaded feedthrough bolts 296, large diameter and small diameter face seals 184 and 174 respectively comprising tin-plated "C"-seals. Feedthrough structure 280 further includes multiple silicone rubber gaskets 194, properly sized Belleville washers 295, and insulating ceramic "buttercups" 298.

Metal Seals

Applicants have discovered that prior art elastomer seals reacted with fluorine gas to produce contaminants in the laser gas which degraded laser performance. A preferred embodiment of the present invention uses all metal seals to seal the laser chamber. The preferred metal seals are tin plated inconel 1718 seals. In the case of heat exchanger 11, a metal bellows has been provided which permits thermal expansion and contraction and allows metal seals to be used to seal cooling water inlets.

Monel Current Return and Vanes

Applicants have also discovered that elements of stainless steel also react with fluorine to produce contaminants in the laser gas. Therefore, in this preferred embodiment, prior art stainless steel current return structures and gas flow vanes have been replaced with monel current returns 250 and monel flow vanes 252 and 254.

Acoustic Baffles

Applicants have discovered that a significant cause of distortion of the quality of laser beams produced by narrowband excimer lasers operating at 1000 Hz or greater is acoustic shock waves created by the electric discharge of one pulse which reflects from elements of chamber structure back to the space between the electrodes and distorts the laser beam of the next pulse occurring 1.0 millisecond later. An embodiment described herein (see FIG. 6A) substantially minimizes this effect by providing angled, grooved acoustic baffles 60 and 62 on both sides of the laser chamber. These baffles absorb a portion of the acoustic energy and reflect a portion of the acoustic energy down into the lower region of the laser chamber away from the electrodes. In this preferred embodiment, the baffles consist of a machined metal structure with grooves 0.1 mil wide, 0.3 mil deep spaced at 0.2 mil intervals; a 0.3 mil deep groove is shown at 61 in baffle 60 in FIG. 6A. These baffles have been shown by actual testing to substantially reduce pulse quality distortion caused by acoustic shock waves.

Applicants have also discovered that acoustic shock effects can be minimized by reducing streamers in the electric discharge. In fact, in a preferred embodiment of the present invention changes made in the chamber head (discussed above) and the new preionizer designed reduced acoustic shock so that acoustic baffles were not needed.

Fan Improvements

This preferred embodiment of the present invention includes major improvements in the prior art gas circulator which has greatly improved laser performance. These improvements are in the construction of a braze free blower blade structure. A new non-symmetrical blade arrangement which greatly decreases resonance effects and improved bearings.

Silicon Free Fan Blade Structure

Applicants have discovered that a brazing material commonly used in blower blade construction was the primary source of $SiF_6$ in the laser chamber. This gas significantly degraded laser performance for KrF lasers but was a total disaster for ArF lasers. Applicants have identified four solutions to this problem. First the blade structure was machined in segments from a solid block of material (in this case aluminum). Another solution was to cast the blade structure in segments. The segments then are welded together using electron beam welding in which no new material is added. It is also feasible to fabricate the blade structure by joining blades to a frame structure but in this case the joining is by electron beam welding instead of the prior art brazing process. The fourth method is to join the blade to a frame structure using a soldering process using a silicon free solder. Aluminum 6061 is used as the base material for all of the component pieces. These parts are then copper-plated in prelude to the soldering process. With all of the parts assembled, the fan is then soldered together using a low temperature solder, typically 91% tin (Sn) and 9% Zinc (Zn) in a vacuum furnace. This solder is chosen due to its lack of silicon and its ability to work with copper plated aluminum. The assembled and soldered fan is then nickel-plated. This method of construction yields a non-silicon fan that is inexpensive to manufacture.

Reducing Resonance Effects

Prior art blower blade structures consisted of a tangential blower with 23 longitudinal blades. These blades were mounted symmetrically at the circumference of the structure. Substantial resonance effects were measured both with respect to fan parameters and actual laser performance. Perturbations in the laser beam were shown to correspond to acoustic waves at 23 times the rotating frequency of the fan. Adverse affects on bearing performance were also measured corresponding to 23 times the fan's rotating frequency.

Figure 14B:
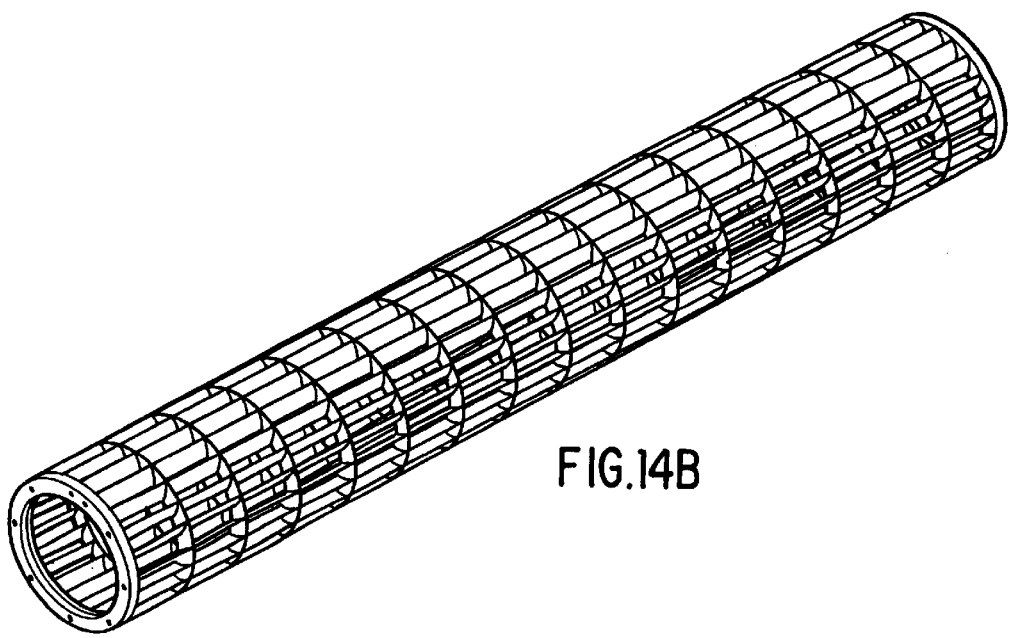
FIGS. 14A, 14B and 14C show preferred blower blade structure designs.
Figure 14A:
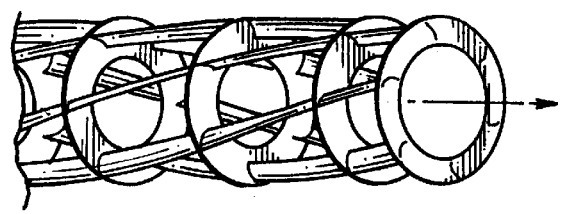
Figure 14C:
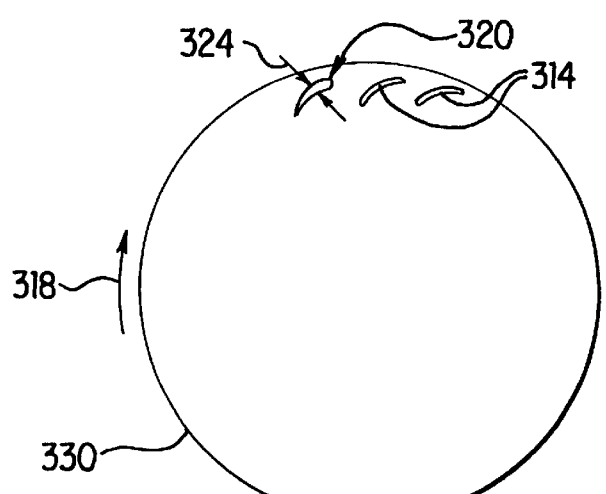

Improvements in fan structure design call for a non symmetrical blade arrangement such as that shown in FIG. 14A. An alternative as shown in FIG. 14B where the fan blade structure is formed of 16 separate machined or cart segments with each segment having 23 blades is to rotate each segment by 360°/(15×23) or about 1° relative to the adjacent segment. Another improvement which is made relatively easy in the machine or cast approach to fan blade structure fabrication is to form the blades into air foils as shown at 320 in FIG. 14C. Prior art blades were stamped and a cross section of the two of the stamped blades are shown for comparison at 314. The direction of rotation is shown at 318 and 330 represents the circumference of the blade structure. Whereas conventional blades are uniform in thickness, airfoil blades have a tear shape profile including a rounded leading edge, a thickened midsection and a tapered trailing edge.

Bearing Improvements

Embodiments of the present invention will be made available with one of two alternative bearing improvements over the prior art.

Ceramic Bearings

A preferred embodiment of the present invention includes ceramic bearings. The preferred ceramic bearings are silicon nitride lubricated with a synthetic lubricant, preferably perfluoropolyalkylether (PFPE). These bearings provide substantially greater life as compared to prior art excimer laser fan bearings. In addition, neither the bearings nor the lubricant are significantly affected by the highly reactive fluorine gas.

Magnetic Bearings

Figure 5:
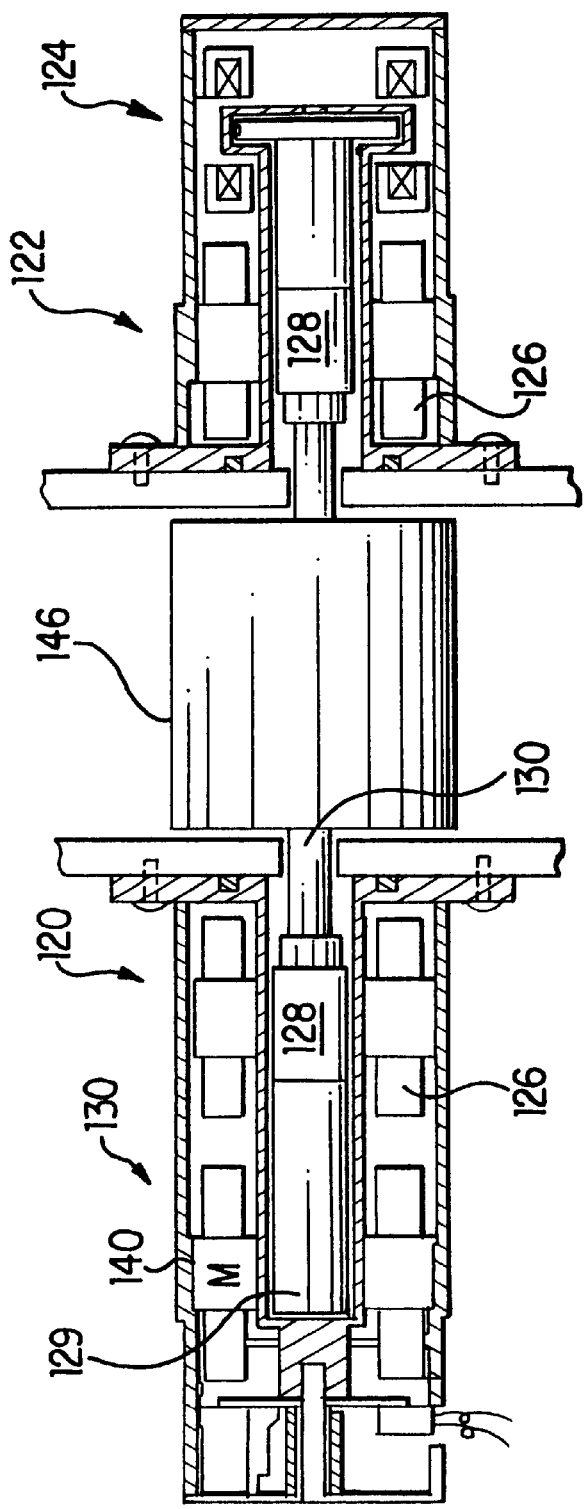
FIG. 5 is a drawing showing a blower drive unit including magnetic bearings.

Another preferred embodiment of the present invention comes with magnetic bearings supporting the fan structure as shown in FIG. 5. In this embodiment, the shaft 130 supporting the fan blade structure 146 is in turn supported by an active magnetic bearing system and driven by a brushless DC motor 130 in which the rotor 129 of the motor and the rotors 128 of at least two bearings are sealed within the gas environment of the laser cavity and the motor stator 140 and the coils 126 of the magnetic bearing magnets are located outside the gas environment. This preferred bearing design also includes an active magnetic thrust bearing 124 which also has the coils located outside the gas environment.

Aerodynamic Anode Support Bar

As shown in FIG. 3, prior art gas flow from blower 10 was forced to flow between electrodes 6A and 6B by anode support bar 44. However, Applicants have discovered that the prior art designs of support bar 44 such as that shown in FIG. 3 produced substantial aerodynamic reaction forces on the blower which were transferred to the blower bearings resulting in chamber vibration. Applicants suspect that these vibrational forces are responsible for blower bearing wear and possibly occasional bearing failures. Applicant has tested other designs, several of which are shown in FIGS. 12A–12E, all of which reduced the aerodynamic reaction forces by distributing over a longer time period, the reaction force resulting each time a blade passes close to the edge of support bar 44. One of Applicants preferred anode support bar design is shown in FIG. 6A at 84A. This design has substantially greater mass which minimizes anode temperature savings. The total mass of the anode and the anode support bar is about 3.4 Kg. Also, this design comprises fins 84B which provides added cooling for the anode. Applicants tests have indicated that both the acoustic baffles and the aerodynamic anode support bar tend to reduce slightly the gas flow so that is gas flow is limited, the utilization of these two improvements should involve a trade-off analysis. For these reasons two improvements are shown on FIG. 6A and not FIG. 6.

Pulse Power System

Functional Description of Four Pulse Power Modules

Figure 8A:
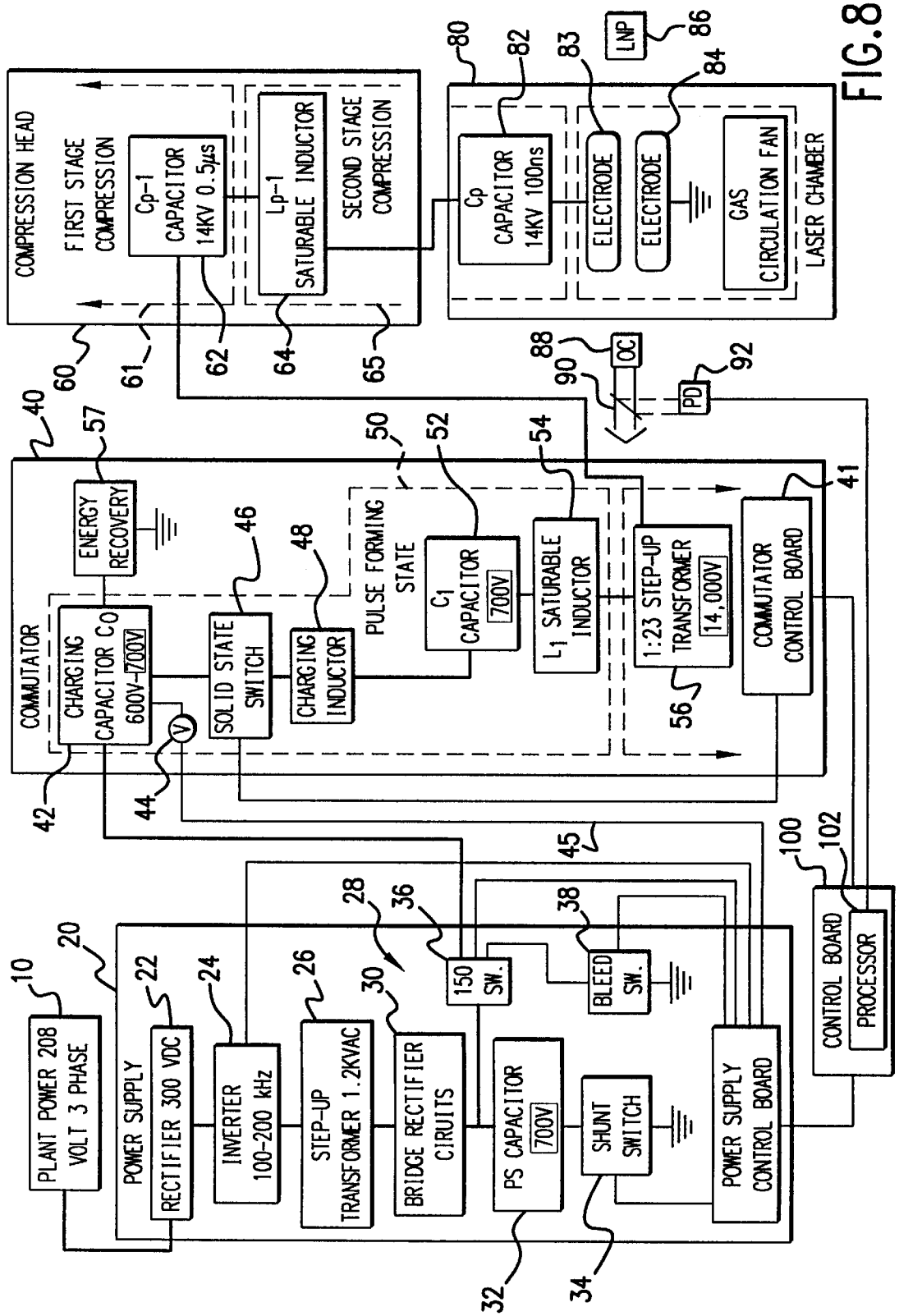
FIG. 8A is a block diagram of a pulse power system of the preferred embodiment of the present invention.
Figure 8B:
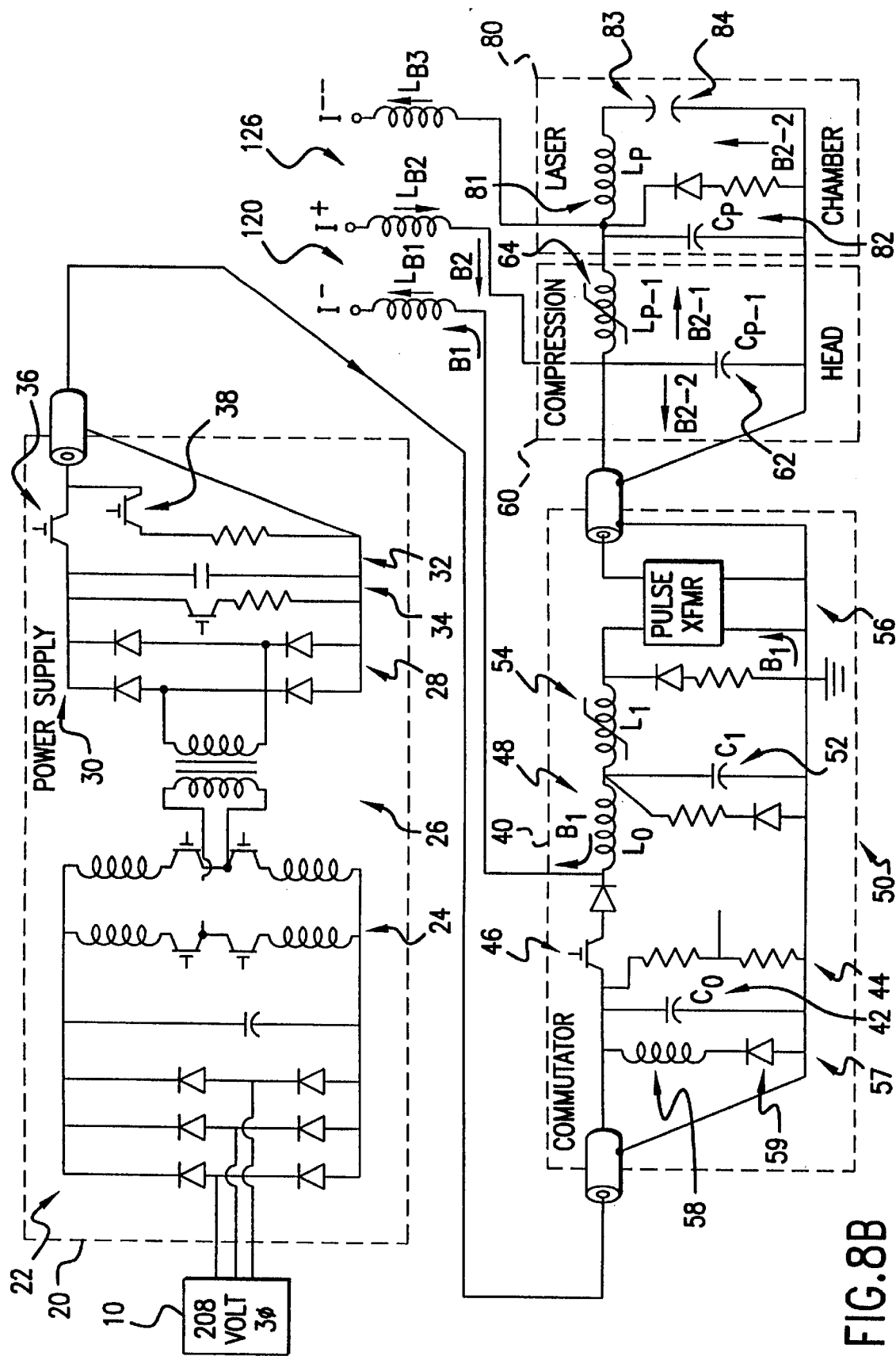
FIG. 8B is a simplified circuit diagram of the above preferred embodiment.

A preferred pulse power system is manufactured in four separate modules as indicated in FIGS. 8A and 8B, each of which becomes an important part of the excimer laser system and each of which can be quickly replaced in the event of a parts failure or in the course of a regular preventative maintenance program. These modules are designated by Applicants: high voltage power supply module 20, commutator module 40, compression head module 60 and laser chamber module 80.

High Voltage Power Supply Module

High voltage power supply module 20 comprises a 300 volt rectifier 22 for converting 208 volt three phase plant power from source 10 to 300 volt DC. Inverter 24 converts the output of rectifier 22 to high frequency 300 volt pulses in the range 100 kHz to 200 kHz. The frequency and the on period of inverter 24 are controlled by the HV power supply control board 21 in order to provide course regulation of the ultimate output pulse energy of the system. The output of inverter 24 is stepped up to about 1200 volts in step-up transformer 26. The output of transformer 26 is converted to 1200 volts DC by rectifier 28 which includes a standard bridge rectifier circuit 30 and a filter capacitor 32. DC electrical energy from circuit 30 charges 8.1 $\mu$F $C_o$ charging capacitor 42 in commutator module 40 as directed by HV power supply control board 21 which controls the operation of inverter 24 as shown in FIG. 8A. Set points within HV power supply control board 21 are set by laser system control board 100.

The reader should note that in this embodiment as shown in FIG. 8A that pulse energy control for the laser system is provided by power supply module 20. The electrical circuits in commutator 40 and compression head 60 merely serve to utilize the electrical energy stored on charging capacitor 42 by power supply module 20 to form at the rate of 2,000 to 4,000 times per second or greater an electrical pulse, to amplify the pulse voltage and to compress in time the duration of the pulse. As an example of this control, FIG. 8A indicates that processor 102 in control board 100 has controlled the power supply to provide precisely 700 volts to charging capacitor 42 which during the charging cycle is isolated from the down stream circuits by solid state switch 46. The electrical circuits in commutator 40 and compression head 60 will upon the closure of switch 46 very quickly and automatically convert the electrical energy stored on capacitor 42 into the precise electrical discharge pulse across electrodes 83 and 84 needed to provide the next laser pulse at the precise energy needed as determined by processor 102 in control board 100.

Commutator Module

Commutator module 40 comprises $C_o$ charging capacitor 42, which in this embodiment is a bank of capacitors connected in parallel to provide a total capacitance of 8.1 $\mu$F. Voltage divider 44 provides a feedback voltage signal to the HV power supply control board 21 which is used by control board 21 to limit the charging of capacitor 42 to the voltage (called the "control voltage") which when formed into an electrical pulse and compressed and amplified in commutator 40 and compression head 60 will produce the desired discharge voltage on peaking capacitor 82 and across electrodes 83 and 84.

In order to provide electrical pulses in the range of about 3 Joules and 16,000 volts at a pulse rate of 2000 Hz pulses per second), about 250 microseconds are required for power supply 20 to charge the charging capacitor 42 to 800 volts. To achieve faster charging times two or more power supplies 20 can be stacked. Two stacked power supplies reduce the charging times to about 150 microseconds. For much faster charging times, a resonance charging system described below can be utilized. Therefore, charging capacitor 42 is fully charged and stable at the desired voltage when a signal from commutator control board 41 closes solid state switch 44 which initiates the very fast step of converting the 3 Joules of electrical energy stored on charging capacitor $C_o$ into a 16,000 volt discharge across electrodes 83 and 84. For this embodiment, solid state switch 46 is a IGBT switch, although other switch technologies such as SCRs, GTOs, MCTs, etc. could also be used. A 600 nH charging inductor 48 is in series with solid state switch 46 to temporarily limit the current through switch 46 while it closes to discharge the $C_o$ charging capacitor 42.

Pulse Generation Stage

The first stage of high voltage pulse power production is the pulse generation stage 50. To generate the pulse the charge on charging capacitor 42 is switched onto $C_1$ 8.5 $\mu$F capacitor 52 in about 5 $\mu$s as shown on FIG. 8F2 by closing IGBT switch 46.

First Stage of Compression

A saturable inductor 54 initially holds off the voltage stored on capacitor 52 and then becomes saturated allowing the transfer of charge from capacitor 52 through 1:23 step up pulse transformer 56 to $C_{p-1}$ capacitor 62 in a transfer time period of about 550 ns for a first stage of compression.

The design of pulse transformer 56 is described below. The pulse transformer is extremely efficient transforming a 700 volt 17,500 ampere 550 ns pulse rate into a 16,100 volt, 760 ampere 550 ns pulse which is stored very temporarily on $C_{p-1}$ capacitor bank 62 in compression head module 60.

Compression Head Module

Compression head module 60 further compresses the pulse.

Second Stage of Compression

An $L_{p-1}$ saturable inductor 64 (with about 125 nH saturated inductance) holds off the voltage on 16.5 nF $C_{p-1}$ capacitor bank 62 for approximately 550 ns then allows the charge on $C_{p-1}$ to flow (in about 100 ns) onto 16.5 nF Cp peaking capacitor 82 located on the top of laser chamber 80 and which is electrically connected in parallel with electrodes 83 and 84 and preionizer 56A. This transformation of a 550 ns long pulse into a 100 ns long pulse to charge Cp peaking capacitor 82 makes up the second and last stage of compression as indicated at 65 on FIG. 8A.

Laser Chamber Module

About 100 ns after the charge begins flowing onto peaking capacitor 82 mounted on top of and as a part of the laser chamber module 80, the voltage on peaking capacitor 82 has reached about 14,000 volts and discharge between the electrodes begins. The discharge lasts about 50 ns during which time lasing occurs within the optical resonance chamber of the excimer laser. The optical resonance chamber described in detail below is defined by a line narrowing package 86 comprised in this example by a 3-prism beam expander, a tuning mirror and an eschelle grating and an output coupler 88. The laser pulse for this laser is a narrow band, 20 to 50 ns, 193 nm pulse of about 5 mJ and the repetition rate is 1000 pulses per second. The pulses define a laser beam 90 and the pulses of the beam are monitored by photodiode 92, all as shown in FIG. 8A.

Control of Pulse Energy

The signal from photodiode 94 is transmitted to processor 102 in control board 100 and the processor uses this energy signal and preferably other historical pulse energy data (as discussed below in the section entitled Pulse Energy Control Algorithm) to set the command voltage for the next and/or future pulses. In a preferred embodiment in which the laser operates in a series of short bursts (such as 100 pulse 0.5 second bursts at 1000 Hz separated by a dead time of about 0.1 second) processor 102 in control board 100 is programmed with a special algorithm which uses the most recent pulse energy signal along with the energy signal of all previous pulses in the burst along with other historical pulse profile data to select a control voltage for the subsequent pulse so as to minimize pulse-to-pulse energy variations and also to minimize burst-to-burst energy variations. This calculation is performed by processor 102 in control board 100 using this algorithm during a period of about 35 $\mu$s. The laser pulses occurs about 5 $\mu$s following the $T_o$ firing of IGBT switch 46 shown on FIG. 8F3 and about 20 μs are required to collect the laser pulse energy data. (The start of the firing of switch 46 is called $T_o$.) Thus, a new control voltage value is thus ready (as shown on FIG. 8F1) about 70 microseconds after the firing of IGBT switch 46 for the previous pulse (at 2,000 Hz the firing period is 500 μs). The features of the energy control algorithm are described below and are described in greater detail in U.S. patent application Ser. No. 09/034,870 which is incorporated herein by reference.

Energy Recovery

This preferred embodiment is provided with electronic circuitry which recovers excess energy onto charging capacitor 42 from the previous pulse. This circuitry substantially reduces waste energy and virtually eliminates after ringing in the laser chamber 80.

The energy recovery circuit 57 is comprised of energy recovery inductor 58 and energy recovery diode 59, connected in series across Co charging capacitor 42 as shown in FIG. 8B. Because the impedance of the pulse power system is not exactly matched to that of the chamber and due to the fact that the chamber impedance varies several orders of magnitude during the pulse discharge, a negative going "reflection" is generated from the main pulse which propagates back from the chamber towards the front end of the pulse generating system. After the excess energy has propagated back through the compression head 60 and the commutator 40, switch 46 opens up due to the removal of the trigger signal by the controller. The energy recovery circuit 57 reverses the polarity of the reflection which has generated a negative voltage on the charging capacitor 42 through resonant free wheeling (a half cycle of ringing of the L-C circuit made up of the charging capacitor 42 and the energy recovery inductor 58) as clamped against reversal of current in inductor 58 by diode 59. The net result is that substantially all of the reflected energy from the chamber 80 is recovered from each pulse and stored on charging capacitor 42 as a positive charge ready to be utilized for the next pulse. FIG. 8F1, 2 and 3 are time line charts showing the charges on capacitor Co, $C_1$, $C_{p-1}$ and Cp. The charts show the process of energy recovery on Co.

Magnetic Switch Biasing

In order to completely utilize the full B-H curve swing of the magnetic materials used in the saturable inductors, a DC bias current is provided such that each inductor is reverse saturated at the time a pulse is initiated by the closing of switch 46.

In the case of the commutator saturable inductors 48 and 54, this is accomplished by providing a bias current flow of approximately 15A backwards (compared to the directional normal pulse current flow) through the inductors. This bias current is provided by bias current source 120 through isolation inductor LB1. Actual current flow travels from the power supply through the ground connection of the commutator, through the primary winding of the pulse transformer, through saturable inductor 54, through saturable inductor 48, and through isolation inductor LB1 back to the bias current source 120 as indicated by arrows B1.

In the case of compression head saturable inductor, a bias current B2 of approximate 5A is provided from the second bias current source 126 through isolation inductor LB2. At the compression head, the current splits and the majority B2-1 goes through saturable inductor Lp-1 64 and back through isolation inductor LB3 back to the second bias current source 126. A smaller fraction of the current B2-2 travels back through the HV cable connecting the compression head 60 and the commutator 40, through the pulse transformer secondary winding to ground, and through a biasing resistor back to the second bias current source 126. This second smaller current is used to bias the pulse transformer so that it is also reset for the pulsed operation. The mount of current which splits into each of the two legs is determined by the resistance in each path and is intentionally adjusted such that each path receives the correct amount of bias current.

Direction of Current Flow

In this embodiment, we refer to the flow of pulse energy through the system from a standard three-phase power source 10 to the electrodes and to ground beyond electrode 84 as "forward flow" and this direction as the forward direction. When we refer to an electrical component such as a saturable inductor as being forward conducting we mean that it is biased into saturation to conduct "pulse energy" in a direction toward the electrodes. When it is reverse conducting it is biased into saturation to conduct energy in a direction away from the electrodes toward the charging capacitor. The actual direction of current flow (or electron flow) through the system depends on where you are within the system. The direction of current flow is now explained to eliminate this as a possible source of confusion.

By reference to FIGS. 8A and 8B, in this preferred embodiment Co capacitor 42 is charged to (for example) a positive 700 volts such that when switch 46 is closed current flows from capacitor 42 through inductor 48 in a direction toward $C_1$ capacitor 52 (which means that electrons are actually flowing in the reverse direction). Similarly, the current flow is from $C_1$ capacitor 52 through the primary side of pulse transformer 56 toward ground. Thus, the direction of current and pulse energy is the same from charging capacitor 42 to pulse transformer 56. As explained below under the section entitled "Pulse Transformer" current flow in both the primary loops and the secondary loop of pulse transformer 56 is toward ground. The result is that current flow between pulse transformer 56 and the electrodes during the initial portion of the discharge (which represents the main portion [typically about 80 percent] of the discharge) is in the direction away from the electrodes toward transformer 56. Therefore, the direction of electron flow during the main discharge is from ground through the secondary of pulse transformer 56 temporarily onto $C_{p-1}$ capacitor 62 through inductor 64, temporarily onto Cp capacitor 82, through inductor 81, through electrode 84 (which is referred to as the discharge cathode) through the discharge plasma, through electrode 83 and back to ground. Thus, between pulse transformer 56 and the electrodes 84 and 83 during the main discharge electrons flow in the same direction as the pulse energy. Immediately following the main portion of the discharge, currents and electron flow are reversed and the reverse electron flow is from ground up through the grounded electrode 84, though the discharge space between the electrodes to electrode 83 and back through the circuit through transformer 56 to ground. The passage of reverse electron flow through transformer 56 produces a current in the "primary" loops of transformer 56 with electron flow from ground through the "primary" side of pulse transformer 56 (the same direction as the current flow of the main pulse) to ultimately charge Co negative as indicated qualitatively in FIG. 8F2. The negative charge on Co is reversed as shown in FIG. 8F2 and explained above in the section entitled Energy Recovery.

DETAILED DESCRIPTION OF PULSE POWER COMPONENTS

Power Supply

Figure 8C:
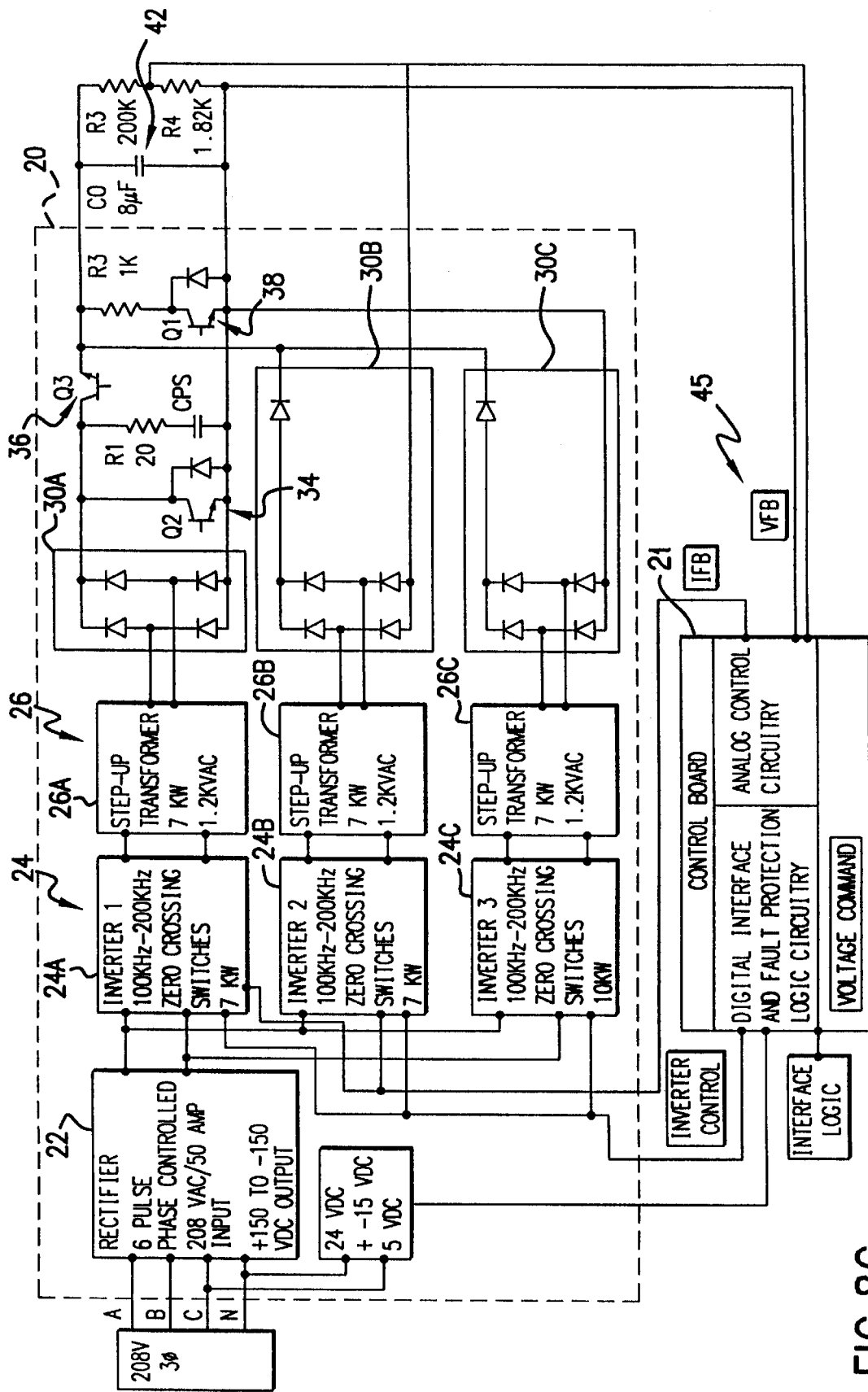
FIG. 8C is a combination block diagram, circuit diagram of a high voltage power supply which is part of the above preferred embodiment.

A more detailed circuit diagram of the power supply portion of the preferred embodiment is shown in FIG. 8C. As indicated in FIG. 8C, rectifier 22 is a 6 pulse phase controlled rectifier with a plus 150 v to −150V DC output. Inverter 24 is actually three invertors 24A, 24B and 24C. Invertors 24B and 24C are turned off when the voltage on 8.1 µF Co charging capacitor 42 is 50 volts less than the command voltage and inverter 24A is turned off when the voltage on Co 42 slightly exceeds the command voltage. This procedure reduces the charge rate near the end of the charge. Step up transformers 26A, 26B and 26C are each rated at 7 kw and transform the voltage to 1200 volt AC.

Three bridge rectifier circuits 30A, 30B and 30C are shown. The HV power supply control board 21 converts a 12 bit digital command to an analog signal and compares it with a feedback signal 45 from Co voltage monitor 44. When the feedback voltage exceeds the command voltage, inverter 24A is turned off as discussed above, Q2 switch 34 closes to dissipate stored energy within the supply, Q3 isolation switch 36 opens to prevent any additional energy leaving the supply and Q1 bleed switch 38 closes to bleed down the voltage on Co 42 until the voltage on Co equals the command voltage. At that time Q1 opens.

Commutator and Compression Head

The principal components of commutator 40 and compression head 60 are shown on FIGS. 8A and 8B and are discussed above with regard to the operation of the system. In this section, we describe details of fabrication of the commutator.

Solid State Switch

In this preferred embodiment solid state switch 46 is an P/N CM 1000 HA-28H IGBT switch provided by Powerex, Inc. with offices in Youngwood, Pa.

Inductors

Inductors 48, 54 and 64 comprise saturable inductors similar to those described in U.S. Pat. Nos. 5,448,580 and 5,315,611. A top and section view of a preferred saturable inductor design is shown respectively in FIGS. 8G1 and 8G2. In the inductors of this embodiment, flux excluding metal pieces such as 301, 302, 303 and 304 are added as shown in FIG. 8G2 in order to reduce the leakage flux in the inductors. The current input to this inductor is a screw connection at 305 to a bus also connected to capacitor 62. The current makes four and one half loops through vertical conductors. From location 305 the current travels down a large diameter conductor in the center labeled 1A, up six smaller conductors on the circumference labeled 1B, down 2A, up 2B, down all of the flux excluder elements, up 3B, down 3A, up 4B and down 4A, and the current exits at location 306. Where a pot like housing 64A serves as a high voltage current lead. The "lid" 64B of the saturable inductor is comprised of an electrical insulator material such as teflon. In prior art pulse power systems, oil leakage from oil insulated electrical components has been a problem. In this preferred embodiment, oil insulated components are limited to the saturable inductors and the oil is contained in the pot-like oil containing metal housing 64A which is, as stated above, the high voltage connection output lead. All seal connections are located above the oil level to substantially eliminate the possibility of oil leakage. For example, the lowest seal in inductor 64 is shown at 308 in FIG. 8G2. Since the flux excluding metal components are in the middle of the current path through the inductor, the voltage allowing a reduction in the safe hold-off spacing between the flux exclusion metal parts and the metal rods of the other turns. Fins 307 are provided to increase heat removal.

Capacitors

Capacitor banks 42, 52 and 62 are all comprised of banks of commercially available off-the-shelf capacitors connected in parallel. These capacitors are available from suppliers such as Murata with offices in Smyrna, Ga. Applicants preferred method of connecting the capacitors and inductors is to solder or bolt them to positive and negative terminals on special printed circuit board having heavy nickel coated copper leads in a manner similar to that described ins U.S. Pat. No. 5,448,580.

Pulse Transformer

Figure 8D:
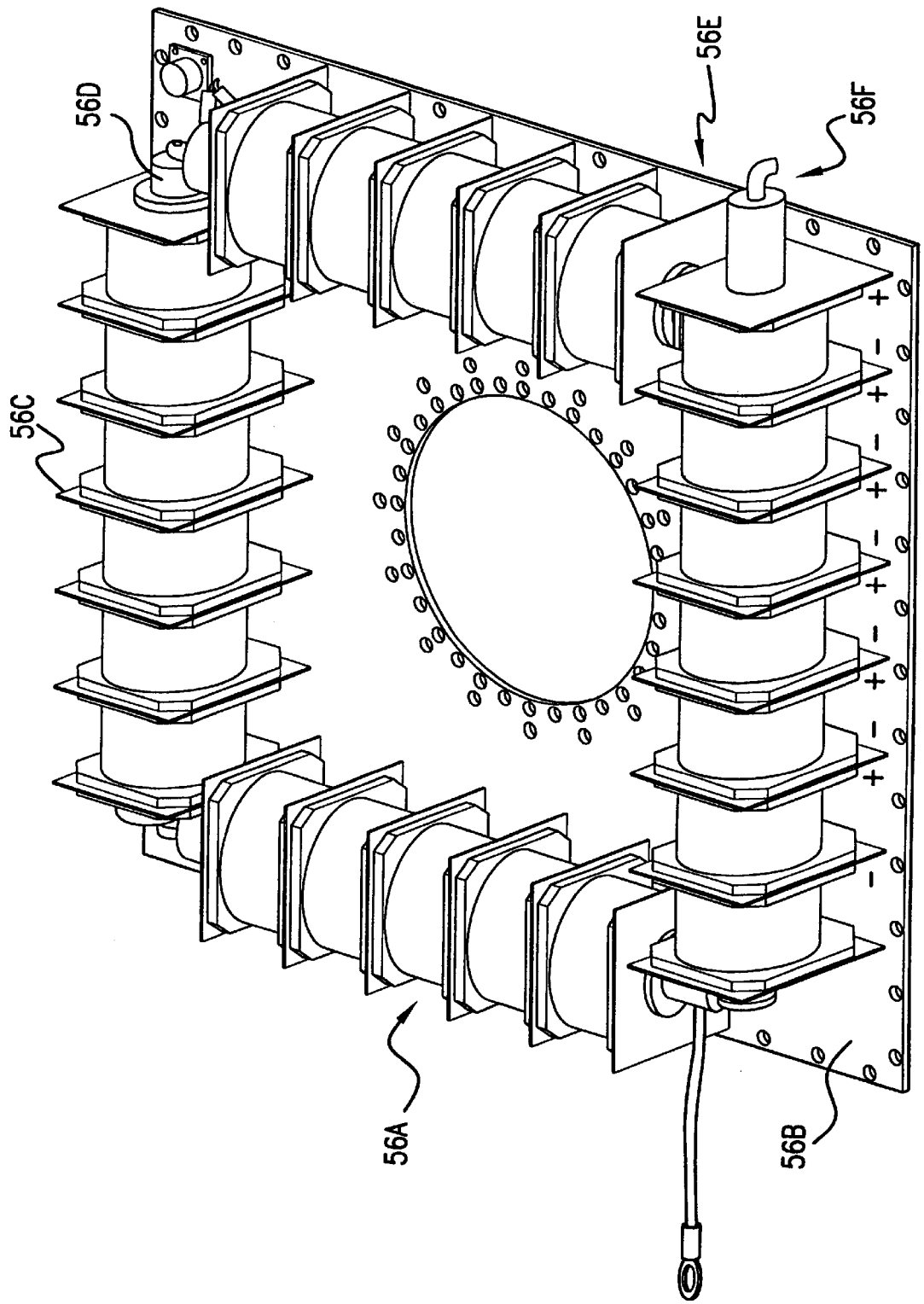
FIG. 8D is a prospective assembly drawing of a pulse transformer used in the above preferred embodiment.
Figure 8E:
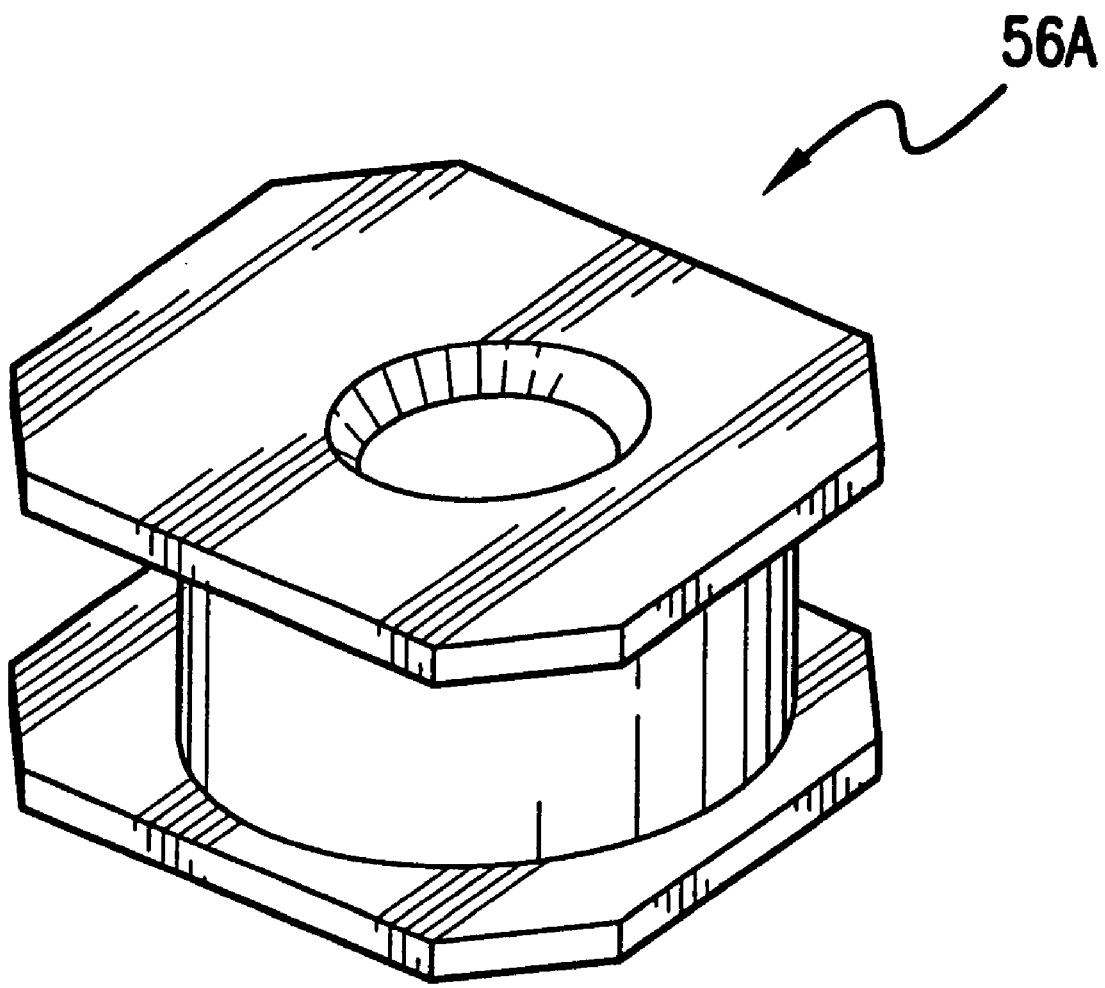
FIG. 8E is a drawing of a primary winding of a pulse transformer used in the above preferred embodiment.

Pulse transformer 56 is also similar to the pulse transformer described in U.S. Pat. Nos. 5,448,580 and 5,313,481; however, the pulse transformers of the present embodiment has only a single turn in the secondary winding and 23 separate primary windings. A drawing of pulse transformer 56 is shown in FIG. 8D. Each of the 23 primary windings comprise an aluminum spool 56A having two flanges (each with a flat edge with threaded bolt holes) which are bolted to positive and negative terminals on printed circuit board 56B as shown along the bottom edge of FIG. 8D. Insulators 56C separates the positive terminal of each spool from the negative terminal of the adjacent spool. Between the flanges of the spool is a hollow cylinder 1¹⁄₁₆ inches long with a 0.875 OD with a wall thickness of about ¹⁄₃₂ inch. The spool is wrapped with one inch wide, 0.7 mil thick Metglas™ 2605 S3A and a 0.1 mil thick mylar film until the OD of the insulated Metglas™ wrapping is 2.24 inches. A prospective view of a single wrapped spool forming one primary winding is shown in FIG. 8E.

The secondary of the transformer is a single stainless steel rod mounted within a tight fitting insulating tube of electrical glass. The winding is in four sections as shown in FIG. 8D. The stainless steel secondary shown as 56D in FIG. 8D is grounded to a ground lead on printed circuit board 56B at 56E and the high voltage terminal is shown at 56F. As indicated above, a 700 volt pulse between the + and − terminals of the primary windings will produce a minus 16,100 volt pulse at terminal 56F on the secondary side for a 1 to 23 voltage transformation. This design provides very low leakage inductance permitting extremely fast output rise time.

Laser Chamber Pulse Power Components

The Cp capacitor 82 is comprised of a bank of twenty-eight 0.59 nf capacitors mounted on top of the laser chamber pressure vessel. The electrodes 83 and 84 are each solid brass bars about 28 inches long which are separated by about 0.5 to 1.0 inch. In this embodiment, the top electrode 83 is the cathode and the bottom electrode 84 is connected to ground as indicated in FIG. 8A.

Compression Head Mounting

This preferred embodiment of the present invention includes a compression head mounting technique shown in FIGS. 8H1 and 8H2. FIG. 8H1 is a side section view of the laser system showing the location of the compressor head module 60 in relation to electrodes 83 and 84. This technique was designed to minimize the impedance associated with the compression lead chamber connection and at the same time facilitates quick replacement of the compression head. As shown in FIGS. 8H1 and 8H2 the ground connection is made with an approximately 28 inch long slot tab connection along the back side of the compression head as shown at 81A in FIG. 8H1 and 81B in FIG. 8H2. The bottom of the slot tab is fitted with flexible finger stock 81C. A preferred finger stock material is sold under the trade name Multilam®.

The high voltage connection is made between a six-inch diameter smooth bottom of saturable inductor 64 and a mating array of flexible finger stock at 89 in FIG. 8H1. As above, a preferred finger stock material is Multilam®. This arrangement permits the replacement of the compression head module for repair or preventative maintenance in about five minutes.

Resonant Charging

In a preferred embodiment of the present invention, the power supply module described for the first preferred embodiment which utilizes two rectifiers, an inverter and a transformer as shown in FIGS. 8A and 8B; is replaced by an off-the-shelf power supply and a resonance charging circuit. This latter approach provides much faster charging of the charging capacitor.

First Resonant Charger

Figure 16A:
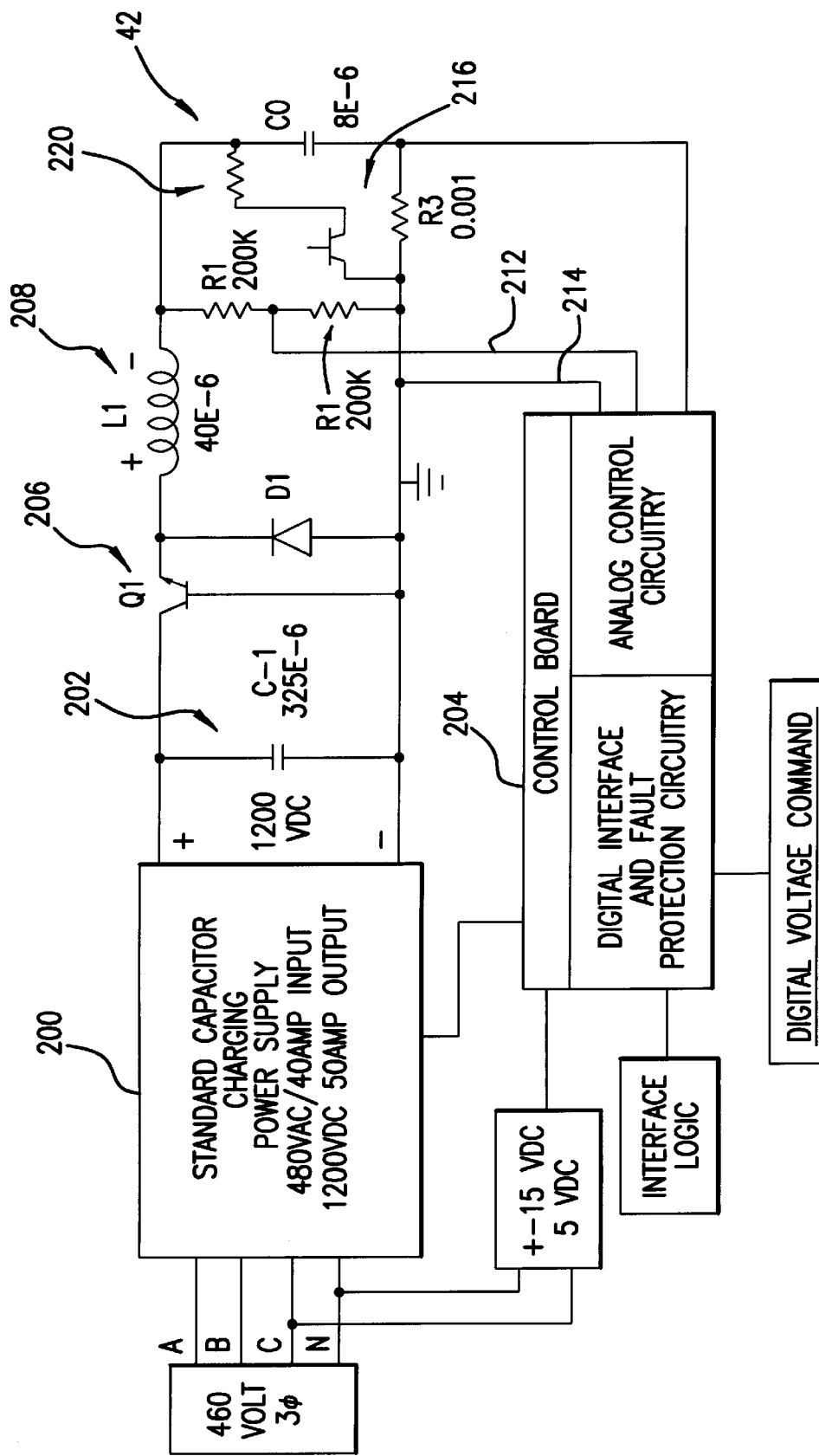
FIGS. 16A and 16B SHOW ALTERNATIVE POWER SUPPLY CIRCUITS.

An electrical circuit showing this preferred embodiment is shown in FIG. 16. In this case, a standard capacitor charging power supply 200 having a 480 VAC/40 amp input and a 1200 VDC 50 amp output is used. Such power supplies are available from suppliers such as Ecgar, Maxwell, Kaiser and Ale. This power supply continuously charges a 325 μF capacitor 202 to the voltage level commanded by the control board 204. The control board 204 also commands IGBT switch 206 closed and open to transfer energy from capacitor 202 to capacitor 42. Inductor 208 sets up the transfer time constant in conjunction with capacitor 202 and 42. Control board 202 receives a voltage feedback 212 that is proportional to the voltage on capacitor 42 and a current feedback 214 that is proportional to the current flowing through inductor 208. From these two feedback signals control board 204 can calculate in real time the final voltage on capacitor 42 should IGBT switch 206 open at that instant of time. Therefore with a command voltage 210 fed into control board 204 a precise calculation can be made of the stored energy within capacitor 42 and inductor 208 to compare to the required charge voltage commanded 210. From this calculation, the control board 204 will determine the exact time in the charge cycle to open IGBT switch 206.

After IGBT switch 206 opens the energy stored in the magnetic field of inductor 208 will transfer to capacitor 42 through the diode path 216. The accuracy of the real time energy calculation will determine the amount of fluctuation dither that will exist on the final voltage on capacitor 42. Due to the extreme charge rate of this system, too much dither will exist to meet a desired systems regulation need of ±0.05%. Therefore a bleed down circuit is included in this embodiment.

Bleed down circuit 216 will be commanded closed by the control board 204 when current flowing through inductor 208 stops. The time constant of capacitor 42 and resistor 220 should be sufficiently fast to bleed down capacitor 42 to the command voltage 210 without being an appreciable amount of the total charge cycle.

Second Resonant Charger

Figure 16B:
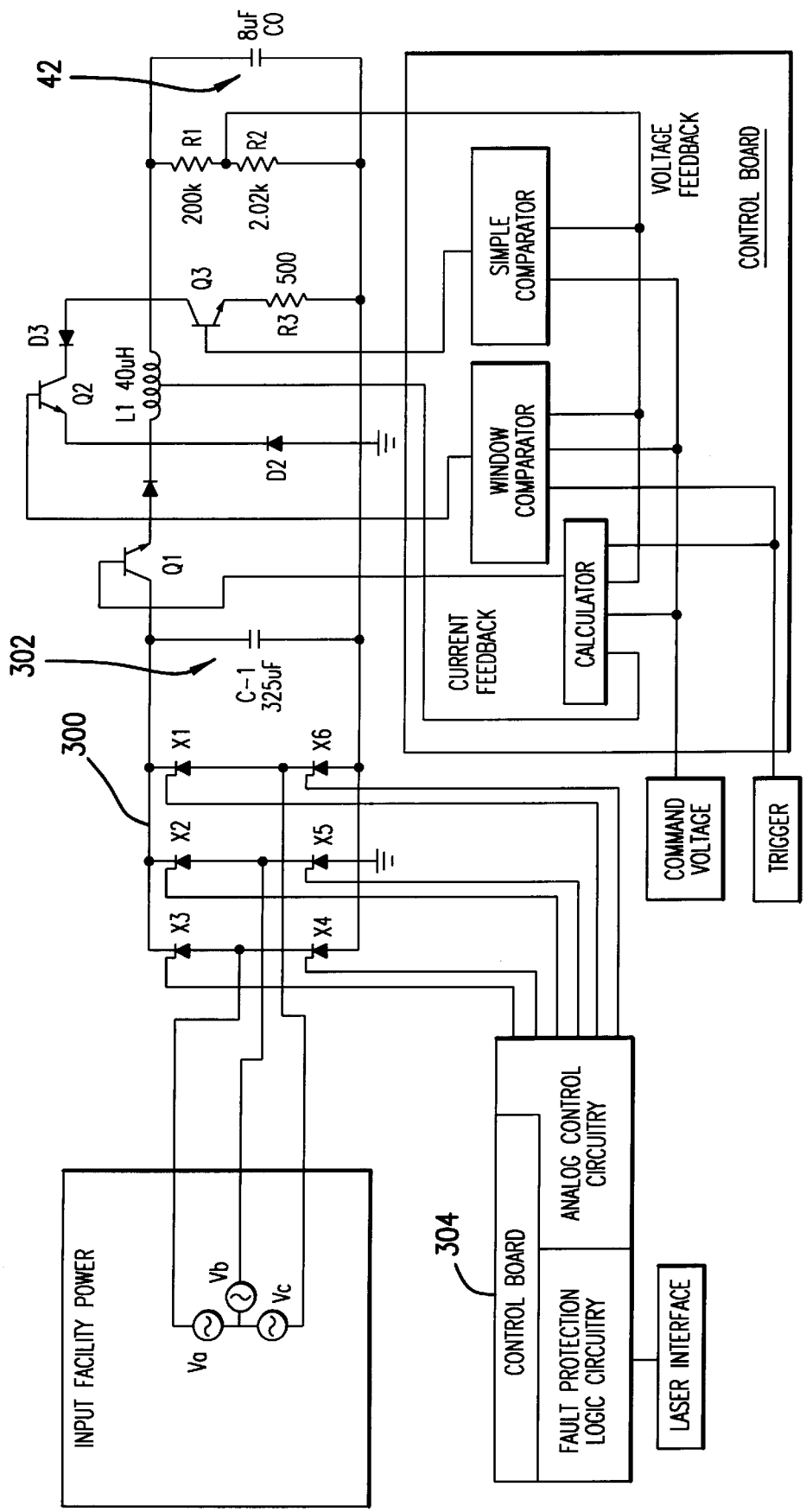

A second resonant charger system is shown in FIG. 16B. This circuit is similar to the one shown in FIG. 16A. The principal circuit elements are:

I1—A three-phase power supply 300 with a constant DC current output.

C-1—A source capacitor 302 that is an order of magnitude or more larger than the existing C0 capacitor 42.

Q1, Q2, and Q3—Switches to control current flow for charging and maintaining a regulated voltage on C0.

D1, D2, and D3—Provides current single direction flow.

R1, and R2—Provides voltage feedback to the control circuitry.

R3—Allows for rapid discharge of the voltage on C0 in the event of a small over charge.

L1—Resonant inductor between C-1 capacitor 302 and C0 capacitor 4-2 to limit current flow and setup charge transfer timing.

Control Board 304—Commands Q1, Q2, and Q3 open and closed based upon circuit feedback parameters.

The power supply is a fixed 700-volt power supply. The power supply is attached directly to C-1 eliminating the need for voltage feedback to the supply. When the supply is enabled it turns on and regulates a constant current output until the voltage on C-1 capacitor 302 is 700 volts, and then it turns off.

The performance of the system is independent of the voltage regulation on C-1 therefore only the most basic control loop is necessary in the power supply. Secondly the supply will be adding energy into the system whenever the voltage on C-1 falls below the 700-volt setting. This allows the power supply the entire time between laser pulse, (and even during laser pulses), to replenish energy transferred from C-1 to C0. This further reduces the power supply peak current requirements over the pulse power system described above. The power supply is only given a percentage of the total time between laser pulses to charge C0 to a desired voltage. The combination of requiring a supply with the most basic control loop, and minimizing the peak current rating of the supply to the average power requirements of the system reduces the power supply cost an estimated 50%. Additionally this preferred design provides vendor flexibility since constant current, fixed output voltage power supplies are readily available from multiple sources.

In order to utilize the most basic power supply available on the market, additional circuitry is added that is estimated at a small fraction of the total power supply savings. These additional components are outlined above with the exception of C0 which is a part of the commutator. An example of operation is as follows:

Prior to the need for a laser pulse the voltage on C-1 would be charged to 700 volts, switches Q1, and Q3 would be open, and Q2 would be closed. Upon command from the laser, Q1 would close and Q2 would open. At this time current would flow from C-1 to C0 through the charge inductor L1. On the control board would be a calculator that is evaluating the voltage on C0, and the current flowing in L1 relative to a command voltage set point from the laser. Q1 will open when the voltage on C0 plus the equivalent energy stored in inductor L1 equals the desired command voltage plus 100 volts. The calculation is:

$$V_f = [V_{C0s}^2 + ((L_1 * I_{11s}^2)/C_0)]^{0.5} + 100 \qquad (1)$$

Where:

$V_f$=The voltage on C0 after Q1 opens and the current in L1 goes to zero.

$V_{C0s}$=The voltage on $C_0$ when Q1 opens.

$I_{L1s}$=The current flowing through $L_1$ when Q1 opens.

The reason for adding 100 volts to the calculation is to ensure current is still flowing in L1 at the time the voltage on C0 equals the command voltage.

After Q1 opens the energy stored in L1 starts transferring to C0 through D2 until the voltage on C0 equals the command voltage. At this time Q2 closes and current stops flowing to C0 and is directed through D3 to produce a "flywheel current loop." A window comparitor is used to control the on off switching of Q2. Should the voltage on C0 drop below the command voltage less 0.5 volts then Q2 will open and charge current held in L1 will flow to C0 until the voltage on C0 equals the command voltage plus 0.5 volts.

Should for any reason the voltage on C0 exceed the command voltage plus 0.6 volts then Q3 will closed until the voltage on C0 drops to the command voltage plus 0.6 volts. This ensures the voltage regulation has a 0.6 volt variation worst case at the time the laser pulses.

With the above circuit, and a starting charge voltage on C-1 of 700 volts, the maximum first pulse voltage on C0 will be 1400 volts. For this embodiment, the maximum operating voltage will be 1200 volts. This allows the system to hold up to 200 volts of charge in L1 for reserve. This reserve can be incrementally pulsed onto C0 as needed due to leakage losses during the time after C0 equals the command voltage and the laser discharging C0.

Faster Pulse Rise Time

Figure 8I:
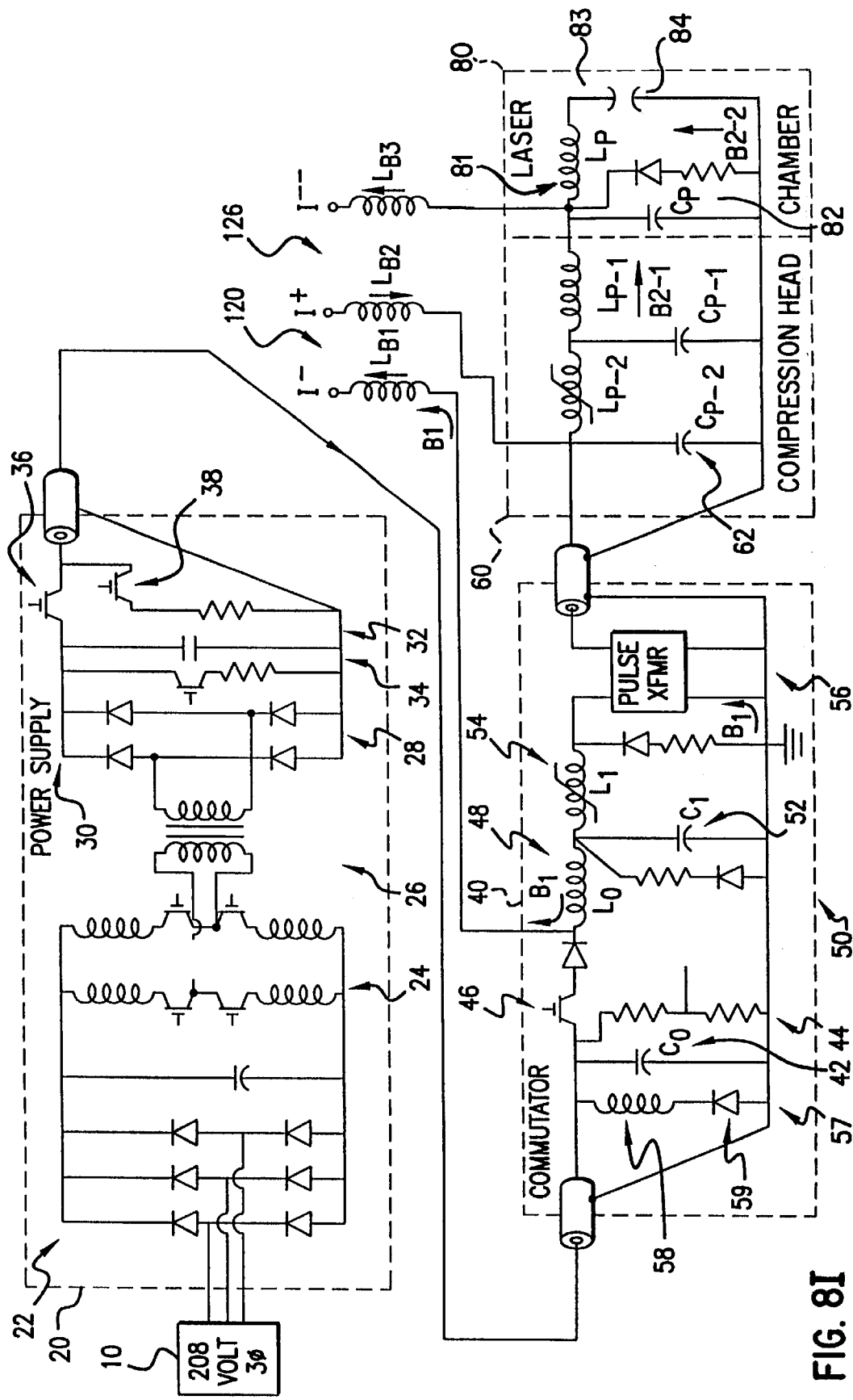
FIG. 8I shows a preferred modification to the FIG. 8B configuration.

FIG. 8I shows a modification to the pulse power system which was made by Applicants and their fellow workers to increase somewhat the pulse rise time on $C_p$ capacitor 82 and to improve efficiency of the system. This configuration adds a compression stage. The capacitance values of $C_{p-2}$ and $C_{p-1}$ are both 16 nF and the saturated inductance of $L_{p-2}$ is about 10 nH. The unsaturated inductance is very much larger (in the range of 10's of $\mu$H's). Test results of this modification are shown in FIG. 8I(1).

Resonance Cavity

In this preferred embodiment of the present invention the reflectivity of the output coupler has been approximately tripled from about 10% which was typical of prior art narrow-band excimer lasers to about 30%. This is to provide more feedback within the laser cavity to reduce the laser bandwidth and to improve laser efficiency.

Line Narrowing Module Improved Gratings

Figure 15B:
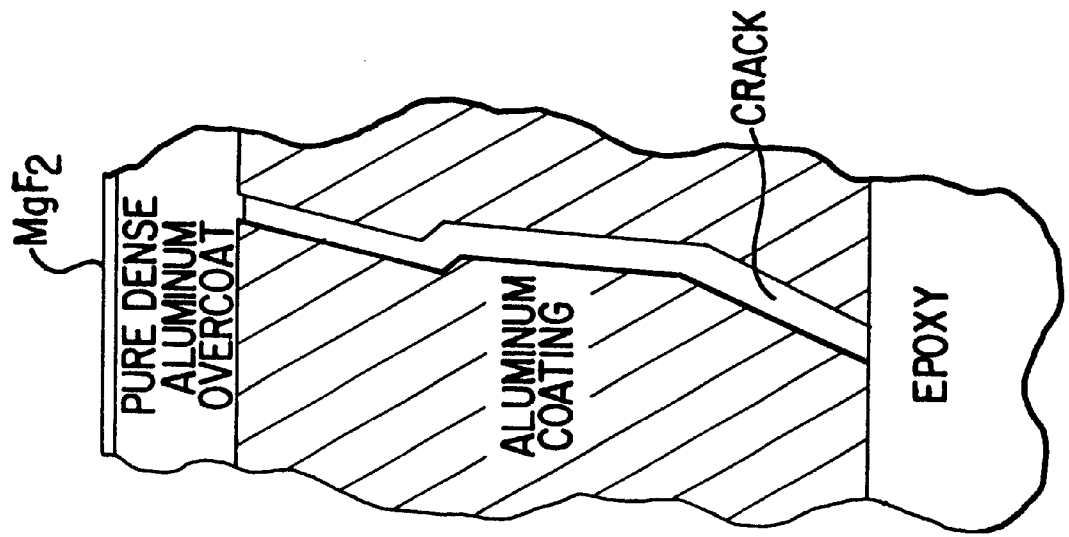
FIGS. 15A and 15B show grating cross section.
Figure 15A:
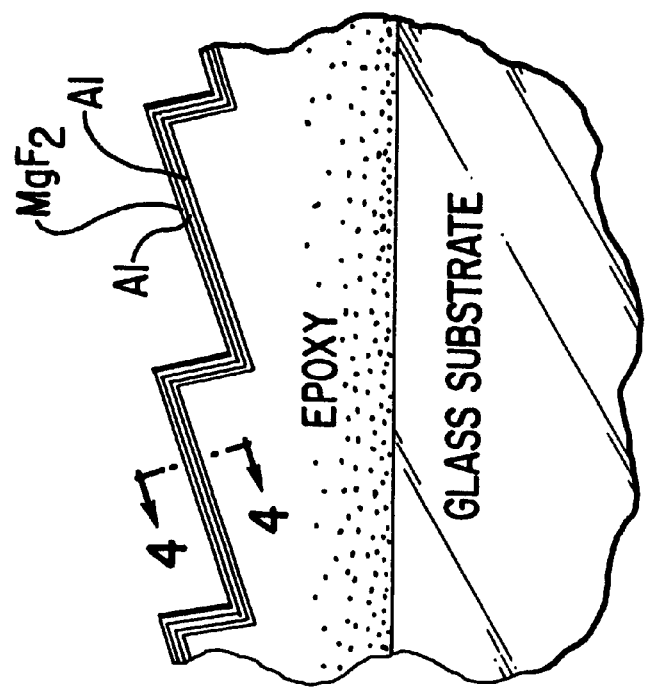

Applicants have developed a grating highly resistant to photon damage. A preferred method for fabricating this grating is described in detail in U.S. patent application Ser. No. 08/939,611, filed Sep. 29, 1997, which is incorporated herein by reference. The first steps in the fabrication of the gratings are similar to the well-known technique of making replica gratings from master or submaster gratings. This technique produces a grating having an epoxy substrate with a thin aluminum reflective coating, which may be cracked or has relatively thick grain boundaries containing oxides and hydroxides of aluminum and typically is also naturally coated with an aluminum oxide film. The grating is subsequently recoated in a vacuum chamber with a thin, pure, dense aluminum overcoat and then also in the vacuum the aluminum overcoat is coated with a thin film of $MgF_2$. The grating is especially suited for use for wavelength selection in an ArF laser operating producing an ultraviolet laser beam at a wavelength of about 193 nm. The oxygen free aluminum overcoat prevents the ultraviolet light from causing damage by stimulating chemical reactions in grating materials under the aluminum grating surface or in the aluminum oxide film. The MgF2 additionally prevents oxidation on the surface of the aluminum overcoat. A cross-sectional views of the grating are shown in FIGS. 15A and 15B.

Calcium Fluoride Beam Expanding Prisms

The increase in the reflection of the output coupler and the potential increase in the repetition rate had the effect of substantially increasing the light passing through the line-narrowing module. The additional heat generated by absorption of this additional illumination causes thermal distortion in prior art beam expanding fused silica prisms. To solve this problem prior art fused silica prisms were replaced with calcium fluoride prisms. The three beam expanding CaF prisms 437A, B and C are shown in FIG. 15A. Calcium fluoride has higher thermal conductivity and can handle the additional energy without unacceptable distortion.

Thermal lensing in CaF prisms is substantially lower than that for fused silica for two reasons. CaF prisms have thermal conductivity about 10 times that of fused silica and absorption at UV wavelength about one half that of fused silica. The advantages of CaF over fused silica have for some time been recognized by stepper makers but Applicants were to the best of their knowledge the first to apply the new high quality CaF technology to and the production use of CaF prism beam expanders.

Prism 437A is a 1-inch prism mounted with an angle of incidence of 74.0 degrees, prism 437B is a 1-inch prism mounted at 74.0 degrees, and prism 437C is a two inch prism mounted at 74.0 degrees. The magnification of the beam expansion system system is 21 and the dispersion of the line narrowing system is 1.09 mr/pm.

Improved Wavemeter

ArF Natural Spectrum

Figure 10:
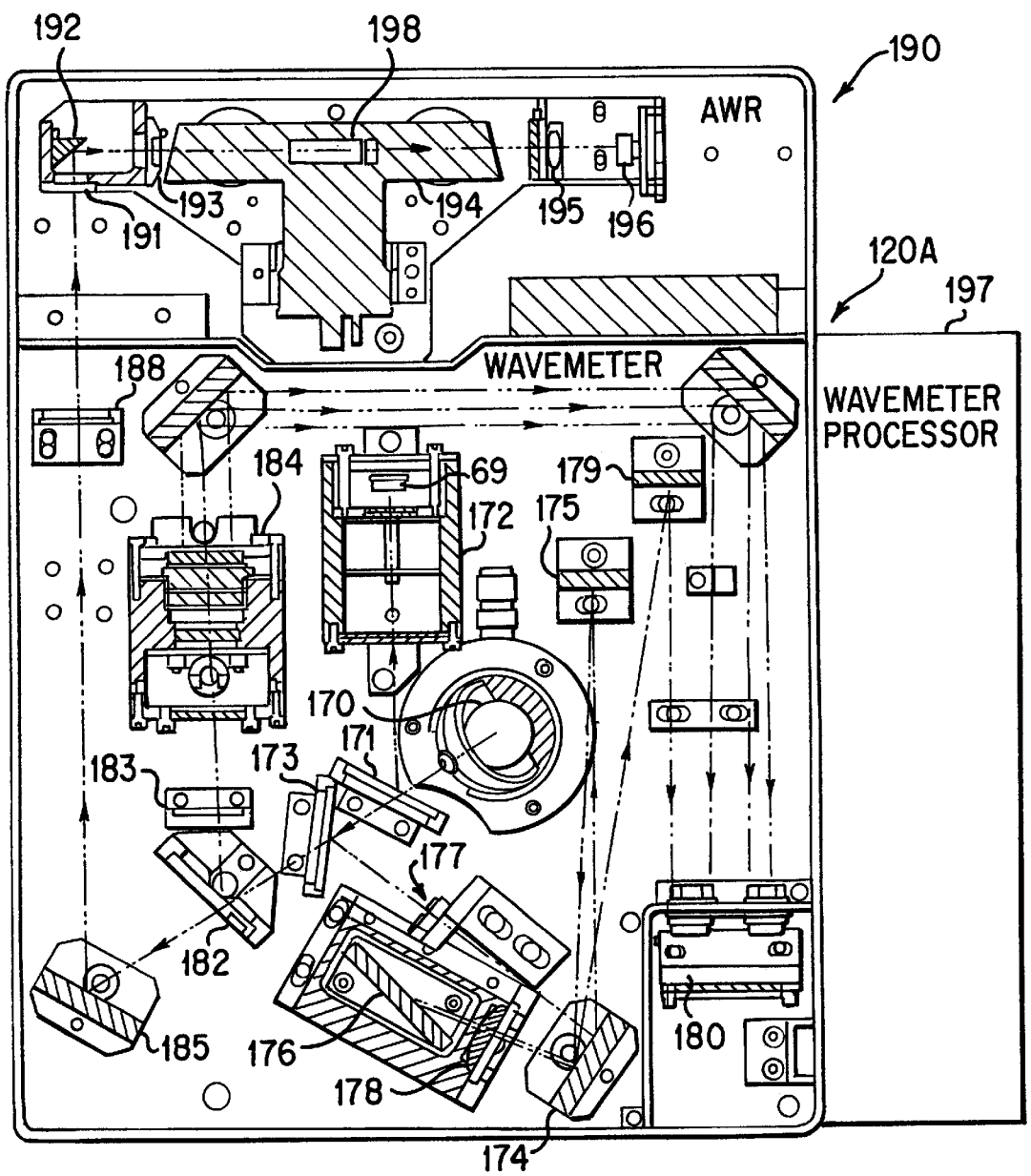
FIG. 10 is a drawing showing features of an improved wavemeter.
Figure 10A:
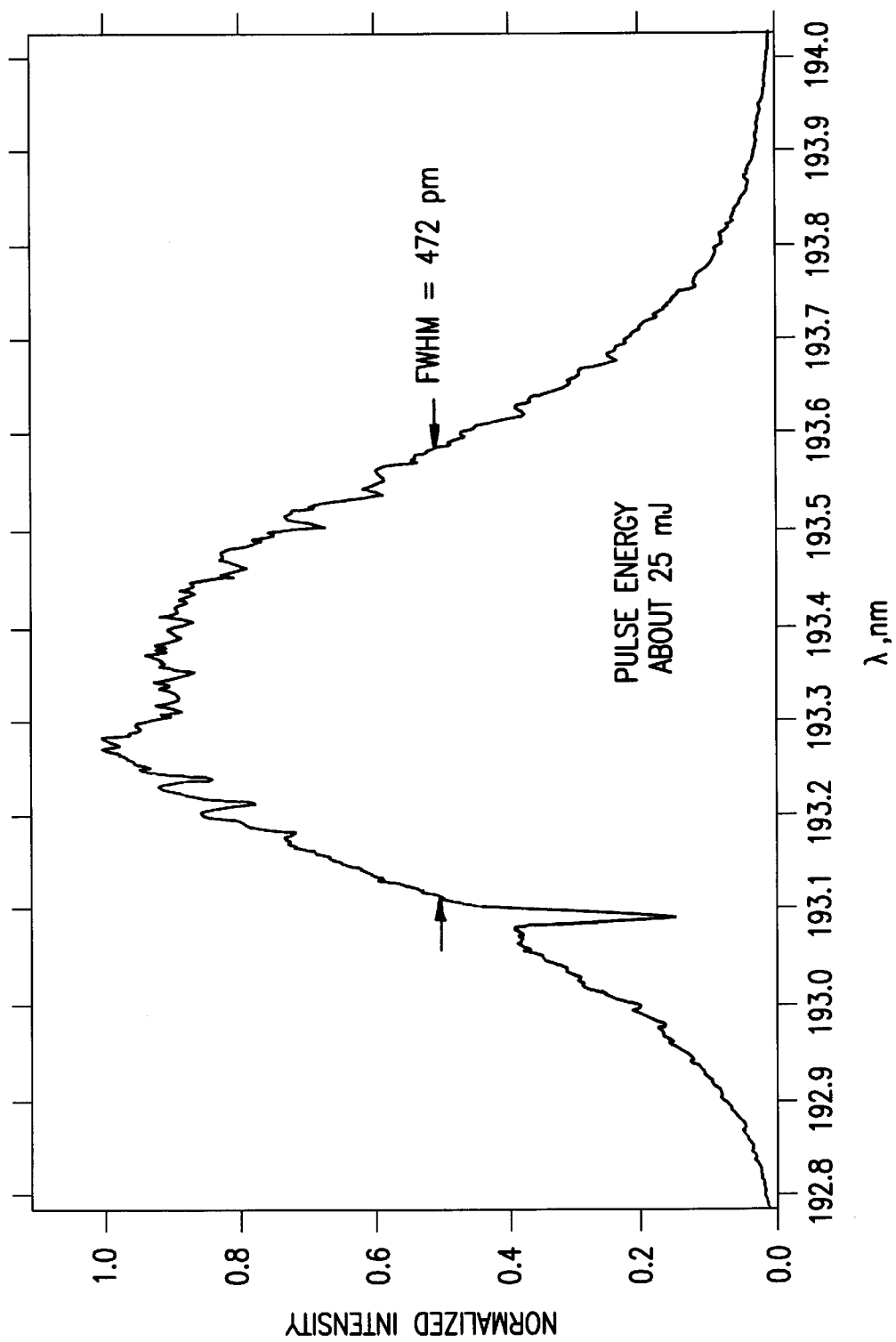
FIG. 10A is a graph of an ArF excimer laser broadband spectrum.

FIG. 10A shows the approximate natural broadband spectrum of a high pulse rate ArF excimer laser. As shown in FIG. 10A, the FWHM bandwidth is about 472 pm. This particular laser may be operated at a rate of up to 1000 Hz, and the typical pulse energy is about 25 mJ per pulse when operated broadband. This broadband spectrum is generally not useful for integrated circuit lithography which typically requires bandwidths of less than 1.0 pm.

ArF Narrowband Spectrum

Figure 10B:
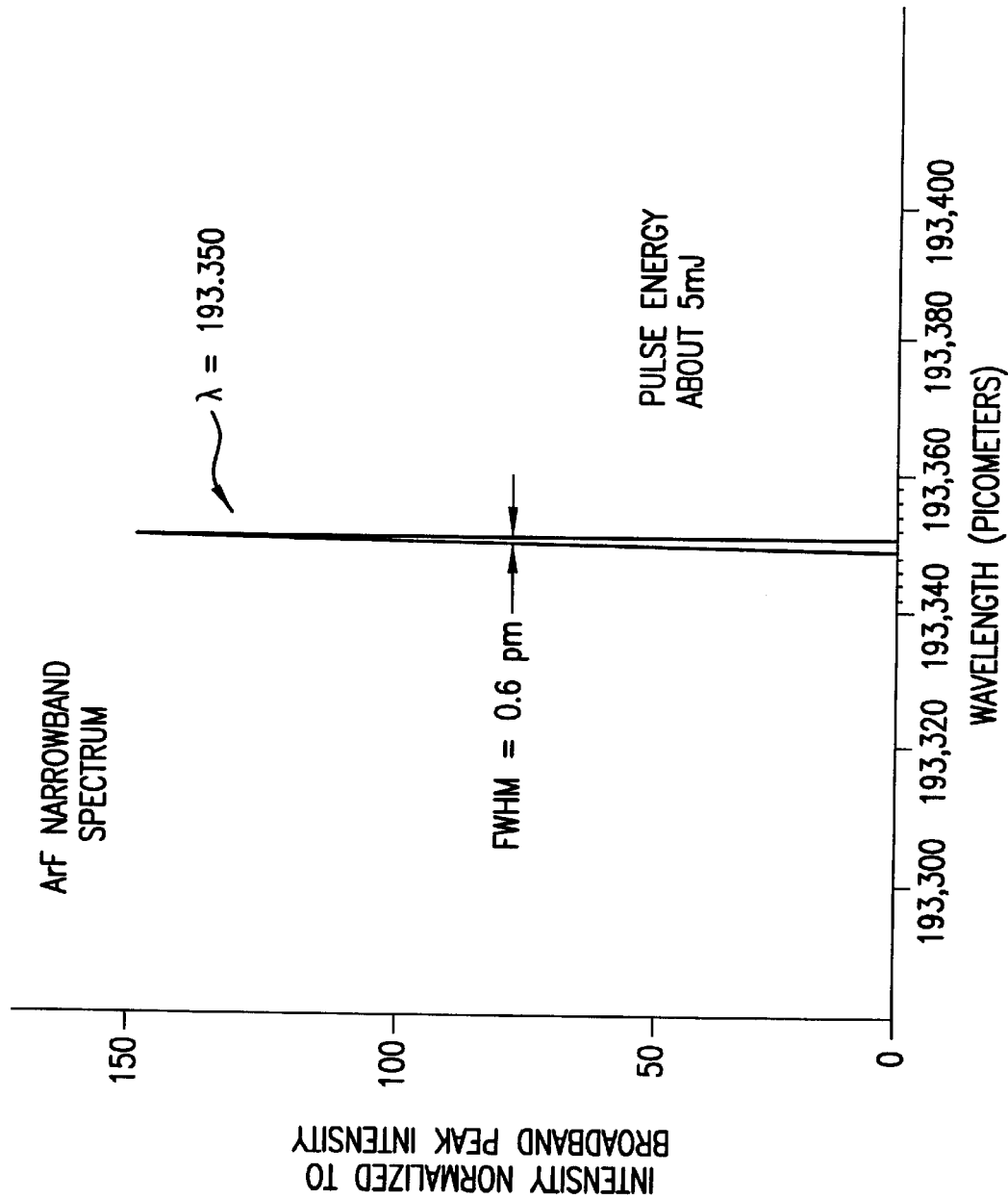
FIG. 10B is an ArF narrowband spectrum.

The laser may be narrow banded, using well known prior art techniques. Narrowbanding produces an output spectrum such as that shown in FIG. 10B. In this case the FWHM bandwidth is greatly reduced (by a factor of almost 800) to about 0.6 pm, and the pulse energy is reduced (by a factor of about 5) to about 5 mJ. As a result, the intensity of the pulse at the desired narrow band is very greatly increased as indicated in FIG. 10B.

Figure 10C:
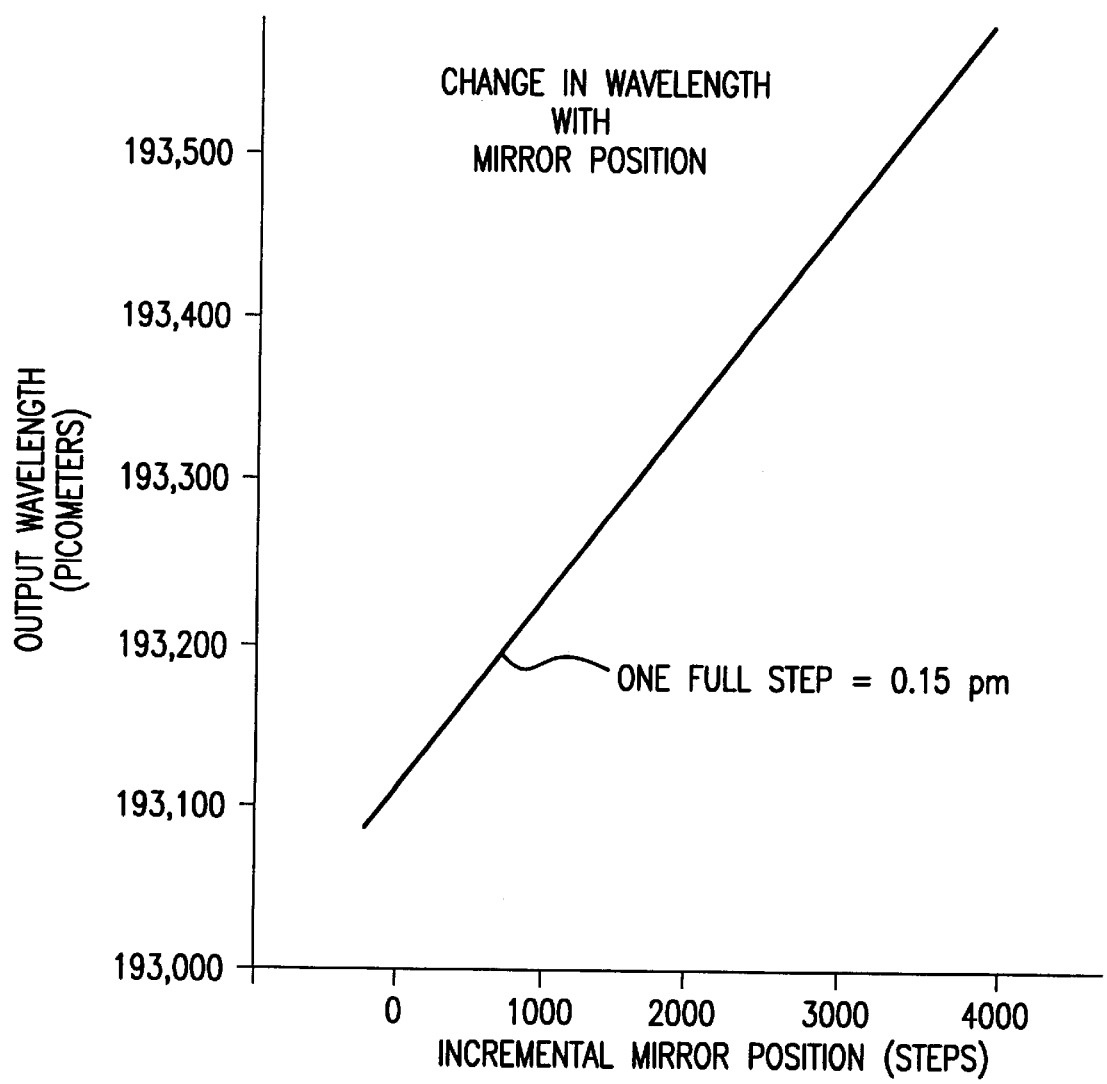
FIG. 10C shows the relationship between tuning mirror position and output wavelength for an ArF excimer laser.
Figure 10D:
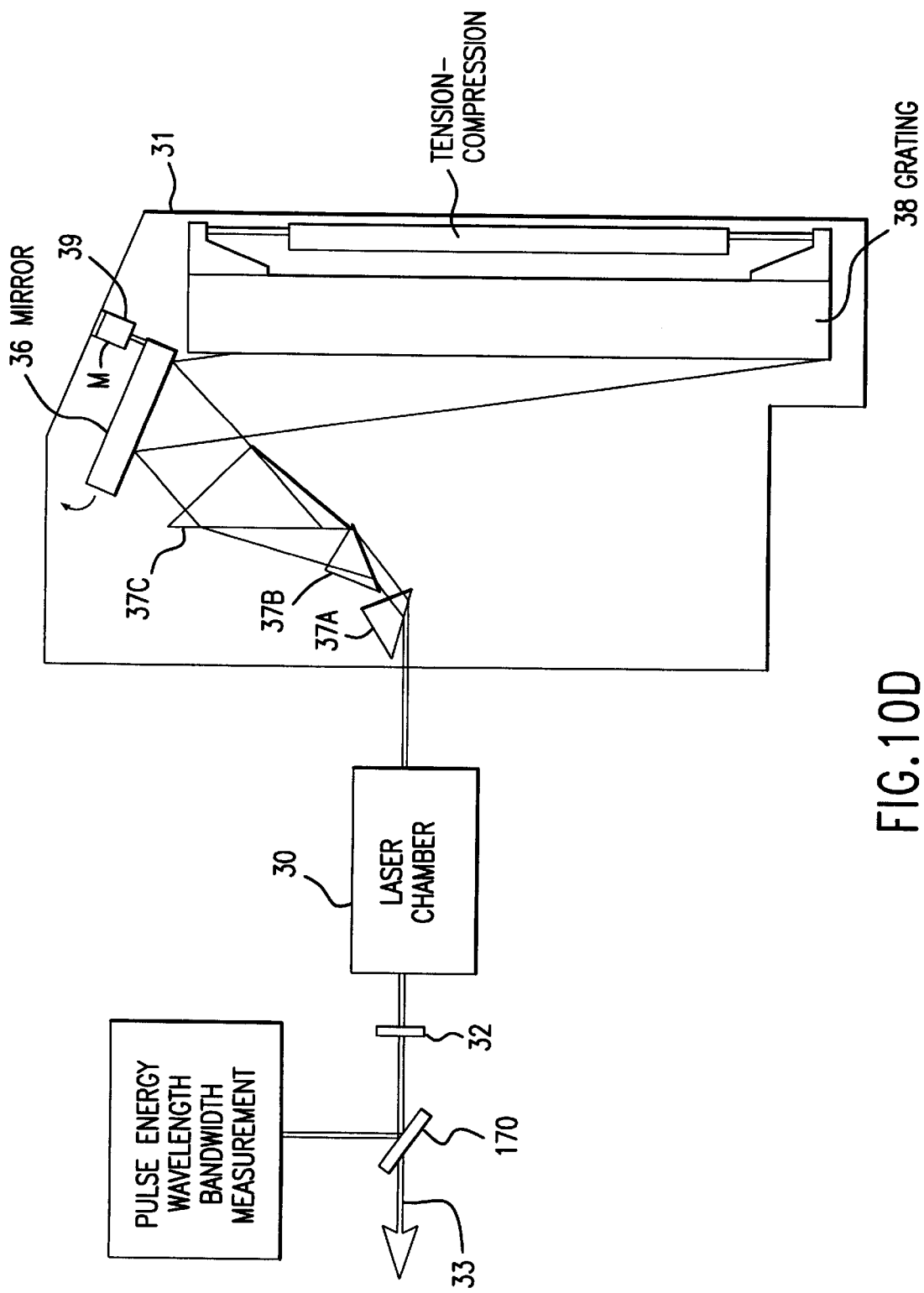
FIG. 10D is a block diagram showing the principal elements for controlling wavelength of an excimer laser.

As shown in FIG. 10D, the laser 30 may be tuned to operate at any wavelength within the ArF broadband spectrum using tuning mirror 36 in line-narrowing module 31. In a preferred embodiment, the laser is tuned by pivoting mirror 36 with stepper motor 39 so as to slightly change the angle at which the laser beam (expanded by prisms 37A, 37B and 37C) is incident on grating 38. The relationship between wavelength and mirror position as measured by steps of stepper motor 39 is shown in FIG. 10C where one full step of the stepper motor produces a change of about 0.15 pm in the nominal narrowband output center wavelength. The stepper motor scan of a few millimeters is sufficient to scan the output wavelength of laser 30 throughout 500 pm tuning range from about 193,100 pm to about 193,600 pm. Note that the relationship between mirror position and wavelength is not exactly linear, but in the narrow tuning range of this laser, a linear relationship can be assumed and in this preferred embodiment linearity is not required.

Measuring Beam Parameters

FIG. 10 shows the layouts of a preferred wavemeter unit 120A an absolute wavelength reference calibration unit 190, and a wavemeter processor 197.

The optical equipment in these units measure pulse energy, wavelength and bandwidth. These measurements are used with feedback circuits to maintain pulse energy and wavelength within desired limits. The equipment calibrates itself by reference to an atomic reference source on the command from the laser system control processor.

As shown in FIG. 10, the output beam from output coupler 32 (as shown in FIG. 10D) intersects partially reflecting mirror 170, which passes about 95.5% of the beam energy as output beam 33 and reflects about 4.5% for pulse energy, wavelength and bandwidth measurement.

Pulse Energy

About 4% of the reflected beam is reflected by mirror 171 to energy detector 172 which comprises a very fast photo diode 69 which is able to measure the energy of individual pulses occurring at the rate of 3000 per second. The pulse energy is about 3.32 mJ, and the output of detector 69 is fed to a computer controller which uses a special algorithm to adjust the laser charging voltage to precisely control the pulse energy of future pulses based on stored pulse energy data in order to limit the variation of the energy of individual pulses and the integrated energy of bursts of pulses.

Coarse Wavelength Measurement

About 4% of the beam which passes through mirror 171 is reflected by mirror 173 through slit 177 to mirror 174, to mirror 175, back to mirror 174 and onto echelle grating 176. The beam is collimated by lens 178 having a focal length of 458.4 mm. Light reflected from grating 176 passes back through lens 178, is reflected again from mirrors 174, 175 and 174 again, and then is reflected from mirror 179 and focused onto the left side of 1024-pixel linear photo diode array 180. The spatial position of the beam on the photo diode array is a coarse measure of the relative nominal wavelength of the output beam.

Linear Photo Diode Array

Figure 10E:
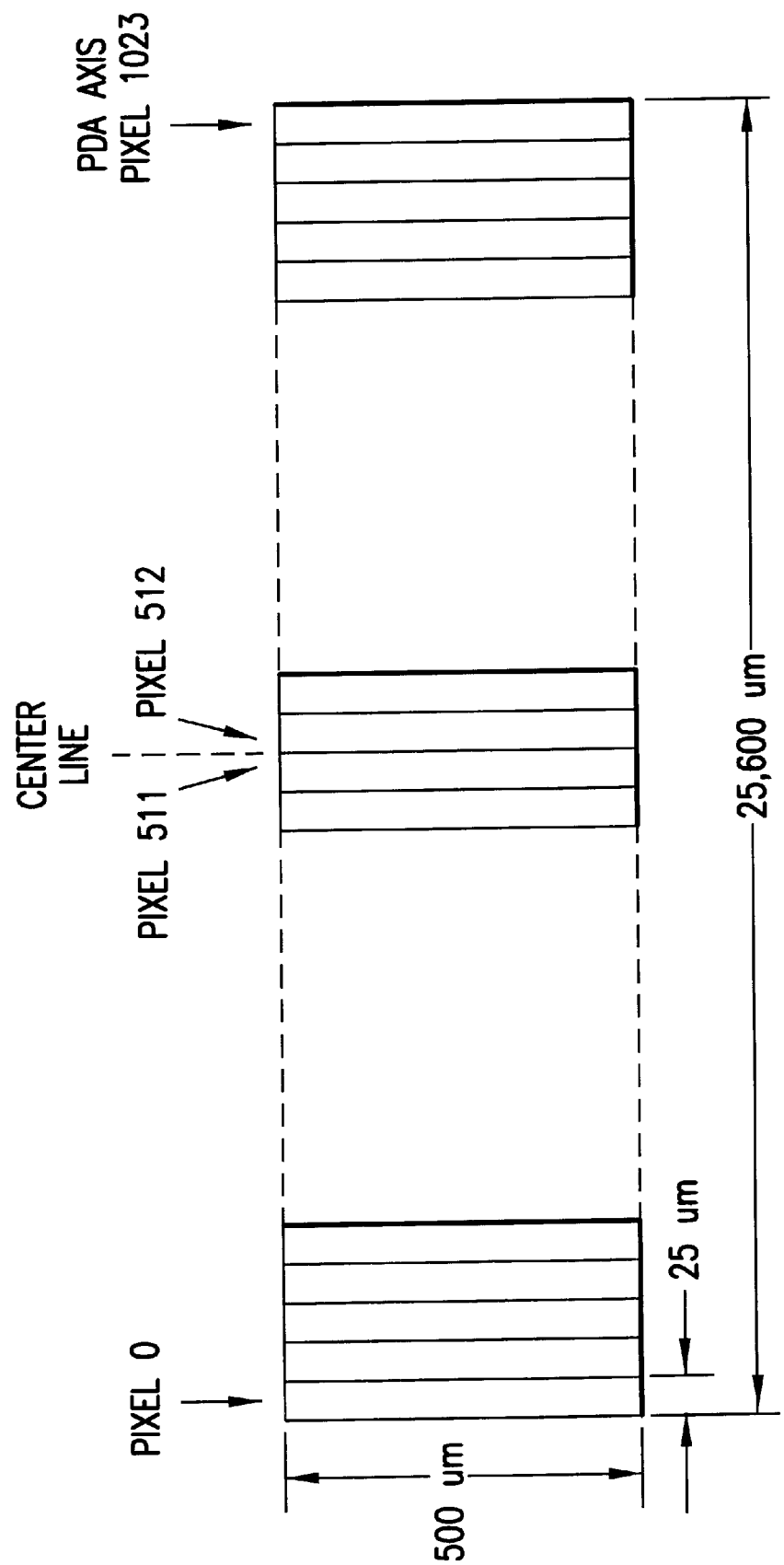
FIG. 10E depicts a 1024-pixel photo diode array.

Linear Photo diode array 180 is depicted in greater detail in FIG. 10E. The array is an integrated circuit chip comprising 1024 separate photo diode integrated circuits and an associated sample and hold readout circuit. The photo diodes are on a 25 micrometer pitch for a total length of 25.6 mm (about one inch). Each photo diode is 500 micrometer long. Photo diode arrays such as this are available from several sources. A preferred supplier is Hamamatsu. In our preferred embodiment, we use a Model S3903-1024 which can be read at the rate of $2 \times 10^6$ pixels/sec on a FIFO basis in which complete 1024 pixel scans can be read at rates of 2000 Hz or greater.

Calculation of Coarse Wavelength

The coarse wavelength optics in wavemeter module 120 produces a rectangular image of about 0.25 mm×3 mm on the left side of photo diode array 180. The ten or eleven illuminated photo diodes will generate signals in proportion to the intensity of the illumination received and the signals are read and digitized by a processor in wavemeter controller 197. Using this information and an interpolation algorithm controller 197 calculates the center position of the image.

This position (measured in pixels) is converted into a coarse wavelength value using two calibration coefficients and assuming a linear relationship between position and wavelength. These calibration coefficients are determined by reference to an atomic wavelength reference source as described below. For example, the relationship between image position and wavelength might be the following algorithm:

$$\lambda = (2.3 \text{ pm/pixel})P + 191,625 \text{ pm}$$

where P=coarse image central positions

Fine Wavelength Measurement

About 95% of the beam which passes through mirror 173 as shown in FIG. 10 is reflected off mirror 182 through lens 183 onto a diffuser at the input to etalon assembly 184. The beam exiting etalon 184 is focused by a 458.4 mm focal length lens in the etalon assembly and produces interference fringes on the middle and right side of linear photo diode array 180 after being reflected off two mirrors as shown in FIG. 10.

The spectrometer must measure wavelength and bandwidth substantially in real time. Because the laser repetition rate may be 1000 $H_z$ or higher, it is necessary to use algorithms which are accurate but not computationally intensive in order to achieve the desired performance with economical and compact processing electronics. Calculational algorithm therefore preferably should use integer as opposed to floating point math, and mathematical operations should preferably be computation efficient (no use of square root, sine, log, etc.).

Figure 10F:
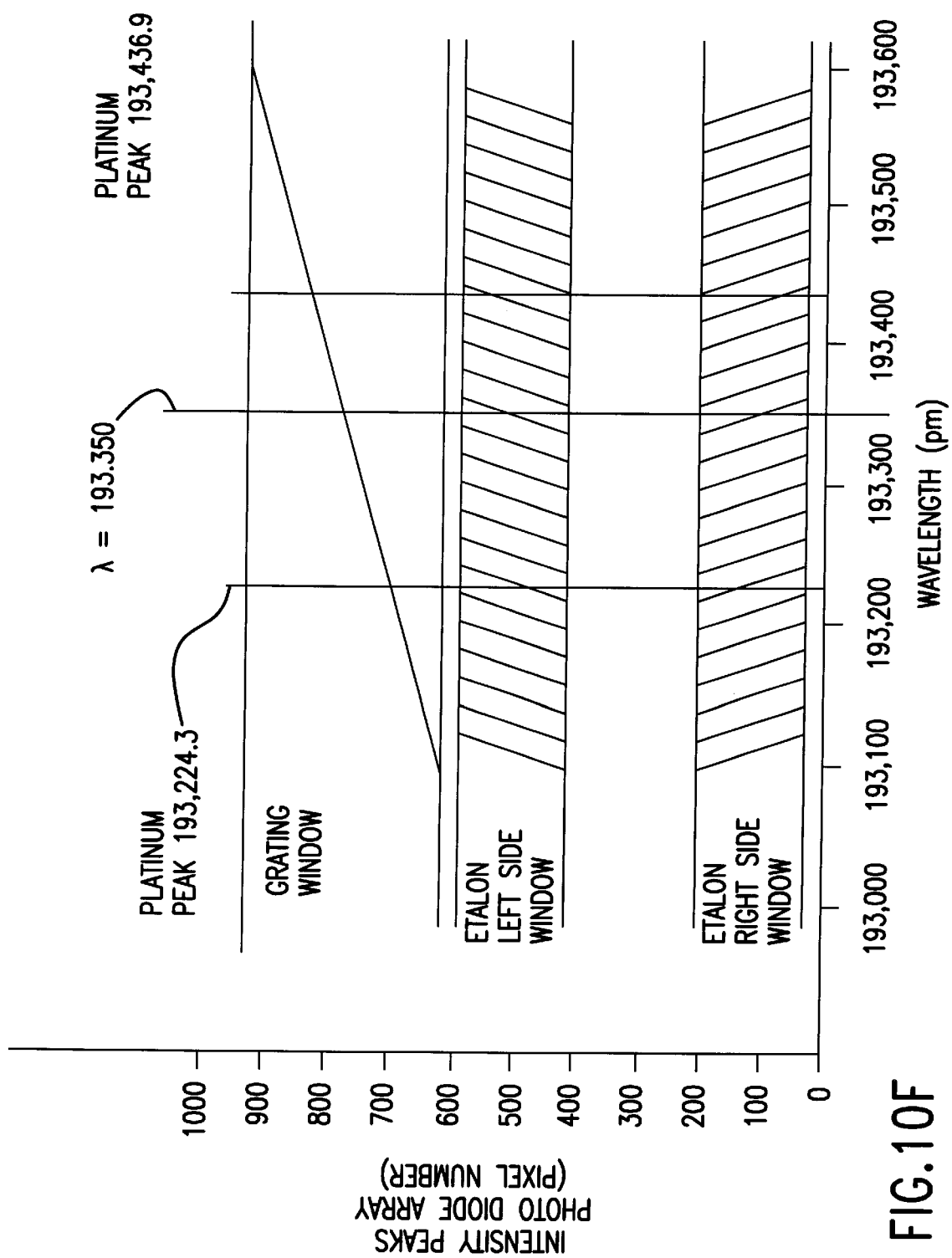
FIG. 10F describes the light patterns on the FIG. 5 photo diode array used for making coarse and fine wavelength measurements.
Figure 11A:
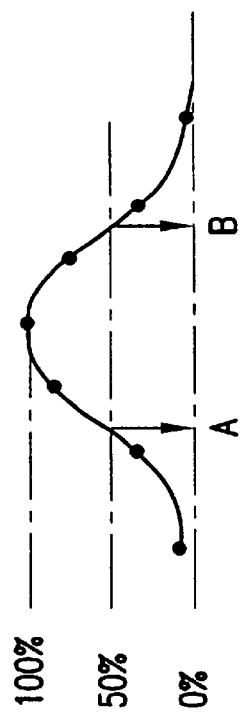
FIGS. 11A and 11B are graphs describing the functioning of the FIG. 10 wavemeter.
Figure 11B:
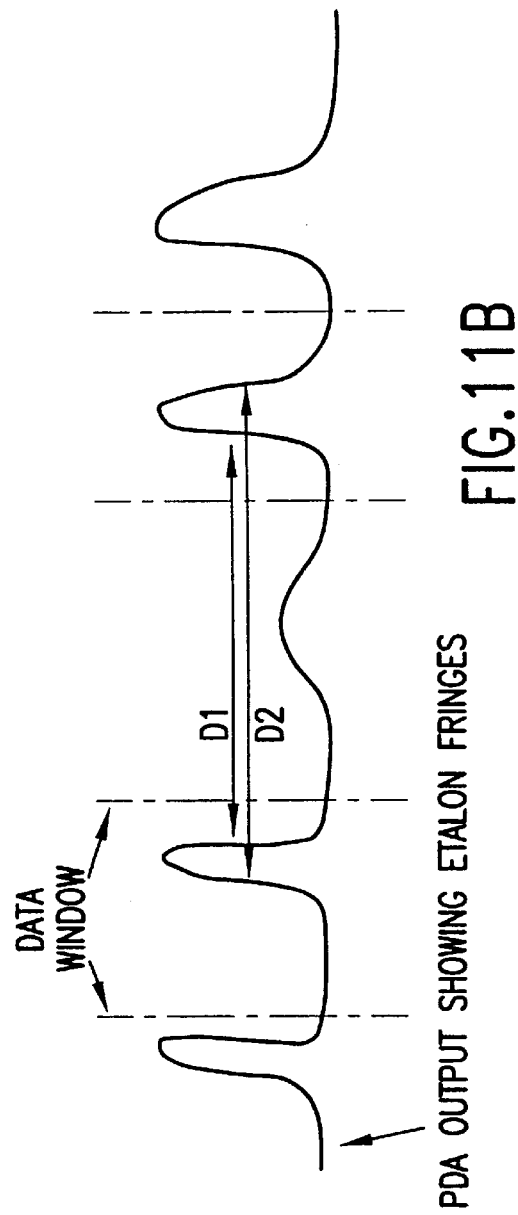
Figure 12A:
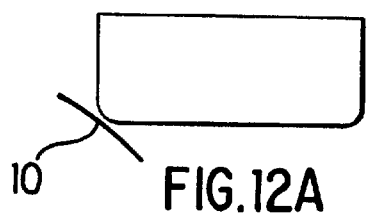
FIGS. 12A through 12E show various anode support bar designs.
Figure 12B:
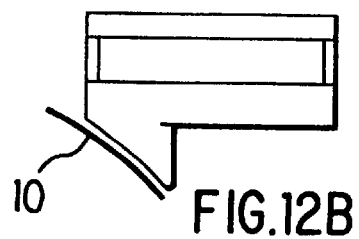
Figure 12C:
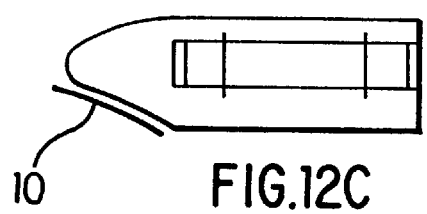
Figure 12D:
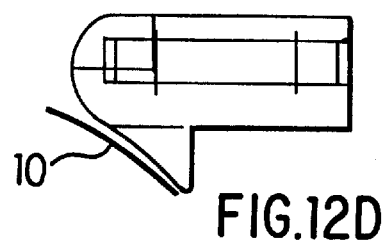
Figure 12E:
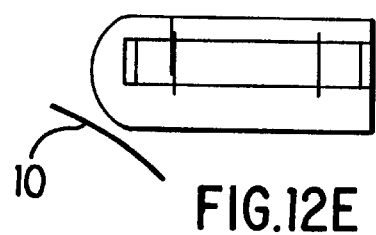
Figure 13:
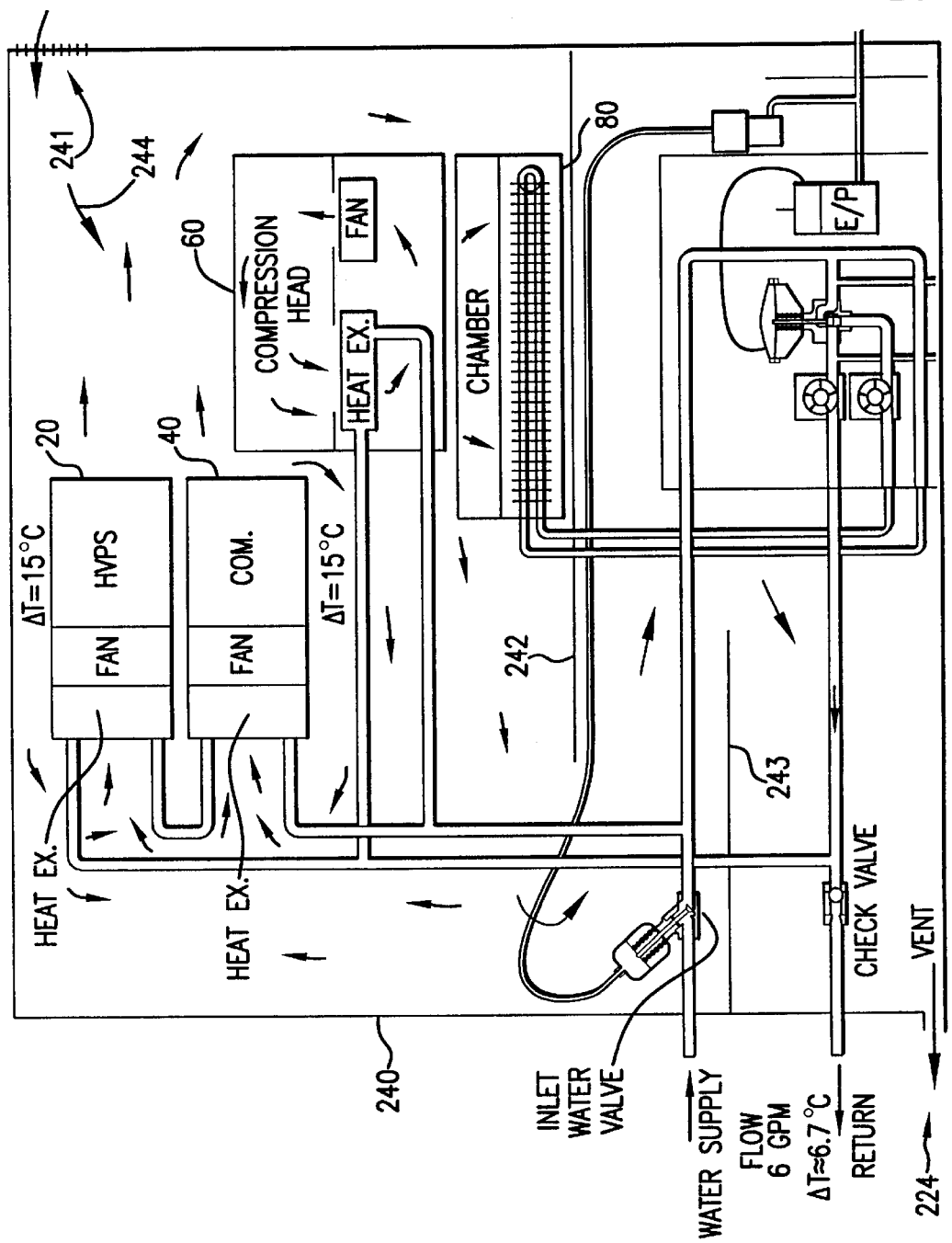
FIG. 13 describes a preferred enclosure cooling system.

The specific details of a preferred algorithm used in this preferred embodiment will now be described. FIG. 11B is a curve with 5 peaks as shown which represents a typical etalon fringe signal as measured by linear photo diode array 180. The central peak is drawn lower in height than the others. As different wavelengths of light enter the etalon, the central peak will rise and fall, sometimes going to zero. This aspect renders the central peak unsuitable for the wavelength measurements. The other peaks will move toward or away from the central peak in response to changes in wavelength, so the position of these peaks can be used to determine the wavelength, while their width measures the bandwidth of the laser. Two regions, each labeled data window, are shown in FIG. 11B. The data windows are located so that the fringe nearest the central peak is normally used for the analysis. However, when the wavelength changes to move the fringe too close to the central peak (which will cause distortion and resulting errors), the first peak is outside the window, but the second closest peak will be inside the window, and the software causes the processor in control module 197 to use the second peak. Conversely, when the wavelength shifts to move the current peak outside the data window away from the central peak the software will jump to an inner fringe within the data window. The data windows are also depicted on FIG. 10F.

The steps involved are as follows:
1. After a laser shot, the photo diode array output is electronically read out and digitized. Data points are separated by an interval physically determined by the spacing of the photo diode array elements, in this case 25 micrometer pitch.

2. The digital data is searched to find the peak intensity value in the data window. The previous peak location is used as a starting point. Small regions are searched left and right of the starting point. The search region is extended by small intervals left and right until a peak is found. If the peak is outside the data window, the search will automatically continue until the other peak is found.
3. Based on the intensity of the peak, a 50% level is computed as shown in FIG. 11A. The 0% level is measured periodically between the pulses. Based on the computed 50% level, points are examined right and left of the peak until the data points which border the 50% level are found. A linear interpolation is computed between pairs of points, which border the 50% level to find the left and right half-maximum positions, labeled A, and B in FIG. 11A. These positions are computed to a fraction of a pixel such as $1/16$, using an integer data format.
4. Steps 2 and 3 are duplicated for the two data windows, giving a total of four interpolated 50% positions. As indicated FIG. 11B, two diameters are computed. D1 is the inner fringe diameter while D2 is the outer fringe diameter.
5. An approximation to the wavelength is determined by the coarse wavelength circuit, as described in the preceding section "Coarse Wavelength Measurement."

Fine Wavelength Calculation

The inner and outer fringe diameters D1 and D2 (in units of pixels) are each converted to wavelength by the following equations:

$$\lambda = \lambda_0 + Cd(D^2 - D_0^2) + N \cdot FSR$$

where $\lambda$=wavelength corresponding to diameter D
$\lambda_0$=calibration wavelength
$D_0$=diameter corresponding to wavelength $\lambda_0$
Cd=calibration constant dependant on the optical design
FSR=free spectral range of the etalon
N=integer,=0, ±1, ±2, ±3 . . .
The values $\lambda_0$, $K_1$, FSR, and $D_0$ are determined and stored at the time of calibration. The value for N is chosen such that:

$$|\lambda - \lambda_c| \leq \frac{1}{2} FSR$$

where $\lambda_c$=coarse wavelength determination.

For example, in a preferred embodiment, we select a reference wavelength $\lambda_0$=193,436.9 pm (corresponding to an absorption line of a platinum hollow cathode lamp). At this wavelength, the fringe diameter $D_0$ might be found to be 300 pixels. Cd is a constant which can either be directly measured or calculated from the optical design. In our preferred embodiment, Cd=−9.25×10⁻⁵ pm/pixel². Thus, for example, with the laser operating at a different wavelength, the fringe diameter may be measured to be 405 pixels. The possible wavelengths computed by equation (1) are:

$$\lambda = 193{,}436.9 \text{ pm} - 9.25 \times 10^{-5} \text{ pm/pixel}^2[(405)^2 - (300)^2] + N \cdot FSR = 193{,}443.7 + N \cdot FSR$$

If the free spectral range FSR=20 pm, then the possible values for $\lambda$ include:
193,403.7 pm N=−2
193,423.7 N=−1
193,443.7 N=0
193,463.7 N=+1
193,483.7 N=+2

If the coarse wavelength is determined to be $\lambda_c$=193,401.9, for example, then the processor will select the value $\lambda$=193,403.7 pm (N=−2) as the solution in the closest agreement with $\lambda_c$.

The inner and outer fringe diameters $D_1$ and $D_2$ as shown in FIG. 9B are each converted into wavelengths $\lambda_1$ and $\lambda_2$, respectively. The final value which is reported for the laser wavelength is the average of these two calculations:

$$\lambda = \left(\frac{\lambda_1 + \lambda_2}{2}\right)$$

Bandwidth Calculation

The bandwidth of the laser is computed as $(\lambda_2 - \lambda_1)/2$. A fixed correction factor is applied to account for the intrinsic width of the etalon peak adding to the true laser bandwidth. Mathematically, a deconvolution algorithm is the formalism for removing the etalon intrinsic width from the measured width, but this would be far too computation-intensive, so a fixed correction $\Delta\lambda\epsilon$ is subtracted, which provides sufficient accuracy. Therefore, the bandwidth is:

$$\Delta\lambda = \left(\frac{D_2 - D_1}{2}\right) - \Delta\lambda\epsilon$$

$\Delta\lambda\epsilon$ depends on both the etalon specifications and the true laser bandwidth. It typically lies in the range of 0.1–1 pm for the application described here.

Calibration with Atomic Reference Source

In this preferred embodiment, wavemeter 120 is calibrated with the optical equipment shown in atomic wave reference unit 190 as shown in FIG. 10.

Figure 10J:
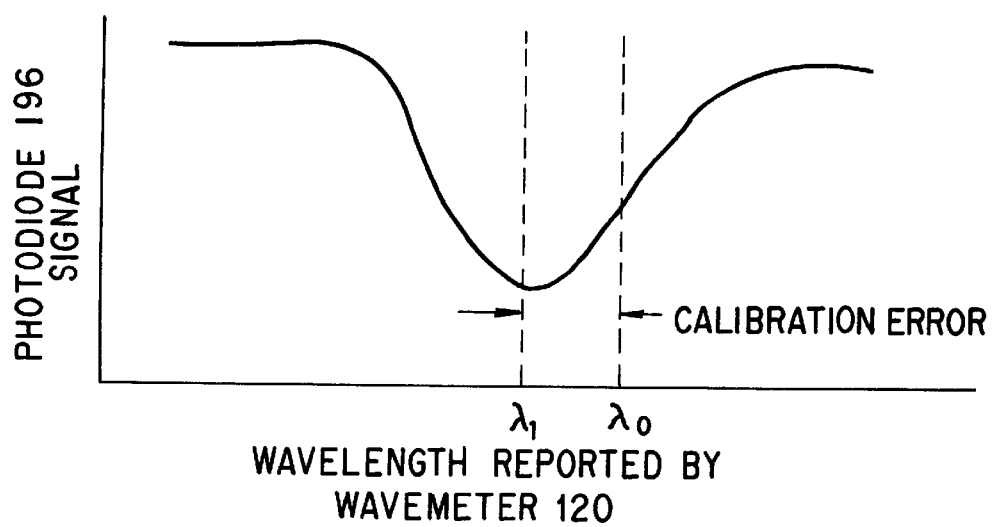
FIG. 10J is a graph showing a calibration procedure.
Figure 10H:
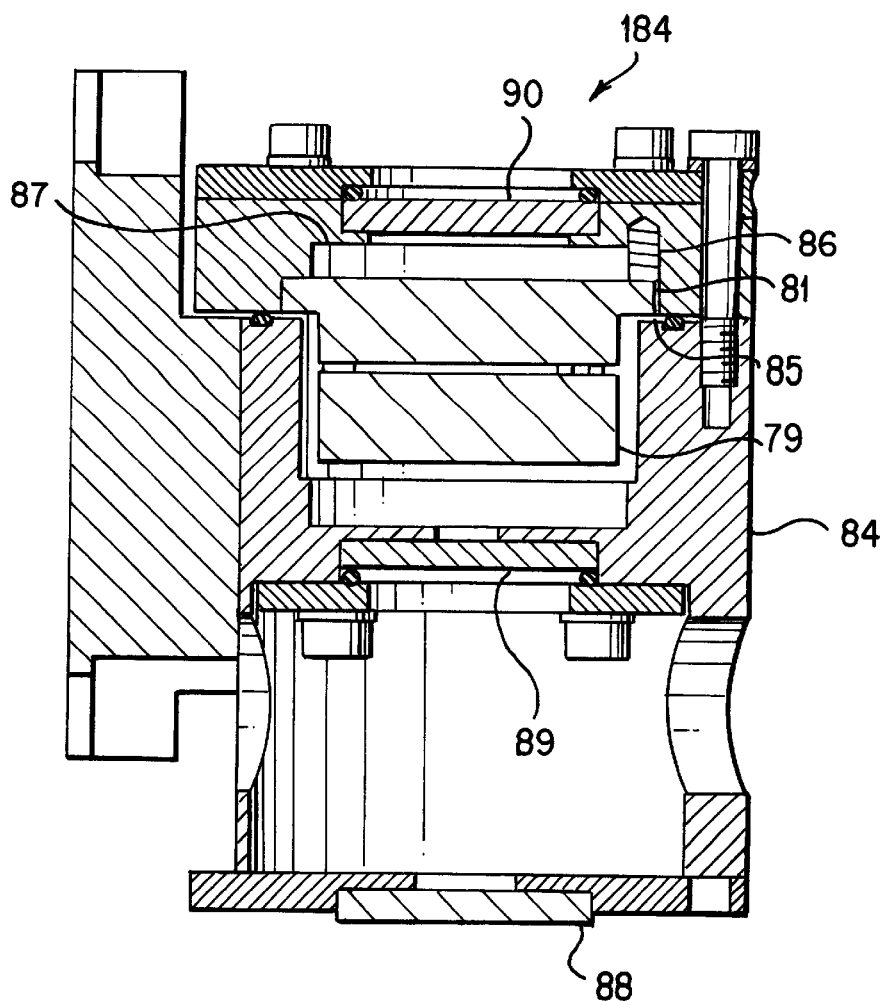
FIG. 10H is a drawing of an etalon assembly.

The approximately 5% portion of the beam passing through mirror 182 is reflected from mirror 186 through lens 188 and into atomic wavelength reference unit 190. The light passes through diffuser 191, reflects off mirror 192 and is focused by lens 193 to a focal point in the center of vapor cell 194, and is focused again by lens 195 onto photo diode 196. Calibration is accomplished by scanning the wavelength of the laser (with tuning mirror 36 as shown in FIG. 10D) while keeping the output energy of the laser constant, as monitored and controlled by energy detector 69. In this preferred embodiment, the scanning and calibration sequence is automated and programmed into the control electronics for the laser. The wavelength range of the scan is chosen so as to include an absorption wavelength of the platinum vapor cell 194. For example, in this preferred embodiment, the strong absorption at 193,436.9 pm is used, and the laser is programmed to scan from about 193,434 pm to 193,440 pm. When the laser wavelength coincides with the absorption wavelength, a substantial reduction in signal (10–50%) is seen by the photo diode 196. During the scan, two corresponding sets of data are taken, the signal from the photo diode 196, and the wavelength as measured by the wavemeter 120. A representative set of data is shown in FIG. 10J, where the signal from the photo diode 196 is plotted against the wavelength as reported by the wavemeter 120. The processor analyzes the photo diode data and determines the apparent wavelength $\lambda_1$ which corresponds to the center of the absorption dip. Since the true wavelength $\lambda_0$ of the atomic absorption reference is known with precision, the calibration error ($\lambda_1 - \lambda_0$) can be calculated. This error is then used to automatically correct the calibration constants used by both the coarse and fine wavelength algorithms.

Improved Etalon

Conventional etalon mounting schemes typically employ an elastomer to mount the optical elements to the surrounding structure, to constrain the position of the elements but minimize forces applied to the elements. A compound commonly used for this is room-temperature vulcanizing silicone (RTV). However, various organic vapors emitted from these elastomers can deposit onto the optical surfaces, degrading their performance. In order to prolong etalon performance lifetime, it is desirable to mount the etalon in a sealed enclosure that does not contain any elastomer compounds.

A preferred embodiment includes an improved etalon assembly shown at 184 in FIG. 10. In this etalon assembly is shown in detail in FIGS. 10G1 and 10G2, the fused silica etalon 79 itself is comprised of a top plate 80 having a flange 81 and a lower plate 82, both plates being comprised of premium grade fused silica. The etalon is designed to produce fringes having free spectral range of 20.00 pm at 193.35 nm when surrounded by gas with an index of refraction of 1.0003 and a finesse equal to or greater than 25. Three fused silica spacers 83 with ultra low thermal expansion separate the plates and are 934 micrometer±1 micrometer thick. These hold the etalon together by optical contact using a technique well known in the optics manufacturing art. The reflectance of the inside surfaces of the etalon are each about 88 percent and the outside surfaces are anti-reflection coated. The transmission of the etalon is about 50 percent.

The etalon 79 is held in place in aluminum housing 84 only by gravity and three low force springs 86 pressing the flange against three pads not shown but positioned on 120 degree centers under the bottom edge of flange 81 at the radial location indicated by leader 85. A clearance of only 0.004 inch along the top edge of flange 81 at 87 assures that the etalon will remain approximately in its proper position. This close tolerance fit also ensures that if any shock or impulse is transferred to the etalon system through the mounting, the relative velocities between the optical components and the housing contact points will be kept to a minimum. Other optical components of etalon assembly 184 include diffuser 88, window 89 and focusing lens 90 having a focal length of 458.4 mm.

The diffuser 88 may be a standard prior art diffuser commonly used up-stream of an etalon to produce a great variety of incident angles needed for the proper operation of the etalon. A problem with prior art diffusers is that about 90 percent of the light passing through the diffuser is not at a useful angle and consequently is not focused on the photo diode array. This wasted light, however, adds to the heating of the optical system and can contribute to degradation of optical surfaces. In an alternative embodiment a diffractive lens array is used as the diffuser 88. In this case a pattern is produced in the diffractive lens array which scatters the light thoroughly but only within an angle of about 5 degrees. The result is that about 90 percent of the light falling on the etalon is incident at useful angles and a much greater portion of the light incident on the etalon is ultimately detected by the photo diode array. The result is the light incident on the etalon can be greatly reduced which greatly increases optical component life. Applicants estimate that the incident light can be reduced to less than 10% of prior art values with equivalent light on the photo diode array.

Platinum Vapor Cell

Figure 10K:
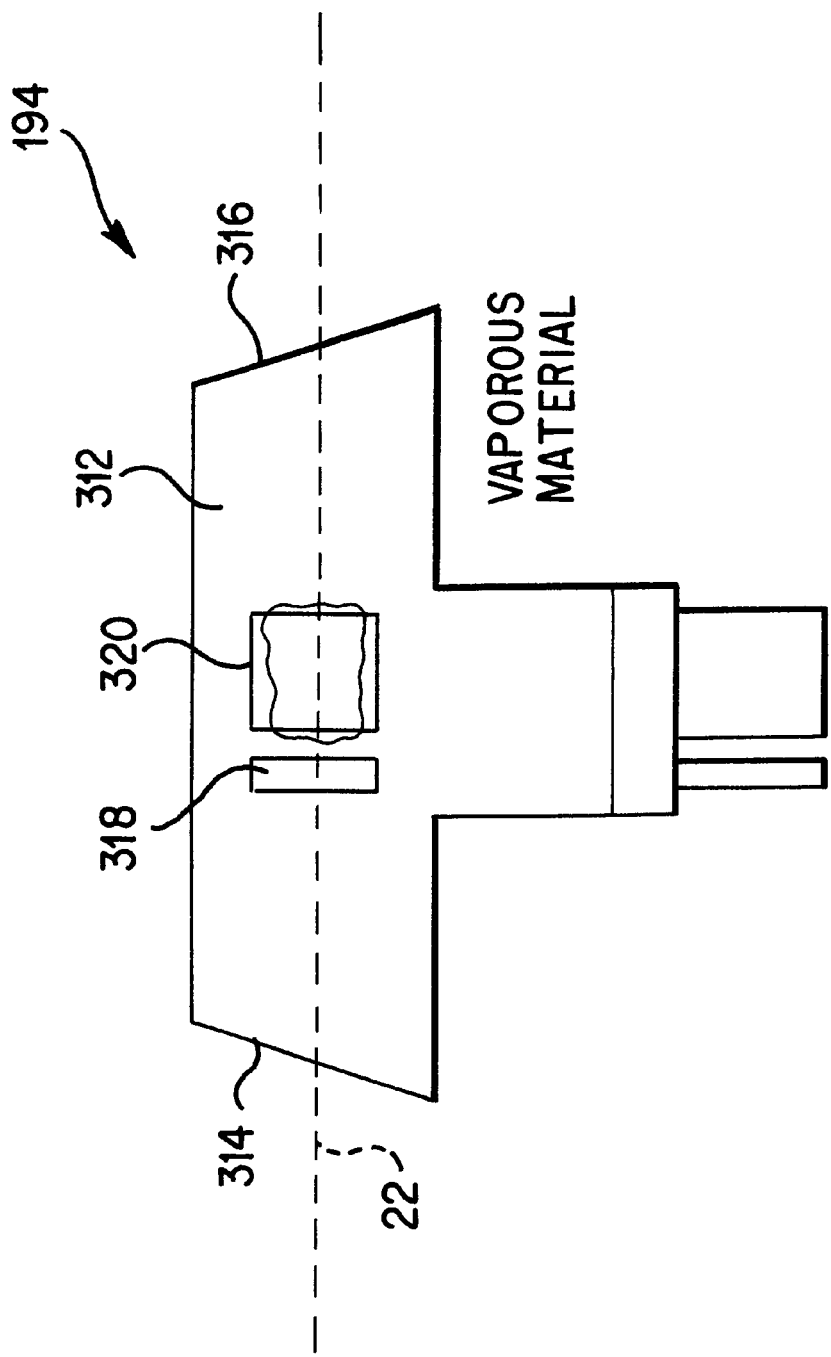
FIG. 10K is a drawing of a vapor cell.

Details of platinum vapor cell 194 are described by reference to FIG. 10K. This cell is a modified series L2783 hollow cathode lamp tube similar to the one described in U.S. Pat. No. 5,450,202. A glass envelope with UV-transmitting windows 314 and 316 contains neutral gas, neon. The major difference is that the hollow cathode of the cell in this preferred embodiment comprises a very thin platinum "hollow T" shaped sleeve which covers the surface of the cathode 320 facing anode 318 and the inside surface of hollow cathode 320. A DC source of about 150 volts energizes the cell creating a plasma containing platinum ions which are generally contained within the hollow cathode as a vaporous material as shown in FIG. 10K.

OTHER PREFERRED EMBODIMENTS

In another preferred embodiment of this invention, focusing element 193 may be used with a suitable aperture to allow a collimated portion of the beam to pass through the cathode 198, through optical element 195 and onto detector 196. In this embodiment, measures must be taken to avoid optical interference effects due to reflections from parallel surfaces of the windows in cell 194. Such measures might include providing a small wedge angle between the inner and outer window surfaces on both the entrance and exit windows of cell 194.

Since the platinum vapor provides two distinctive absorption lines within the tuning range of the ArF laser, both lines are available if needed to improve the accuracy of the calibration. Procedures could be established to use both lines on each calibration. But preferably the second line could be checked only occasionally if the occasional checks show the calibration at one line calibrates the laser accurately at the second line.

Other Techniques for Tuning the Laser

Tuning of laser 30 of FIG. 10D to a desired wavelength may be performed in various well known ways, which may be mechanically, optically, although tuning the laser optically, as shown in FIG. 10D, is preferred. Any of these known mechanisms for tuning a laser in response to a control signal may constitute the wavelength adjustment mechanism.

Although a specific structure is shown for detecting platinum absorption lines other suitable embodiments may be employed. These may be implemented using different optical setups, as would be understood by those skilled in the art after reviewing this disclosure.

Laser Component Cooling

Preferred embodiments of the present invention which is especially useful for operation at repetition rates in excess of 1000 Hz, includes a unique cooling technique shown in FIG. 17 for cooling an excimer laser.

Components of the laser are contained in enclosure 240 which is maintained on the inside at a slight vacuum produced by a blower mounted in a vent as shown at 224 in FIGS. 17 and 4A. The cabinet comprises filtered intake port 241 near the top of the cabinet and a few small leakage sources, such as around gasketed doors, so that the flow of room air through the laser enclosure is about 200 ft$^3$/min which is not nearly sufficient to remove the heat produced by heat producing components of the laser.

The very great majority (roughly 90 percent) of the waste heat produced by the laser (roughly 12 kw at 100% duty factor) is removed by a chilled water system as shown in FIG. 17.

In this embodiment the major heat sources in the laser are the high voltage supply 20, the commutator 40, the compression head 60 and the laser chamber 80. For the chamber a water cooled heat exchanger is located inside the chamber and heat is transferred from circulating laser gas to the heat exchanger to the cooling water. Another heat exchanger (not shown) is mounted on an outside surface of the chamber. For the rest of the major heat producing components cooling water is piped to the location of the component and one or more fans force air through a water-to-air heat exchanger onto the component as shown in FIG. 17. For the compression head the circulation is contained as shown, but for the HVPS and the commutator the circulation is onto the component then through other portions of the enclosure to also cool other components before being recirculated back to the heat exchangers.

Dividing pans 242 and 243 guide the general ventilation air from filter 241 through a path shown by open headed arrows 244 to vent 224.

This cooling system contains no ducts and except for a water line feeding the heat exchangers inside of and attached to the laser chamber there is no water line connection to any laser component. Since all components (other than the laser chamber) are cooled by air blown about inside the enclosure, there are no cooling connections to make a break when installing and replacing components. Also, the lack of need for ducting greatly increases useable components and working space inside the enclosure.

Laser Performance with Low Pulse Energy and High Repetition Rate

Applicants have tested a prototype laser configured as a preferred embodiment of the present invention. The results of this testing are compared in FIGS. 17A through 19.

Figure 17A:
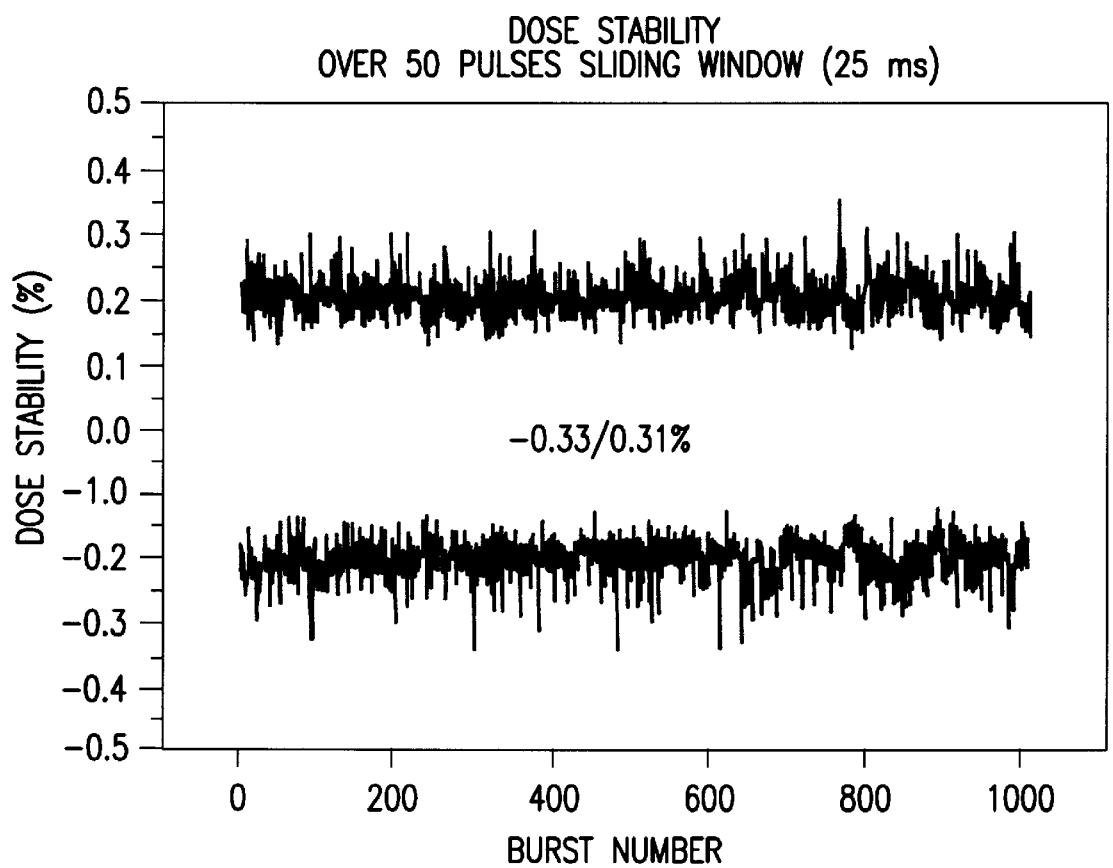
FIGS. 17A, 17B, 17C, 18 and 19 show test data using a preferred embodiment of the present invention.
Figure 17B:
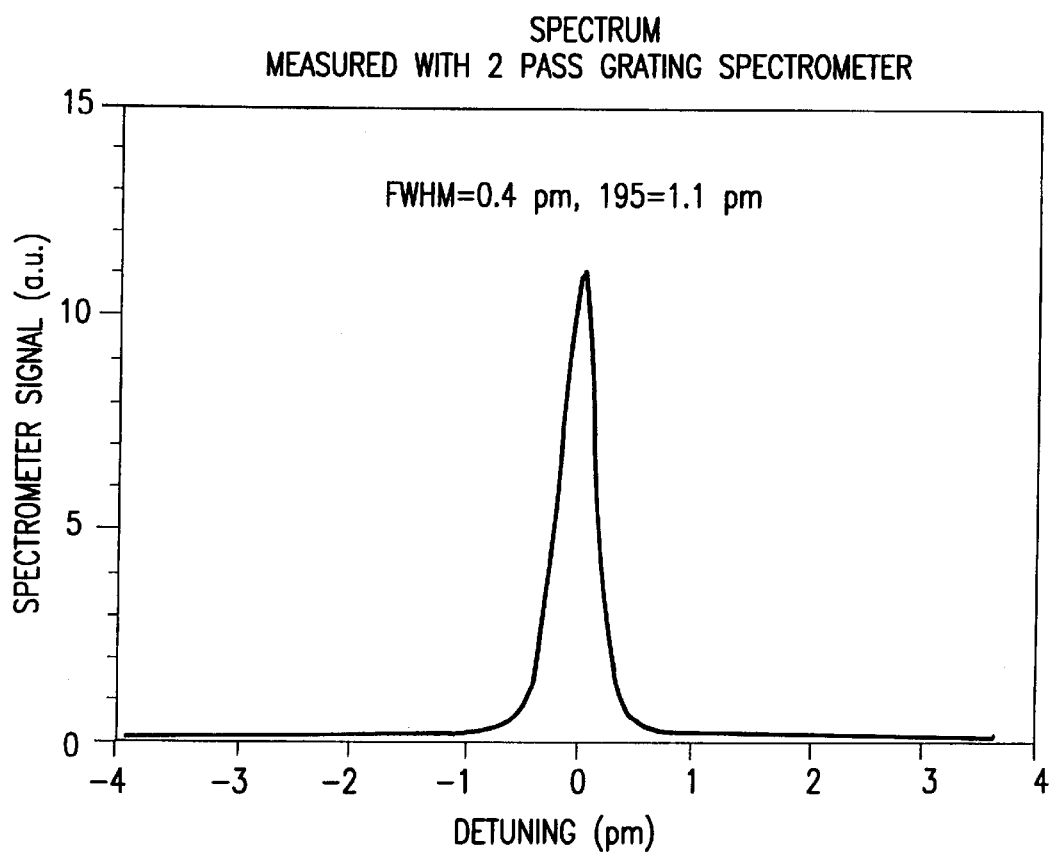
Figure 17C:
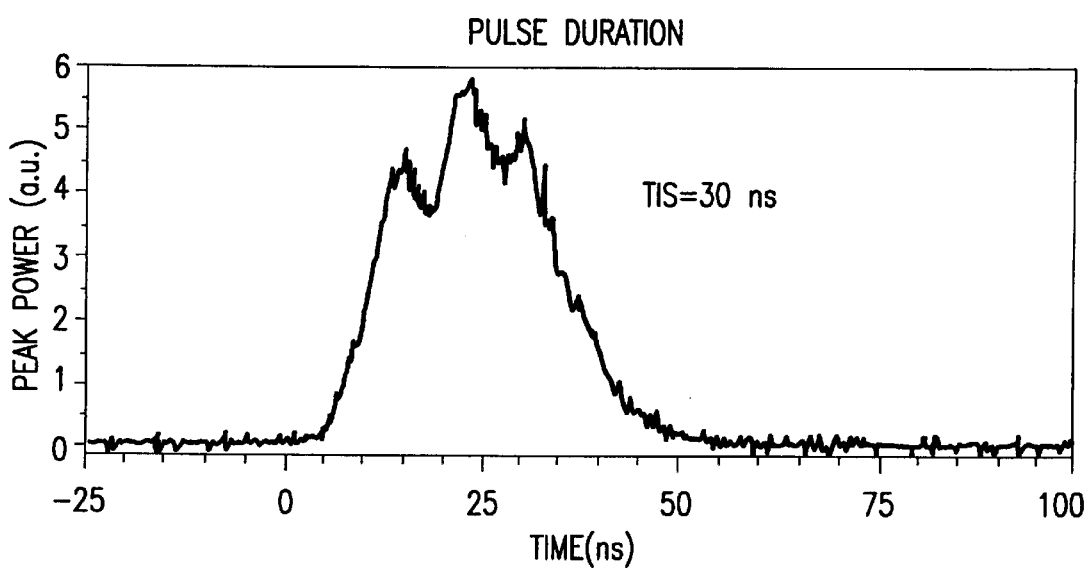

FIGS. 17A, B and C show typical performance data on a lithography laser operated at 2,000 Hz and 5 mJ. This system was considered by Applicants to be a baseline for measuring the performance of their invention. The data shows a dose stability of 9.31%, an FWHM bandwidth of 0.4 pm, an integral 95 bandwidth of 1.1 pm and a TIS pulse duration of 30 ns.

Figure 18:
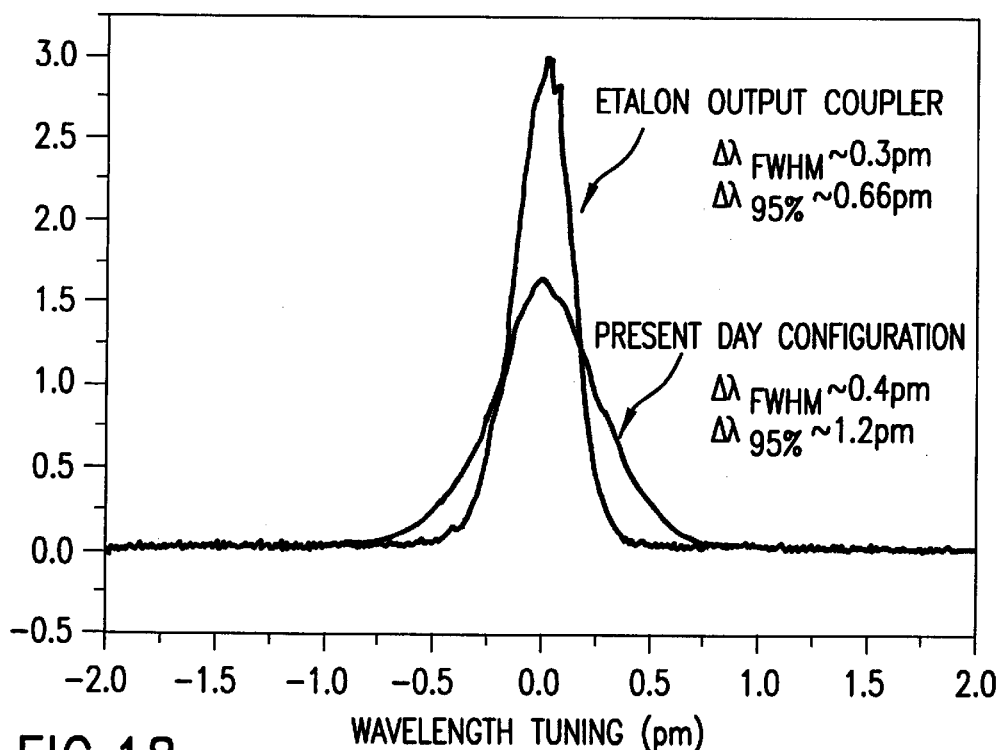

Applicants use of an italon output coupler matched to the line narrowing unit permitted reduction of the bandwidth to 0.3 pm (FWHM) and 0.66 (I95) as shown in FIG. 18.

Figure 19:
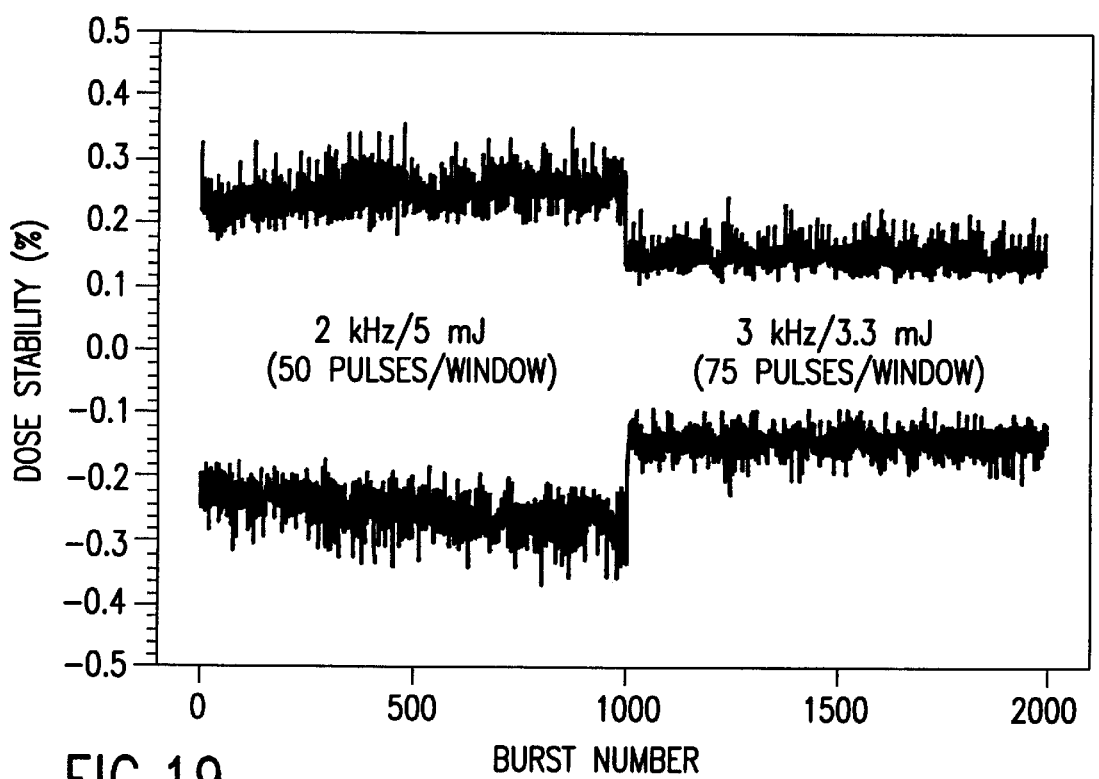

FIG. 19 shows a comparison of dose stability for the lower pulse energy higher pulse rate configuration and the baseline line configuration.

Although this very narrow-band ArF excimer laser has been described with reference to a particular embodiment, it is to be appreciated that various adaptations and modifications may be made. For example, many alternative embodiments are discussed in the patent applications listed in the first sentence of this specification, all of which have been incorporated herein by reference. An etalon output coupler could be used to provide additional line narrowing. The invention is to be limited only by the appended claims.

What is claimed is:

1. A very narrow band reliable modular production quality high repetition rate ArF excimer laser for producing a narrow band pulsed laser beam at repetition rates of at least about 3000 Hz, said laser comprising:
   A. a quickly replaceable laser chamber module comprising a laser chamber comprising:
      1) two elongated electrodes;
      2) a laser gas comprised of
         a) argon,
         b) fluorine, and
         c) a neon gas;
      3) a gas circulator for circulating said gas between said electrodes at speeds of at least two cm/millisecond
   B. a modular pulse power system comprised of at least one quickly replaceable module, said system being comprised of a power supply and pulse compression and amplification circuits and pulse power controls for producing high voltage electrical pulses of at least 14,000 volts across said electrodes at rates of at least about 3000 Hz;
   C. a quickly replaceable line narrowing module for controlling wavelengths of said laser beams to less than that 0.4 pm, FWHM; and
   D. a laser pulse energy control system for controlling the voltage provided by said pulse power system, said control system comprising a laser pulse energy monitor and a computer processor programmed with an algorithm for calculating, based on historical pulse energy data, electrical pulses needed to produce laser pulses having pulse energies within a desired range of energies of less than 04. mJ.

2. A laser as in claim 1 wherein said chamber, said pulse power system, said line narrowing system, said energy control system and substantially all electrical, optical and mechanical components of said laser are contained in quickly replaceable modules.

3. A laser as in claim 1 wherein said chamber and said gas circulator define a gas flow path and an upstream direction and said laser also comprises a single preionizer tube located upstream of said electrodes.

4. A laser as in claim 1 wherein each of said electrodes define an electrode length and said single preionizer tube is comprised of a grounded electrically conducting rod positioned along the axis of an $Al_2O_3$ hollow cylindrical tube having a length longer than said electrode length.

5. A laser as in claim 1 wherein said line narrowing system comprises at least three beam expanding prisms, at least one of which prisms is comprised of calcium fluoride, a tuning mirror and a grating.

6. A laser as in claim 1 wherein all of said at least three prisms are comprised of calcium fluoride.

7. A laser as in claim 1 wherein said two elongated electrodes define a cathode and an anode and said anode comprises cooling fins.

8. A laser as in claim 1 wherein said laser chamber defines a chamber structure and wherein said two elongated electrodes define a cathode and an anode and said cathode is insulated from said chamber structure by a single piece insulator comprised of $Al_2O_3$ which is attached to a portion of said chamber structure.

9. A laser as in claim 8 wherein said cathode is mounted directly on said single piece insulator.

10. A laser as in claim 1 wherein all seals exposed to said laser gas are metal seals.

11. A laser as in claim 1 and further comprising acoustic baffles.

12. A laser as in claim 1 wherein said power supply comprises a rectifier for converting AC power to DC power, an inverter for converting the DC power to high frequency AC power, a step-up transformer for increasing the voltage of said high frequency AC power to a higher voltage, a rectifier for converting the higher voltage to charge a charging capacitor to a voltage at or approximately at a command voltage established by said laser pulse energy control system.

13. A laser as in claim 12 wherein said power supply is configured to slightly over charge said charging capacitor and further comprises a bleed circuit to bleed down said charging capacitor to said command voltage.

14. A laser as in claim 1 wherein said pulse compression and amplification circuits further comprise an inductor, a pulse transformer and a third capacitor wherein said inductor, pulse transformer and said third capacitor are arranged to permit the high voltage charge on said second capacitor to flow to ground through the primary side of said pulse transformer in order to produce a very high voltage pulse at the output of said pulse transformer to be stored temporarily on said third capacitor.

15. A laser as in claim 14 wherein said primary side of said pulse transformer comprises a plurality of hollow spools, each spool defining an axis, connected in series and a secondary side of said pulse transformer is comprised of at least one rod co-aligned with the axis of a plurality of said spools.

16. A laser as in claim 1 wherein said laser pulse power system comprises at least one saturable inductor with a coil emersed in oil contained in a pot which also serves as the high voltage lead of the inductor.

17. A laser as in claim 1 wherein said gas circulator comprises a blower comprising a shaft supported by active at least two magnetic bearings, each bearing comprising a stator and a rotor; said shaft bearing driver by a motor comprising a stator and a rotor, said blower also comprising a sealing means for sealing said rotors within an environment containing said laser gas with said stator outside said laser gas environment.

18. A laser as in claim 1 wherein said gas circulator comprises a blower comprising a shaft supported by at least two ceramic bearings.

* * * * *